United States Patent
Kang et al.

(10) Patent No.: US 9,613,821 B2
(45) Date of Patent: Apr. 4, 2017

(54) METHOD OF FORMING PATTERNS AND METHOD OF MANUFACTURING INTEGRATED CIRCUIT DEVICE

(71) Applicant: Samsung Electronics Co., Ltd., Suwon-si (KR)

(72) Inventors: Yool Kang, Yongin-si (KR); Dong-won Kim, Seongnam-si (KR); Ju-young Kim, Hwaseong-si (KR); Tae-hoon Kim, Anyang-si (KR); Hye-ji Kim, Seoul (KR); Su-min Park, Yongin-si (KR); Hyung-rae Lee, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 40 days.

(21) Appl. No.: 14/695,047

(22) Filed: Apr. 24, 2015

(65) Prior Publication Data
US 2015/0364334 A1    Dec. 17, 2015

(30) Foreign Application Priority Data
Jun. 13, 2014   (KR) ......................... 10-2014-0072349

(51) Int. Cl.
*H01L 21/308*  (2006.01)
*H01L 21/311*  (2006.01)
(Continued)

(52) U.S. Cl.
CPC ...... *H01L 21/3086* (2013.01); *H01L 21/0273* (2013.01); *H01L 21/0332* (2013.01);
(Continued)

(58) Field of Classification Search
CPC ............. H01L 21/0338; H01L 21/0273; H01L 21/3086; H01L 21/31144; H01L 21/3088;
(Continued)

(56) References Cited

U.S. PATENT DOCUMENTS 7,592,132 B2   9/2009   Takahashi et al.
8,097,398 B2   1/2012   Kondoh et al.
(Continued)

FOREIGN PATENT DOCUMENTS

JP   2008-192692   8/2008
KR   10-2007-0076608   7/2007
(Continued)

*Primary Examiner* — Caleen Sullivan
(74) *Attorney, Agent, or Firm* — Muir Patent Law, PLLC

(57) ABSTRACT

Provided are a method of forming patterns and a method of manufacturing an integrated circuit device. In the method of forming patterns, a photoresist pattern having a first opening exposing a first region of a target layer is formed. A capping layer is formed at sidewalls of the photoresist pattern defining the first opening. An insoluble region is formed around the first opening by diffusing acid from the capping layer to the inside of the photoresist pattern. A second opening exposing a second region of the target layer is formed by removing a soluble region spaced apart from the first opening, with the insoluble region being interposed therebetween. The target layer is etched using the insoluble region as an etch mask.

65 Claims, 45 Drawing Sheets

(51) Int. Cl.
*H01L 21/02* (2006.01)
*H01L 21/027* (2006.01)
*H01L 21/033* (2006.01)
*H01L 21/3213* (2006.01)
*H01L 27/108* (2006.01)
*H01L 21/768* (2006.01)

(52) U.S. Cl.
CPC ...... *H01L 21/0337* (2013.01); *H01L 21/3081* (2013.01); *H01L 21/31144* (2013.01); *H01L 21/32139* (2013.01); *H01L 21/76816* (2013.01); *H01L 27/10814* (2013.01); *H01L 27/10855* (2013.01); *H01L 27/10885* (2013.01); *H01L 27/10888* (2013.01)

(58) Field of Classification Search
CPC ........ H01L 21/32139; G03F 7/20; G03F 7/11; G03F 7/40; G03F 7/039; G03F 7/32; G03F 7/30; G03F 7/38; G03F 7/0035; G03F 7/038; G03F 7/095; G03F 7/322; C08F 216/10; C08F 220/18; C08L 65/00; C09D 145/00; C09D 165/00
USPC .................................. 438/703; 430/325, 315
See application file for complete search history.

(56) References Cited

U.S. PATENT DOCUMENTS

| 8,431,331 | B2 | 4/2013 | Kang et al. |
| 2010/0255429 | A1 | 10/2010 | Ishikawa et al. |
| 2011/0033799 | A1 | 2/2011 | Watanabe et al. |
| 2012/0064724 | A1 | 3/2012 | Lee et al. |
| 2012/0128942 | A1 | 5/2012 | Dunn et al. |
| 2012/0308930 | A1 | 12/2012 | Hatakeyama et al. |
| 2013/0171574 | A1* | 7/2013 | Xu .............................. G03F 7/40 430/325 |

FOREIGN PATENT DOCUMENTS

| KR | 10-2009-0055883 | 6/2009 |
| KR | 10-2009-0115564 | 11/2009 |

* cited by examiner

METHOD OF FORMING PATTERNS AND METHOD OF MANUFACTURING INTEGRATED CIRCUIT DEVICE

RELATED APPLICATIONS

This U.S. non-provisional application claims priority under 35 U.S.C. §119 to Korean Patent Application No. 10-2014-0072349 filed Jun. 13, 2014, the entire contents of which are hereby incorporated by reference.

BACKGROUND

The inventive concept relates to a method of forming patterns and a method of manufacturing an integrated circuit device.

In fabricating ultra-large-scale integrated semiconductor devices, there have been proposed various exposure technologies and patterning technologies for forming fine patterns. As semiconductor devices become more highly integrated and their design rule is reduced further, technologies for reducing an exposure wavelength or otherwise increasing a resolution become limited in forming a plurality of fine patterns with a fine pitch in a limited area.

SUMMARY

The inventive concept provides a method of forming patterns, which is capable of forming a plurality of fine patterns.

Methods of manufacturing an integrated circuit device and disclosed which may form a highly integrated device by forming a plurality of fine patterns.

Some embodiments provide a method of forming patterns, including: forming a photoresist pattern on a to-be-etched film, the photoresist pattern including a first opening exposing a first region of the to-be-etched film; forming a capping layer at sidewalls of the photoresist pattern defining the first opening, wherein the capping layer includes an acid source; forming an insoluble region around the first opening in the photoresist pattern by diffusing acid obtained from the acid source from the capping layer to the inside of the photoresist pattern; forming a second opening exposing a second region spaced apart from the first region in the to-be-etched film by removing a soluble region spaced apart from the first opening, with the insoluble region being interposed therebetween, in the photoresist pattern; and etching the to-be-etched film by using the insoluble region as an etch mask.

Methods of forming patterns, may comprise forming a photoresist film on a to-be-etched film by using a composition including a polymer that has a polarity that is changeable by an action of acid; exposing the photoresist film to form a main exposed region, a non-exposed region spaced apart from the main exposed region, and an exposed edge region disposed between the main exposed region and the non-exposed region in the photoresist film; removing the main exposed region by using a first developer to form a photoresist pattern having inner sidewalls defining a first opening exposing the exposed edge region; forming an insoluble region insoluble to a second developer around the first opening in the photoresist pattern by diffusing acid from the exposed edge region to the non-exposed region; forming a second opening spaced apart from the first opening by removing at least a portion of the non-exposed region, except for the insoluble region, from the photoresist pattern by using the second developer; and etching the to-be-etched film by using the insoluble region as an etch mask.

Methods of manufacturing an integrated circuit device may comprise forming a to-be-etched film on a substrate with an active region; forming a photoresist pattern on the to-be-etched film, the photoresist pattern including a first opening; forming a capping layer at sidewalls of the photoresist pattern defining the first opening, wherein the capping layer includes an acid source; forming an insoluble region around the first opening in the photoresist pattern by diffusing acid obtained from the acid source from the capping layer to the inside of the photoresist pattern; forming a second opening passing through the photoresist pattern by removing a soluble region spaced apart from the first opening, with the insoluble region being interposed therebetween, in the photoresist pattern; and forming a fine pattern by etching the to-be-etched film by using the insoluble region as an etch mask.

Methods of manufacturing an integrated circuit device may comprise forming a to-be-etched film on a substrate with an active region; forming a photoresist film on the to-be-etched film by using a composition including a polymer that has a polarity that is changeable by an action of acid; exposing the photoresist film to form a main exposed region, a non-exposed region spaced apart from the main exposed region, and an exposed edge region disposed between the main exposed region and the non-exposed region in the photoresist film; removing the main exposed region by using a first developer to form a photoresist pattern having inner sidewalls defining a first opening exposing the exposed edge region; forming an insoluble region insoluble to a second developer around the first opening in the photoresist pattern by diffusing acid from the exposed edge region to the non-exposed region; forming a second opening spaced apart from the first opening by removing at least a portion of the non-exposed region, except for the insoluble region, from the photoresist pattern by using the second developer; and forming a fine pattern by etching the to-be-etched film by using the insoluble region as an etch mask.

Manufacturing methods are provided that may comprise providing a substrate with a target layer; depositing a photoresist layer on the target layer; exposing a first portion of the photoresist layer to electromagnetic radiation while shielding a second portion of the photoresist layer from the electromagnetic radiation; removing the first portion of the photoresist layer with a first type of tone developer to form a photoresist pattern comprising the second portion of the photoresist layer and edges of the photoresist pattern; selectively forming a capping pattern at the photoresist pattern edges; removing the second portion of the photoresist layer with a second type of tone developer, different from the first type to create a patterned mask corresponding to the capping pattern at the photoresist pattern edges; and etching the target layer using the patterned mask.

The photoresist pattern at the photoresist pattern edges may be located between the first portion and the second portion, and during the exposing of the first portion of the photoresist, the photoresist corresponding to the photoresist pattern edges is exposed to electromagnetic radiation to a lesser degree than the exposure of the first portion of the photoresist layer.

The photoresist, prior to exposure, may include a photoacid generators (PAG) and protected polymers, wherein exposure of the first portion of the photoresist and the photoresist pattern at the photoresist pattern edges deprotects at least some of the protected polymers of the first portion of the photoresist and of the photoresist corresponding to the photoresist pattern edges.

After the exposing step, the first portion of the photoresist has a higher density of deprotected polymers than the photoresist corresponding to the photoresist pattern edges.

The deprotected polymers of the photoresist pattern at the photoresist pattern edges may bond with at least a portion of the capping pattern.

At least a portion of the capping pattern may be substantially insoluble to the second type of tone developer.

The capping pattern may comprise a thermo-acid generator (TAG), and the method further may comprise heating the capping pattern deposited at the photoresist pattern edges to generate a first acid from the TAG; and diffusing the first acid into the photoresist pattern at the photoresist pattern edges and into a part of the second portion of the photoresist to deprotect at least some of the protected polymers of the photoresist pattern at the photoresist pattern edges and at the part of the second portion of the photoresist.

Deprotecting protected polymers comprises removing an acid-labile group from the protected polymers.

Deprotecting protected polymers may result in a carboxyl group at one or more side chains of the polymers.

The patterned mask may comprise a part of the second portion of the photoresist layer bordering the photoresist pattern edges. The patterned mask may comprise at least a portion of the capping pattern.

The method may comprise removing the capping pattern prior to etching the target layer using the patterned mask so that the patterned mask does not include the capping pattern.

Selectively forming a capping pattern at the photoresist pattern edges may comprise bonding parts of the capping pattern to parts of the photoresist pattern at the photoresist pattern edges.

At least some compounds of the photoresist pattern at the photoresist pattern edges may be hydrophilic after the exposing step and the bonding may be a hydrogen bonding.

The bonding of the capping pattern to compounds of the photoresist pattern at the photoresist pattern edges may comprise bonding the capping pattern to carboxyl groups of side chains of deprotected polymers of the photoresist pattern at the photoresist pattern edges.

The capping pattern may comprise a polymer including an amine group on one or more side chains, and bonding the capping pattern to compounds of the photoresist pattern at the photoresist pattern edges may comprise bonding the amine group of the polymer of the capping pattern to carboxyl groups of side chains of deprotected polymers of the photoresist pattern at the photoresist pattern edges.

Selectively forming a capping pattern at the photoresist pattern edges may comprise depositing a capping pattern layer on at least a part of the remaining portion of the photoresist to bond the capping pattern to the photoresist pattern edges.

The method may comprise cleaning the photoresist with a cleaning solution after depositing a capping pattern layer to remove a capping pattern layer on the second portion of the photoresist.

The cleaning solution may comprise a hydrophilic compound.

A thickness of a capping pattern layer on the second portion of the photoresist may be smaller than a thickness of the capping pattern layer on the photoresist pattern edges.

Methods of manufacturing a semiconductor device may comprise providing a substrate with a target layer; forming a photoresist layer on the target layer; patterning the photoresist layer to remove portions of the photoresist layer and to create a photoresist pattern on the target layer, the photoresist pattern including openings between edges of the photoresist pattern; selectively forming a composition at the edges of the photoresist pattern; creating a mask pattern on the target layer using the composition on the edges of the photoresist pattern; and etching the target layer using the mask pattern.

Selectively forming the on the edges of the photoresist pattern may comprise forming bonds between a material of the edges of the photoresist pattern and a material of the composition.

The bonds may comprise hydrogen bonds. The bonds may comprise at least one of an ionic bond or a bond by dipole interaction.

The bonds may comprise bonds between carboxyl groups of and side chains of polymers of the photoresist and side chains of a polymer of the composition.

The composition may be substantially insoluble to a first type of tone developer, and the method further comprises, after selectively forming a composition on the edges of the photoresist pattern, developing portions the photoresist pattern with the first type of tone developer to remove parts of the photoresist pattern outside the composition and to obtain a mask corresponding in shape to the composition.

The method may comprise diffusing an acid from the composition into the photoresist pattern at the edges of the photoresist pattern so that a reaction of the acid with the photoresist pattern at the edges of the photoresist pattern makes the photoresist pattern at the edges of the photoresist pattern insoluble to the first type of tone developer.

The reaction of the acid with the photoresist pattern at the edges of the photoresist pattern results in hydrophilic polymers at the edges of the photoresist pattern.

The composition may comprise a thermo-acid generator (TAG), and the method may comprise heating a chamber in which the substrate is positioned at a first temperature to obtain the acid from the TAG. The method may comprise heating the chamber at a second temperature, higher than the first temperature, to diffuse the acid into the photoresist pattern at the edges of the photoresist pattern.

The mask pattern may comprise the composition and the remaining photoresist pattern at the edges of the photoresist pattern.

Methods of manufacturing a semiconductor device, may comprise providing a substrate with a target layer; forming a photoresist layer on the target layer, the photoresist layer having a first polarity; patterning the photoresist layer to remove portions of the photoresist layer to form a photoresist pattern on the target layer, photoresist pattern including openings between edges of the photoresist pattern; altering the polarity of at least some of the photoresist pattern at the edges of the photoresist pattern to a second polarity, different from the first polarity; developing the photoresist pattern to remove the photoresist pattern with the first polarity and so that the photoresist pattern at the edges of the photoresist pattern having the second polarity remain; etching the target layer using a mask corresponding to the photoresist pattern at the edges of the photoresist pattern having the second polarity.

The first polarity may be hydrophobic and the second polarity may be hydrophilic.

Altering the polarity of the photoresist layer may comprise selectively diffusing an acid into the photoresist pattern at the edges of the photoresist pattern.

Altering the polarity of the photoresist layer may comprise selectively deprotecting protected polymers of the photoresist pattern so that polymers are deprotected at the edges of the photoresist pattern while polymers are substantially not deprotected at other portions of the photoresist pattern.

The method may comprise depositing a composition having a greater tendency to bond with the edges of the photoresist pattern than to a top surface of the photoresist pattern.

The method may comprise exposing a first portion of the photoresist layer to electromagnetic radiation at a first intensity, exposing the photoresist layer at portions corresponding to the edges of the photoresist pattern at a second intensity lower than the first intensity, and shielding a second portion of the photoresist layer from the electromagnetic radiation; and removing the first portion of the photoresist with a first type of tone developer.

Exposing the photoresist layer at the portions corresponding to the edges of the photoresist pattern may alter a composition of the photoresist layer at the portions corresponding to the edges of the photoresist pattern to increase the tendency of the composition to bond to the edges of the photoresist pattern.

The method may comprise diffusing an acid from the composition into the photoresist layer at the edges of the photoresist pattern.

The composition may comprise a thermo-acid generator (TAG), and the method may comprise heating a chamber in which the substrate is positioned at a first temperature to obtain the acid from the TAG.

Exposing the photoresist layer at the portions corresponding to the edges of the photoresist pattern may deprotect a portion of polymers of the photoresist layer at the portions corresponding to the edges of the photoresist pattern.

BRIEF DESCRIPTION OF THE DRAWINGS

Exemplary embodiments of the inventive concept will be more clearly understood from the following detailed description taken in conjunction with the accompanying drawings in which:

FIGS. 8A to 14A and 8B to 14B are diagrams illustrating a method of forming line-and-space patterns, according to another embodiment of the inventive concept, in which FIGS. 8A, 9A, 10A, 11A, 12A, 13A, and 14A are plan views illustrating the method of forming line-and-space patterns, and FIGS. 8B, 9B, 10B, 11B, 12B, 13B, and 14B are cross-sectional views taken along lines B-B' of FIGS. 8A, 9A, 10A, 11A, 12A, 13A, and 14A, respectively;

FIGS. 15A to 21A and 15B to 21B are diagrams illustrating a method of forming a plurality of hole patterns, according to another embodiment of the inventive concept, in which FIGS. 15A, 16A, 17A, 18A, 19A, 20A, and 21A are plan views illustrating the method of forming a plurality of hole patterns, and FIGS. 15B, 16B, 17B, 18B, 19B, 20B, and 21B are cross-sectional views taken along lines B-B' of 15A, 16A, 17A, 18A, 19A, 20A, and 21A, respectively;

DETAILED DESCRIPTION OF THE EMBODIMENTS

Figure 1:
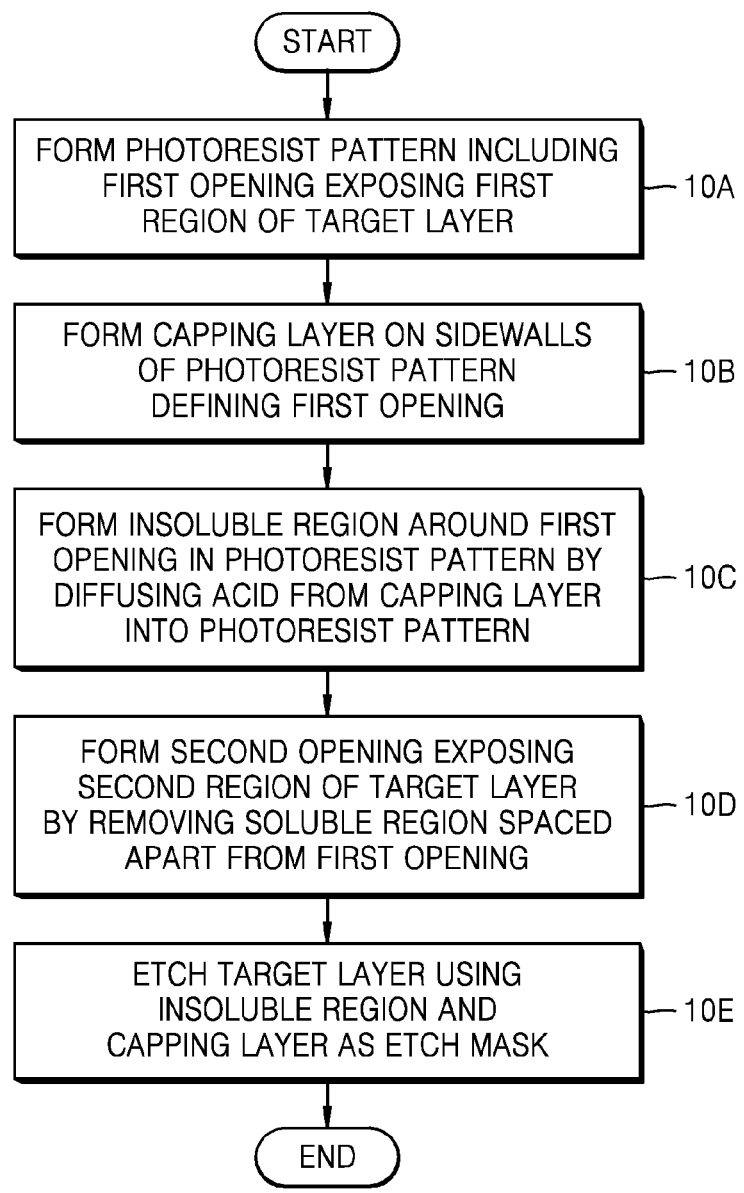
FIG. 1 is a flowchart of a method of forming patterns, according to an embodiment of the inventive concept.

Example embodiments of the inventive concept will be described more fully with reference to the accompanying drawings. Like reference numerals in the drawings refer to like elements, and redundant descriptions thereof are omitted.

Reference will now be made in detail to example embodiments and the accompanying drawings. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms "first", "second", "third", etc. may be used herein to describe various elements, components, areas, layers and/or sections, these elements, components, areas, layers and/or sections should not be limited by these terms. These terms refer to a particular order, rank, or superiority and are only used to distinguish one element, component, region, layer or section from another element, component, region, layer or section. Thus, a first element, component, region, layer or section discussed below could be termed a second element, component, region, layer or section without departing from the teachings of the example embodiment. For example, a first element may be referred to as a second element, and similarly, a second element may be referred to as a first element without departing from the scope of protection of the inventive concept.

Layers discussed in this application may contact one another as represented in the figures or may have intervening layers interposed therebetween. Layers may also be comprised of two or more layers (e.g., made of different materials or with different processes).

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Expressions such as "at least one of," when preceding a list of elements, modify the entire list of elements and do not modify the individual elements of the list.

If any embodiment is implemented otherwise, a particular process may be performed differently from the described order. For example, two continuously-described processes may be substantially simultaneously performed or in an opposite order to the described order.

In the drawings, for example, illustrated shapes may be deformed according to fabrication technology and/or tolerances. Therefore, the exemplary embodiments of the inventive concept are not limited to certain shapes illustrated in the present specification, and may include modifications of shapes, such normal deviations resulting from fabrication processes.

FIG. 1 is a flowchart of a method of forming patterns, according to an embodiment of the inventive concept.

Referring to FIG. 1, in operation 10A, a photoresist pattern is formed on a to-be-etched film or layer (which also may be referred to herein as a "target layer"), such that the photoresist pattern has a first opening exposing a first region of the to-be-etched film.

The to-be-etched film or layer may be a semiconductor substrate, such as part of a silicon or silicon-germanium crystalline wafer. In some embodiments, the to-be-etched film may be one of a conductive film, a dielectric film, an insulating film, and a combination thereof. For example, the to-be-etched film may include, but is not limited to, one of a metal, an alloy, metal carbide, metal nitride, metal oxynitride, metal oxycarbide, a semiconductor, polysilicon, oxide, nitride, oxynitride, and combinations thereof.

For formation of the photoresist pattern, a photoresist composition including a polymer, a photoacid generator (PAG), and a solvent may be coated on the to-be-etched film to form a photoresist film and an exposing operation and a developing operation may be performed thereon. To coat the photoresist composition on the to-be-etched film, spin coating, spray coating, or deep coating may be used.

The photoresist composition may have a first polarity type (e.g., one of hydrophobic and hydrophilic or one of nonpolar and polar). The photoresist composition may include a positive-type material. The photoresist composition may include a polymer whose polarity may be created or increased due to an action of acid. For example, the photoresist composition may include a polymer that has an acid-labile protecting group. This polymer may be hydrophobic. The acid-labile protecting group may be removed from the polymer by acid, such as by a photoacid generator PAG, so that the resulting deprotected polymer is hydrophilic.

In some embodiments, the photoresist composition may include a resist for a KrF excimer laser having a wavelength of 248 nm, a resist for an ArF excimer laser having a wavelength of 193 nm, a resist for an F2 excimer laser having a wavelength of 157 nm, or an extreme ultraviolet (EUV) resist having a wavelength of 13.5 nm.

For example, the photoresist composition may include a (meth)acrylate-based polymer. The (meth)acrylate-based polymer may be an aliphatic (meth)acrylate-based polymer. For example, the (meth)acrylate-based polymer may be polymethylmethacrylate (PMMA), poly(t-butylmethacrylate), poly(methacrylic acid), poly(norbornylmethacrylate), a di-copolymer or tri-copolymer of repeating units of the (meth)acrylate-based polymers, and mixtures thereof. The above-described polymers may be substituted with various types of acid-labile protecting groups. The acid-labile protecting groups may be selected from the group of tert-butoxycarbonyl (t-BOC), iso-norbornyl, 2-methyl-2-adamantyl, 2-ethyl-2-adamantyl, 3-tetrahydrofuranyl, 3-oxocyclohexyl, γ-butyllactone-3-yl, mevalonolactone, γ-butyrolactone-2-yl, 3-methyl-γ-butyrolactone-3-yl, 2-tetrahydropyranyl, 2-tetrahydrofuranyl, 2,3-propylene carbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, and triethoxysilyl, but the acid-labile protecting groups are not limited thereto.

After forming a layer of the photoresist composition on the target layer, the photoresist layer may be patterned by selectively exposing the photoresist to light (which may be any electromagnetic radiation, including visible or non-visible light). As is conventional, such selective exposure may be performed by irradiating a photomask so that light is selectively transmitted or reflected to the photoresist layer. The light may cause the photoacid generator (PAG) to release an acid which may react with neighboring polymers in the photoresist composition to remove an acid-labile protecting group and deprotect these polymers. The deprotected polymers in the light exposed portions of the photoresist composition may be hydrophilic and the polymers in the portions of the photoresist composition that was not exposed to light may remain hydrophobic. A toner may selectively remove one of the hydrophilic or hydrophobic portions of the photoresist composition to obtain a photoresist pattern.

In operation 10B, a capping layer, including an acid source, is selectively formed on the photoresist pattern, such as being formed on a sidewall of the photoresist pattern, which defines a first opening in the photoresist pattern.

The capping layer may include an acid source including acid or potential acid, and may include a polymer.

In some embodiments, the polymer included in the capping layer may include a water-soluble polymer. The water-soluble polymer may include, as a repeating unit, at least one monomer unit selected from, for example, the group of an acrylamide-type monomer unit, a vinyl-type monomer unit, an alkylene glycol-type monomer unit, a maleic anhydride monomer unit, an ethyleneimine monomer unit, a monomer unit including an oxazoline group, an acrylonitrile monomer unit, an allylamide monomer unit, a 3,4-dihydropyran monomer unit, and a 2,3-dihydrofuran monomer unit.

For example, the polymer included in the capping layer may include one of or a mixture of one or more of vinyl pyrrolidone, vinyl caprolactam, vinyl imidazole, vinyl piperidine, and vinyl pyrrolidine.

In some embodiments, the potential acid included in the capping layer may be a thermo-acid generator (TAG) that generates acid by heat. The TAG may include an aliphatic or alicyclic compound. For example, the TAG may include at least one compound selected from the group of carbonate ester, sulfonate ester, and phosphate ester. For example, the TAG may include at least one compound selected from the group of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, and adamantyl nonafluorobutanephosphonate.

In some embodiments, the potential acid included in the capping layer may be one selected from perfluorobutane sulfonic acid ($C_4F_9SO_3H$), trifluoroacetic acid ($CF_3CO_2H$), and trifluoromethanesulfonic acid ($CF_3SO_3H$).

In some embodiments, the potential acid included in the capping layer may be a PAG. The PAG may generate acid when being exposed to light from a laser, such as a KrF excimer laser (248 nm), an ArF excimer laser (193 nm), or an F2 excimer laser (157 nm). The PAG may include triarylsulfonium salts, diaryliodonium salts, sulfonates, or a mixture thereof. For example, the PAG may be triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, or norbornene-dicarboximide PFOS, or mixtures thereof.

In some examples, the capping layer includes a mixture of polymer and the acid source (e.g., the potential acid, such as a TAG or PAG), and the content of the acid source may be 0.01 to 50% by weight based on a gross weight of the polymer.

Examples of a method of forming the capping layer may include coating an exposed surface of the photoresist pattern with a capping composition composed of a mixture of water, a water-soluble polymer, and an acid source composed of water-soluble acid or a potential acid and then thermally treating the resultant photoresist pattern that was coated with the capping composition. The thermal treating may be performed at a temperature of about 30 to about 200° C. for about 3 to about 300 seconds, but is not limited thereto. In some embodiments, the capping layer may be formed at room temperature. Also, the thermal treating may be omitted.

The capping composition may include a homo-polymer and/or a co-polymer and a solvent. The homo-polymer or co-polymer may be obtained from a monomer that includes an amine group on its side chain. Available examples of a polymer including an amine group on its side chain include vinyl pyrrolidone expressed in Chemical Formula 1, vinyl caprolactam expressed in Chemical Formula 2, vinyl imidazole expressed in Chemical Formula 3, vinyl piperidine expressed in Chemical Formula 4, and vinyl pyrrolidine expressed in Chemical Formula 5, but the types of monomer are not limited thereto. The side chain of the monomer may further include an additional nitrogen (N) or oxygen (O) atom capable of hydrogen bonding.

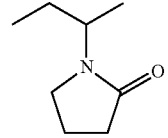

[Chemical Formula 1]

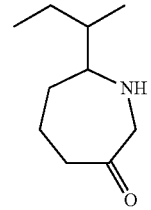

[Chemical Formula 2]

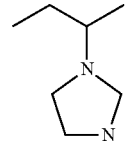

[Chemical Formula 3]

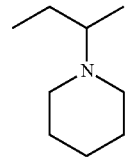

[Chemical Formula 4]

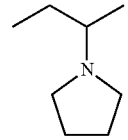

[Chemical Formula 5]

The polymer included in the capping composition may have a weight or an average molecular weight of about 1,000 to about 100,000.

The solvent of the capping composition may include a water-soluble solvent.

The capping composition may be weakly acidic. For example, the pH of the capping composition may be in a range of about 4 to about 6. In some embodiments, the capping composition may further include a pH tuning agent for adjustment of the pH of the capping composition to a predetermined range.

A hydrogen bond, a bond by dipole interaction, or an ionic bond may be formed between the capping layer formed in operation 10B and the photoresist pattern, which will be described below in detail with reference to FIGS. 5A to 5C.

In some embodiments, forming the capping layer as in operation 10B may comprise an operation of mixing a Resolution Enhancement Lithography Assisted by Chemical Shrink (RELACS™) material (manufactured by AZ Electronic Materials) with one of the aforementioned acid sources, spin-coating the mixture on an exposed surface of the photoresist pattern, and baking the resultant photoresist pattern at a temperature of about 100 to about 130° C. for about 20 to about 70 seconds to form the capping layer. At this time, acid remaining on the surface of the photoresist pattern may serve as a catalyst, and thus the RELACS™ material may be cross-linked with the surface of the photoresist pattern to form the capping layer.

After the capping layer is formed in operation 10B, an unnecessary coating composition remaining on the capping layer may be removed by any one solvent of water, an organic solvent, a mixture of water and an organic solvent, and a developer.

In operation 10C, acid obtained from the acid source included in the capping layer remaining on the photoresist pattern is diffused from the capping layer into the photoresist pattern to form an insoluble region around the first opening on the photoresist pattern. The insoluble region may be hydrophilic and insoluble with respect to organic solvent such as a negative tone developer.

In some embodiments, acid is generated from the TAG included in the capping layer by performing thermal treating on the capping layer and the acid generated from the TAG is diffused from the capping layer into the photoresist pattern for formation of the insoluble region, thereby de-protecting polymers included in the photoresist pattern around the first opening.

Thermal treating may be performed on the capping layer at a temperature of about 30 to about 200° C. for about 3 to about 300 seconds for generation of acid from the TAG included in the capping layer.

In operation 10D, the soluble region spaced apart from the first opening by the insoluble region formed in operation 10C is removed from the photoresist pattern to form a second opening that exposes a second region spaced apart from the first region on the to-be-etched film.

The soluble region of the photoresist pattern may be a region of the photoresist pattern in which the polarity of the photoresist pattern has not been substantially changed (e.g., as compared to the polarity of the photoresist composition after its initial deposition). For example, the non-exposed region of the photoresist pattern may not have been subjected to modification due to application of an acid. For example, when the photoresist composition as deposited on the target layer is hydrophobic, the polarity of the photoresist pattern in the soluble region may also be hydrophobic.

An organic solvent may be used to develop the photoresist pattern for removal of the soluble region and formation of the second opening. The organic solvent may be composed of a negative tone developer that selectively removes the soluble region of the photoresist pattern. The organic solvent may include a non-polar solvent. For example, the organic solvent may be aromatic hydrocarbon, cyclohexane, cyclohexanone, non-cyclic or cyclic ether, acetate, propionate, butyrate, lactate, or mixtures thereof. For example, as the organic solvent, there are n-butyl acetate (nBA), propylene glycol methyl ether (PGME), propylene glycol methyl ether acetate (PGMEA), γ-butyrolactone (GBL), or isopropanol (IPA).

The capping layer may remain and not be removed during removal of the soluble region. Alternatively, a first portion of the capping layer may be removed during removal of the soluble region, and a second portion of the capping layer may be left.

In some embodiments, a thickness of the capping layer, which is left after the removal of the soluble region by using the organic solvent, may be controlled by adjusting (or otherwise dependent upon) a composition ratio of some repeating units constituting a polymer forming the capping layer. For example, when the polymer of the capping layer includes a pyrrolidone monomer unit (P) and a caprolactam monomer unit (C), the amount of the capping layer that is etched by the organic solvent may be controlled by adjusting a composition ratio of the pyrrolidone monomer unit (P) and the caprolactam monomer unit (C). For example, in a case where the soluble region is removed by using nBA, when the composition ratio (P:C) of P with respect to C is 9:1, the capping layer may not be removed by the nBA and mostly left. When P:C is 7:3, the capping layer is removed at an etching rate of about 6 Å/sec. After the soluble region is entirely removed, a portion of the capping layer is removed by nBA, and a portion of the capping layer may be left on the sidewall of the photoresist pattern. When P:C is equal to or less than 5:5, the capping layer is removed at an etching rate of about 60 Å/sec, and the capping layer is removed during removal of the soluble region. Therefore, the capping layer may not be left on the sidewall of the photoresist pattern. In some embodiments, the composition ratio P:C of the pyrrolidone monomer unit (P) to the caprolactam monomer unit (C) is greater than 5:5, or greater than 7:3 or greater than 9:1. In some embodiments, the composition ratio P:C of the pyrrolidone monomer unit (P) to the caprolactam monomer unit (C) may be less than or equal to 7:3 or less than or equal to 5:5.

In operation 10E, the to-be-etched film is etched by using the insoluble region as an etch mask, thereby forming a predetermined fine pattern.

The capping layer may also be used with the insoluble region as the etch mask. The capping layer used as part of the tech mask may be maintained at a thickness formed in operation 10B. Alternatively, when the soluble region is removed for formation of the second opening in operation 10D, and a first portion of the capping layer is removed, a second portion of the capping layer may be left and used with the non-soluble region as the etch mask.

The fine pattern obtained after etching of the to-be-etched film (or target layer) may constitute various elements necessary for implementation of an integrated circuit (IC) device. For example, the fine pattern may be an active region defined in a substrate. In another example, the fine pattern may include a plurality of contact hole patterns or line-and-space patterns. In another example, the fine pattern may include a conductive pattern or an insulating pattern. For example, the conductive pattern may include a pattern for formation of a plurality of bit lines arranged in a cell array region of an IC device, a pattern for formation of a plurality of direct contacts, a pattern for formation of a plurality of buried contacts, a pattern for formation of a plurality of lower electrodes, or a pattern for formation of a plurality of conductive patterns arranged in a core region of an IC device.

Figure 2:
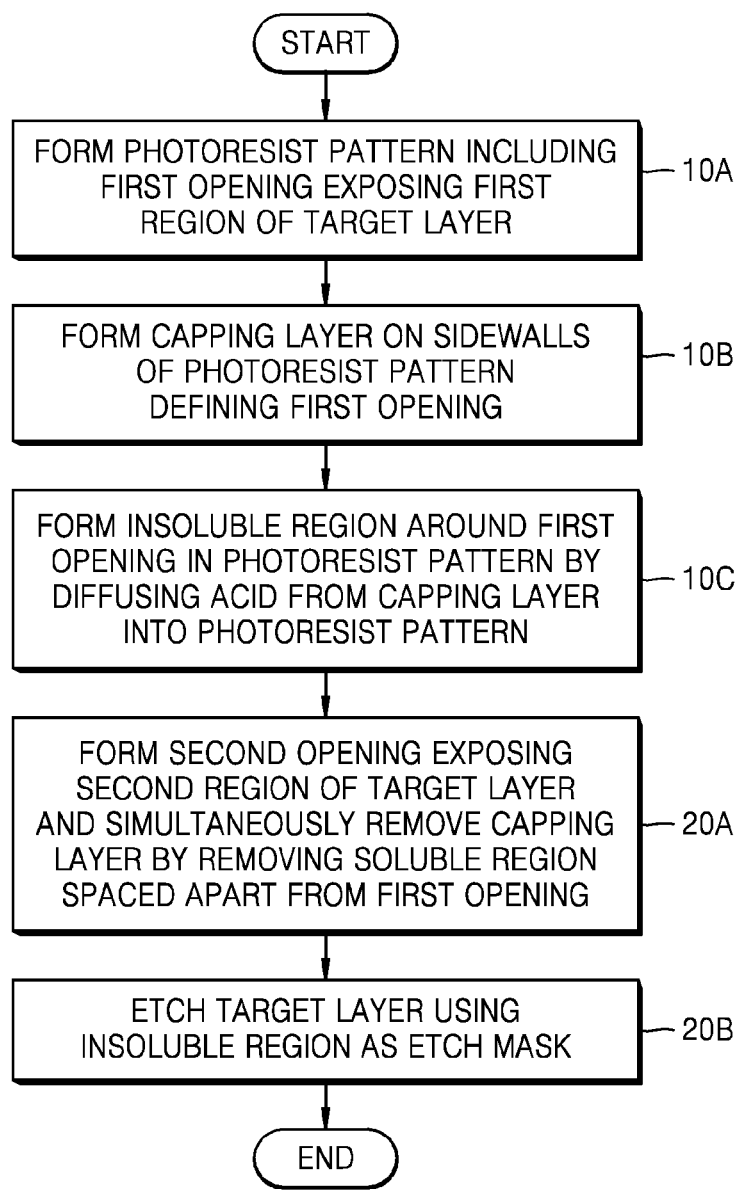
FIG. 2 is a flowchart of a method of forming patterns, according to another embodiment of the inventive concept.

FIG. 2 is a flowchart of a method of forming patterns according to another embodiment of the inventive concept.

Referring to FIG. 2, an insoluble region is formed in a photoresist pattern by performing operations 10A to 10C as described above with reference to FIG. 1.

In operation 20A of FIG. 2, a soluble region of the photoresist pattern is removed to form a second opening exposing the second region of the to-be-etched film like operation 10D of FIG. 1. During removal of the soluble region for formation of the second opening, the capping layer formed in operation 10B is also removed.

The composition ratio of repeating units of the polymer included in the capping composition used to form the capping layer in operation 10B may be adjusted for removal of the capping layer of operation 20A, as described above. For example, the composition ratio P:C of the pyrrolidone monomer unit (P) to the caprolactam monomer unit (C) may be less than or equal to 7:3 or less than or equal to 5:5.

When the capping layer is removed, the sidewall of the photoresist pattern that defines the first opening exposing the first region of the to-be-etched film may be exposed.

In operation 20B of FIG. 2, a fine pattern is formed by etching the to-be-etched film by using the insoluble region of the photoresist pattern as a etch mask.

The fine pattern obtained after etching of the to-be-etched film may constitute various elements necessary for implementation of an IC device as described elsewhere herein.

Figure 3:
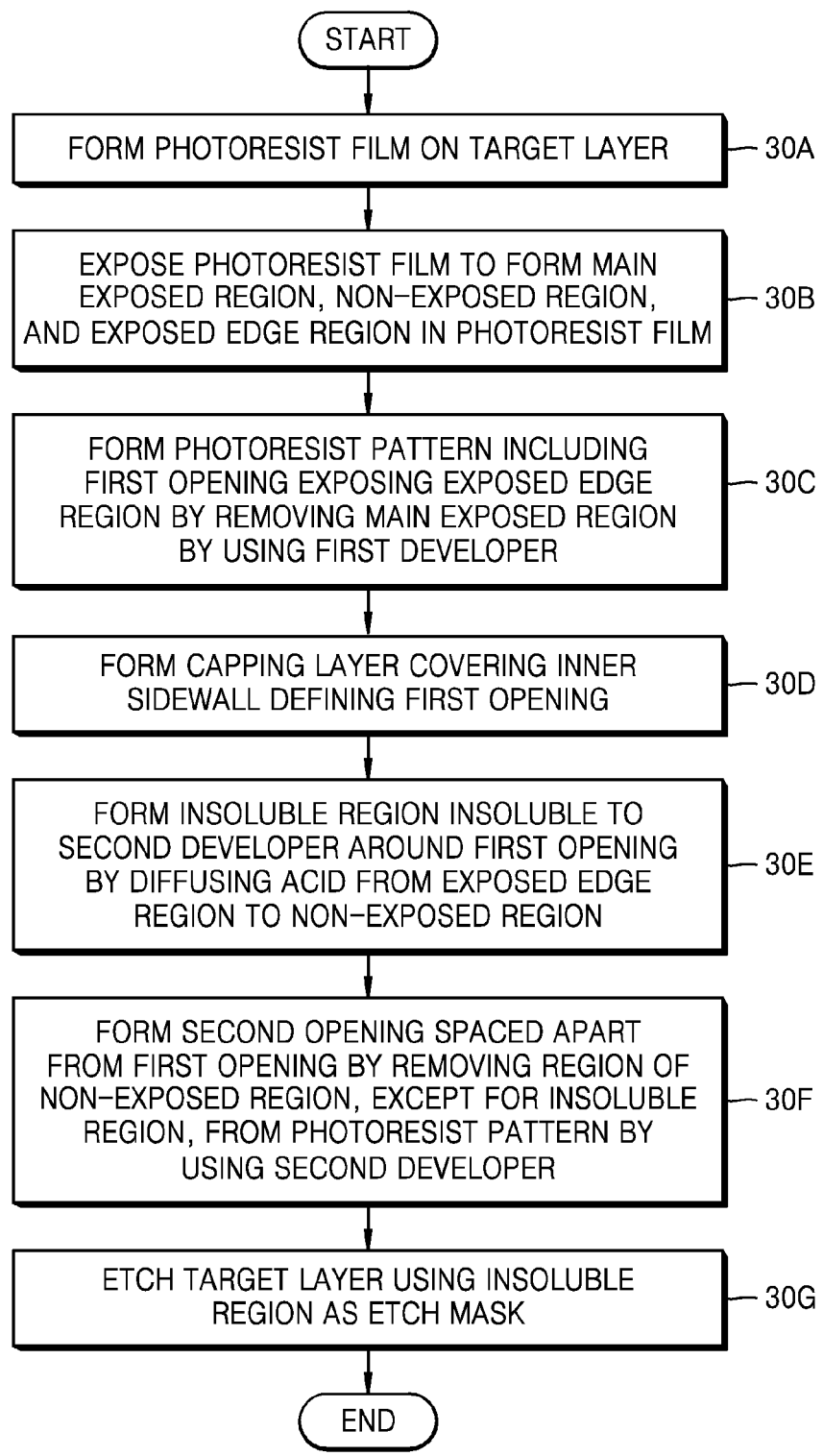
FIG. 3 is a flowchart of a method of forming patterns, according to another embodiment of the inventive concept.

FIG. 3 is a flowchart of a method of forming patterns, according to embodiments of the inventive concept.

FIGS. 4A to 4G are cross-sectional views illustrating a method of forming patterns, according embodiments of the inventive concept. The drawings are presented to provide detailed examples associated with the pattern forming methods described above with reference to FIG. 3.

Figure 4A:
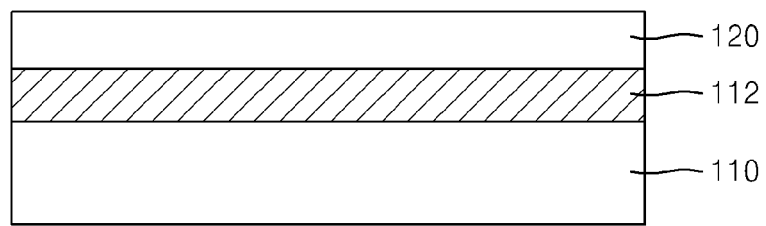
FIGS. 4A to 4G are cross-sectional views illustrating a method of forming patterns, according to another embodiment of the inventive concept.

Referring to FIGS. 3 and 4A, in operation 30A, a photoresist film 120 is formed on a target layer 112 of a substrate 110.

The substrate 110 may be a semiconductor substrate. In some embodiments, the substrate 110 may include a semiconductor, such as silicon (Si) or germanium (Ge). In some embodiments, the substrate 110 may include a compound semiconductor, such as SiGe, SiC, GaAs, InAs, or InP. In some embodiments, the substrate 110 may have a silicon on insulator (SOI) structure. The substrate 110 may include a conductive region, for example, an impurity-doped well, or an impurity-doped structure. Also, the substrate 110 may have various isolation structures, such as a shallow trench isolation (STI) structure.

The target layer 112 may be an insulating film or a conductive film. The target layer 112 may include, but is not limited to, one of a metal, an alloy, metal carbide, metal nitride, metal oxynitride, metal oxycarbide, a semiconductor, polysilicon, oxide, nitride, oxynitride, and mixtures thereof. When final patterns are formed on the substrate 110, the target layer 112 may be omitted.

The photoresist film 120 may be a film including a photoresist composition composed of a polymer, of which the polarity is changed due to an action of acid. For example, the polarity of the photoresist may be initially hydrophobic and may be changed to hydrophilic due to the action of an acid. The photoresist composition may be a chemically amplified photoresist including a polymer including an acid-labile group, a PAG, and a solvent. In some embodiments, the polymer may be a (meth)acrylate-based polymer. The polymer may include an acid-labile protecting group. In examples described herein, the polymer of the photoresist composition is initially hydrophobic and may be deprotected with the removal of the acid-labile group to become hydrophilic. However, it will be understood that the photoresist composition may be initially hydrophilic and may be subsequently altered to become hydrophilic.

The photoresist film 120 may include a resist for a KrF excimer laser (248 nm), a resist for an ArF excimer laser (193 nm), a resist for an F2 excimer laser (157 nm), or an EUV resist (13.5 nm). The photoresist film 120 may be formed using, for example, spin coating, spray coating, or deep coating. The photoresist film 120 may be formed to have a thickness of about 300 to about 1,500 Å. After formation of the photoresist film 120, a soft baking operation may be performed at a temperature of about 80 to about 130° C. for about 40 to 100 seconds.

Figure 4B:
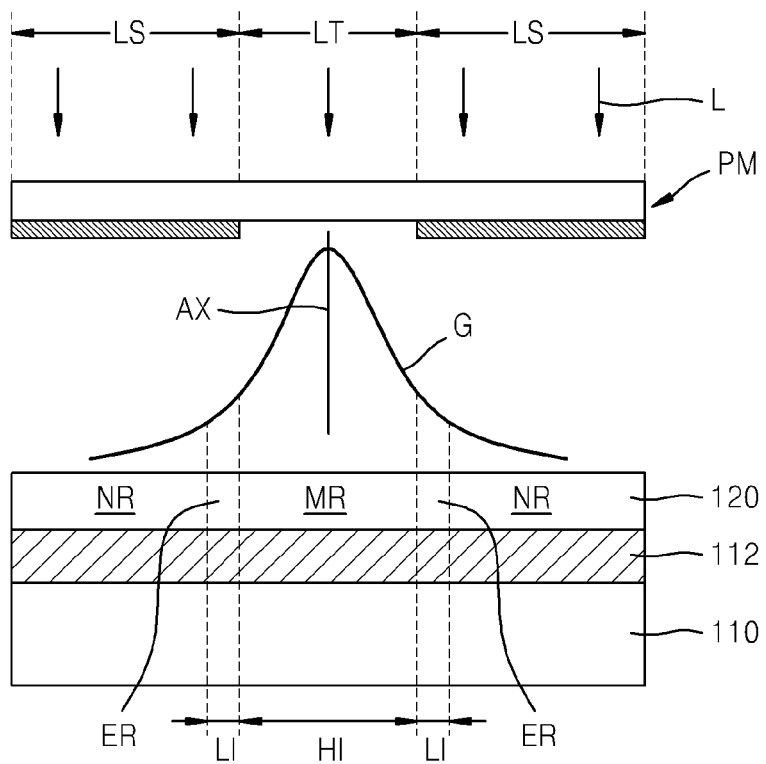

Referring to FIGS. 3 and 4B, in operation 30B, the photoresist film 120 is exposed to form a main exposed region MR, a non-exposed region NR, and an exposed edge region ER.

The main exposed region MR is a region in which there is a sufficient polarity change in the polymer of the photoresist composition such that the main exposed region MR is removed by a first developer composed of an aqueous alkaline solution (e.g., the polymer of the photoresist composition becomes sufficiently hydrophilic for removal by a developer, such as the aqueous alkaline solution). The non-exposed region NR is a region in which there is no polarity change (e.g., the polymer of the photoresist composition remains hydrophobic). The exposed edge region ER is arranged between the main exposed region MR and the non-exposed region NR and is a region where there is some polarity change of the polymer of the photoresist composition (e.g., some of the polymer at the edge region ER becomes hydrophilic) but this polarity change is of an amount insufficient to remove the exposed edge region during a subsequent development (e.g., such as by the aqueous alkaline solution). The extent of the polarity change of the polymer in the edge region ER gradually decreases as it is closer to the non-exposed region NR from the main exposed region MR.

In operation 30B, a Gaussian beam is irradiated onto the photoresist film 120 through a photomask PM including a light-shielding area LS and a light-transmitting area LT when the photoresist film 120 is exposed for formation of the main exposed region MR, the non-exposed region NR, and the exposed edge region ER on the photoresist film 120.

With the exposing operation in operation 30B, when light L from a light source, such as an excimer laser, is irradiated onto the substrate 110 through the photomask PM, the light beam may be axis-symmetric around a light axis AX, and the current density distribution thereof may have a Gaussian distribution as indicated by G. Therefore, the intensity of the light beam rapidly decreases as it is farther from the light axis AX.

Portions of the photoresist film 120 that are exposed to light L may have the PAG in the photoresist film 120 generate acid as a result. The amount of acid released by the PAG at any location of the photoresist film 120 may be dependent on the amount of light L (e.g., intensity and time) received by the photoresist film 120. Acid released from the PAG may act to cause the polymer to change its polarity (in this example, from hydrophobic to hydrophilic). For example, acid released from the PAG may remove acid-labile protecting groups from the polymer (e.g., deprotect the polymer) to provide carboxyl groups at side chains of the polymer at the corresponding location of the photoresist, causing the polymer to alter its polarity. Thus, the amount of light L that a location of the photoresist film 120 receives may control the amount that the polymer of the photoresist film 120 at that location changes its polarity. As a result, the main exposed region MR may have a sufficient polarity change such that the main exposed region MR is substantially developed by a positive tone developer. The main exposed region MR is a high intensity region HI in which the intensity of exposure light of the Gaussian beam is relatively large on the photoresist film 120. On the contrary, in the exposed edge region ER that is a low intensity region LI in which the intensity of exposure light of the Gaussian beam is relatively weak on the photoresist film 120, a small amount of acid may be generated from the PAG of the photoresist film 120 due to the exposure light. The amount of generated acid is not sufficient, and therefore, the polarity change of the polymer forming the photoresist film 120 is not sufficient to be removed by a subsequent development. The exposed edge region ER may not be developed by the positive tone developer. Since the non-exposed region NR of the photoresist film PR is not exposed, there is substantially no polarity change. The exposed edge region ER is arranged between the main exposed region MR and the non-exposed region NR. In the exposed edge region ER, the extent of the polarity change may be gradually reduced from the main exposed region MR towards the non-exposed region NR as it comes closer from the main exposed region MR to the non-exposed region NR.

Through exposure of the photoresist 120 in operation 30B, the Gaussian beam may be irradiated onto the photoresist film 120 to form the main exposed region MR, the exposed edge region ER, and the non-exposed region NR in the photoresist film 120. The exposed edge region ER corresponds to a low intensity region LI in which the intensity of an exposure light is relatively weak. In the exposed edge region ER, a relatively small amount of acid (as compared to the main region MR) may be generated from the PAG of the photoresist film 120 by an exposing operation, and therefore, some acid-labile protecting groups that had been bonded to the polymer may be de-protected due to the small amount of acid. As a result, in the photoresist film 120, carboxyl groups of the polymer (e.g., carboxyl groups on side chains of the polymer) may be increased in proportion to the amount of the acid-labile protecting groups de-protected from the polymer.

A post exposure baking operation may be performed on the exposed photoresist film 120 at a temperature of about 80 to about 130° C. for about 40 to about 100 seconds.

Figure 4C:
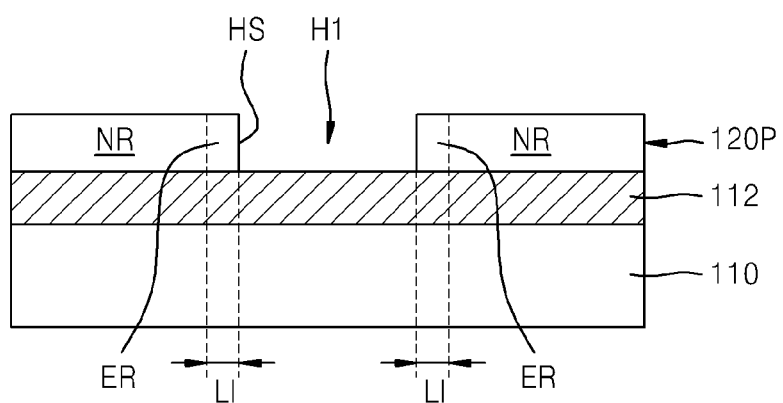

Referring to FIGS. 3 and 4C, in operation 30C, the main exposed region MR is removed by developing the photoresist film 120 by using a first developer. Therefore, the photoresist pattern 120P having an inner sidewall HS that defines a first opening H1 exposing the exposed edge region E may be formed.

The first developer may be a positive tone developer that acts to remove sufficiently hydrophilic photoresist (e.g., by being sufficiently solvent with the hydrophilic photoresist) but does not remove hydrophobic photoresist and insufficiently hydrophilic (e.g., party hydrophilic and part hydrophobic) photoresist. In some embodiments, the first developer may include an aqueous alkaline solution. For example, the first developer may include a tetramethyl ammonium hydroxide (TMAH) aqueous solution. The TMAH aqueous solution may have a concentration of about 2 to 5 wt %. For example, the exposed photoresist film 120 may be developed using the TMAH aqueous solution for about 10 to about 100 seconds for formation of the photoresist pattern 120P.

Figure 4D:
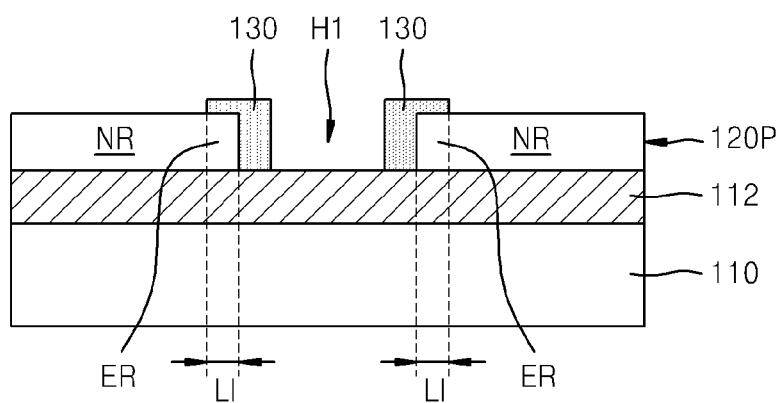

Referring to FIGS. 3 and 4D, in operation 30D, a capping layer 130 is formed to cover the inner sidewall HS of the first opening H1.

The capping layer 130 may be formed to have a thickness of about 200 to about 2,000 Å on the sidewall of the photoresist pattern 120P. In contrast, the capping layer 130 may be scarcely formed on an upper surface of the photoresist pattern 120P in which the non-exposed region NR is exposed, or be formed to have a thickness that is much smaller (e.g., less than $1/10^{th}$ or less than $1/100^{th}$) than that of the capping layer 130 formed on the sidewall of the photoresist 120P.

The capping layer 130 includes an acid source containing acid or potential acid. The capping layer 130 may be the same as described elsewhere herein, such as the capping layer as described above with reference to operation 10B of FIG. 1.

To form the capping layer 130, a capping composition is spin coated on the exposed surface of the photoresist pattern 120P. The capping layer 130 may be selectively formed on the photoresist pattern 120P. The capping layer 130 may include material that has a tendency to bond with the deprotected polymers of the photoresist (in this example, at the edge region ER) and does not bond or has significantly less tendency to bond with the polymers that were not deprotected. As discussed, the capping layer 130 may be formed at the vertical edges of the photoresist pattern 120P that define openings in the photoresist pattern, such as sidewalls HS defining first opening H1. The capping composition may induce a chemical reaction with the exposed edge region ER of the photoresist pattern 120P.

Figure 5A:
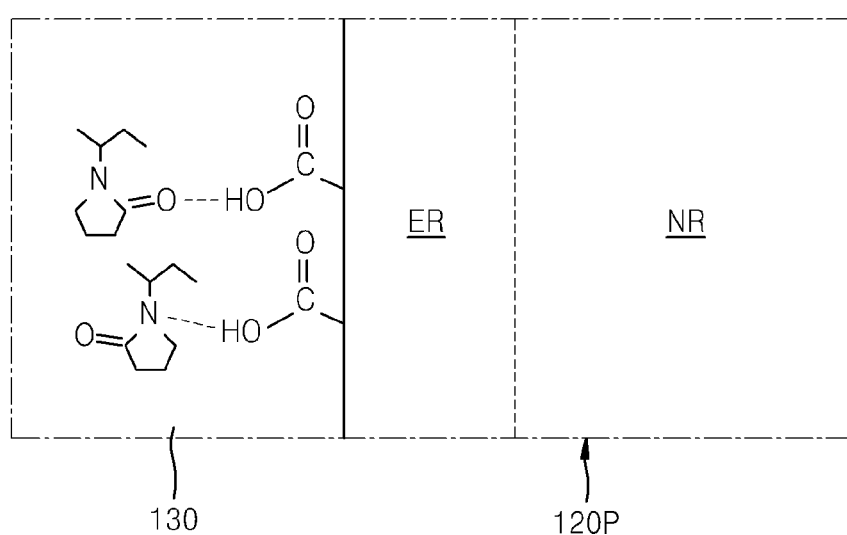
FIGS. 5A to 5C are cross-sectional views illustrating chemical bonds formed in an interface between an exposed edge region of a photoresist pattern and a formed capping layer, in a method of forming patterns, in detail, according to another embodiment of the inventive concept.
Figure 5B:
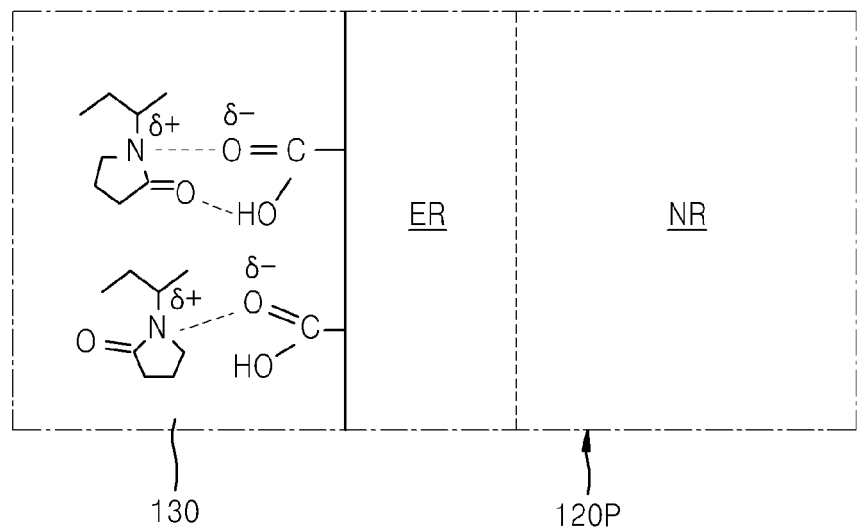
Figure 5C:
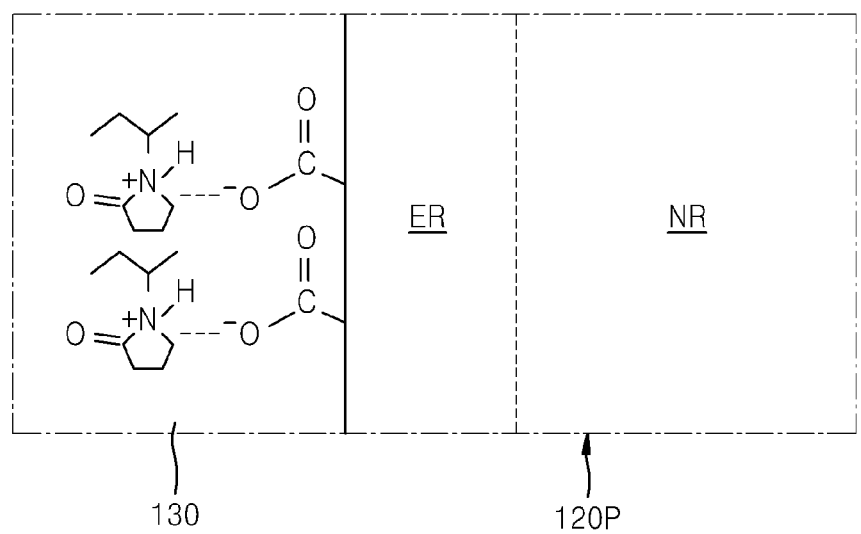

FIGS. 5A to 5C are cross-sectional views illustrating exemplary chemical bonds formed in the interface between the exposed edge region ER of the photoresist pattern 120P and the capping layer 130 in detail. In FIGS. 5A and 5B, the description is given on the assumption that the capping layer 130 includes polyvinyl pyrrolidone and the exposed edge region ER of the photoresist pattern 120P includes a carboxyl group as the side chain of a polymer, but the technical idea of the inventive concept is not limited thereto. FIGS. 5A to 5C illustrate the carboxyl groups (COOH) extending from the edge region ER, but note that the carboxyl groups are part of the polymer of the photoresist pattern 120P in the edge region ER. The carboxyl groups shown may represent those carboxyl groups of the polymer at the border (e.g., exposed at the sidewall HS) of the edge region).

As described above with reference to FIG. 4C, since some of the acid-labile protecting groups that were previously bonded to the polymer are de-protected due to a relatively small amount of acid generated through the exposing operation (due to release of acid from the PAG of the photoresist composition), the exposed edge region ER of the photoresist pattern 120P may include a carboxyl group as the side chain of the polymer.

In some embodiments, when the capping composition includes a polymer obtained from a monomer including an amine group on its side chain as depicted in Chemical Formulas 1 to 5, a nitrogen atom or oxygen atom constituting the amine group, for example, an oxygen atom of a ketone group included in a pyrrolidone group as depicted in Chemical Formula 1, may be capable of hydrogen bonding with a hydrogen atom of a carboxyl group existing in the exposed edge region ER of the photoresist pattern 120P. The carboxyl group shown at the exposed edge region ER in FIGS. 5A to 5C may be formed in the exposing operation as described above with reference to FIG. 4B.

In some embodiments, as atoms are closer to each other in the interface between the capping layer 130 and the exposed edge region ER of the photoresist pattern 120P, a dipole may be formed. As the pyrrolidone group is closer to the carboxyl group, a partial positive charge is created in the nitrogen atom of the pyrrolidone group and a partial negative charge is created in the oxygen atom of the carboxyl group, as illustrated in FIG. 5B. Therefore, a weak bond results from dipole interaction between the nitrogen atom and the oxygen atom.

In some embodiments, ionic bonds may be formed in the interface between the capping layer 130 and the exposed edge region ER of the photoresist region 120P, as illustrated in FIG. 5C. To this end, the pH of a capping composition used for formation of the capping layer 130 may be adjusted.

For example, when the pH of the capping composition is in the range of about 4 to about 6, an H⁺ ion may be dissociated from an acidic carboxyl group having a higher pH than that of the capping composition and a negative carboxylate ion may be exposed on the surface of the photoresist pattern 120P. The nitrogen atom of the pyrrolidone group of the polymer included in the capping composition receives an H⁺ ion to change to a positive ion. Therefore, the capping layer 130 may be formed on the exposed edge region ER of the photoresist pattern 120P by the ionic bond between the negative ion and the positive ion, as illustrated in FIG. 4D. The ionic bond may have a stronger bonding strength than a hydrogen bond or a bond by a dipole interaction.

Since acid is not generated in the non-exposed region NR of the photoresist pattern 120P, de-protection reaction of the polymer does not occur (the polymer is not deprotected), and therefore, the content of the carboxyl groups may be much smaller than that in the exposed edge region ER. As a result, the capping layer 130 may not be formed on the non-exposed region NR. Alternatively, the capping layer 130 may be formed on the non-exposed region NR to an extent such that the thickness of the capping layer 130 on the non-exposed region NR is much smaller than that of the capping layer 130 formed on the exposed edge region ER. Depending on a situation, a portion of the capping layer 130 formed on the non-exposed region NR of the photoresist pattern 120P may have a negligible thickness depending upon the implementation of forming patterns.

In some embodiments, after the capping layer 130 is formed as illustrated in FIG. 4D, residues of the capping composition, which do not have a reaction for formation of the capping layer 130, may be removed using a cleaning solution. A hydrophilic solution may be used as the cleaning solution. For example, the cleaning solution may include water or alcohol, but is not limited thereto.

In some embodiments, removal of the residues of the capping composition may be performed after an acid diffusion operation as described below with reference to operation 10E of FIG. 3 and FIG. 4E.

Figure 4E:
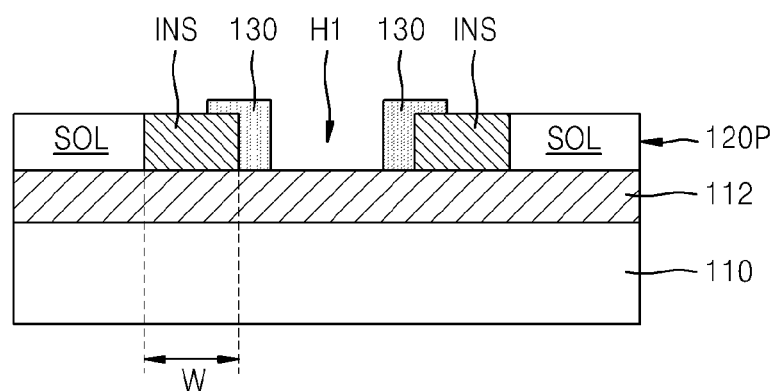

Referring to FIGS. 3 and 4E, in operation 30E, acid is diffused from the exposed edge region ER into the non-exposed region NR of the photoresist region pattern 120P to form an insoluble region INS that is insoluble to a second developer around the first opening H1 of the photoresist region 120P. As will be appreciated, the reference to an insoluble region (or a soluble region) is a relative description—a composition that is insoluble to one solvent (or developer) may be solvent to another type of solvent (or developer). In general, hydrophilic compositions are often soluble with hydrophilic solvents (and not solvent with hydrophobic solvents) and hydrophobic compositions tend to be soluble with hydrophobic solvents (and no solvent with hydrophilic solvents).

The acid may be provided from selectively deposited capping layer 130. For example, the capping layer 130 may include a TAG that during and/or after the selective deposition of the capping layer 130 at the edge region ER releases an acid due to thermal treatment (e.g., heating the capping layer 130). The released by the TAG of the capping layer may diffuse into a portion of the non-exposed region NR adjacent the edge region ER. Where the acid diffuses, the acid may alter the polarity of the polymer of the photoresist pattern 120P. Thus, the acid may further alter the polarity of the polymer of the photoresist pattern 120P at the edge region ER and alter the polarity of the polymer at portions of the non-exposed region NR adjacent the edge region ER to create the insoluble region INS. Here the acid generated from the TAG of the capping layer may alter the polarity of the polymer of the photoresist (e.g., from hydrophobic to hydrophilic) in a manner similar to that described herein with respect to the acid generated from the PAG of the photoresist (e.g., deprotecting polymers by removing acid-labile protecting groups to provide carboxyl groups on side chains of the polymers).

The insoluble region INS may be insoluble to a second developer. The second developer may be a negative tone developer. For example, the second developer may include an organic solvent, such as nBA, PGME, PGMEA, GBL, or IPA. The structure shown in FIG. 4D having the capping layer 130 formed thereon may be thermally treated to diffuse the acid from the exposed edge region ER into the non-exposed region NR in the photoresist pattern 120P. The thermal treatment may be performed at a temperature of about 30 to about 200° C. for about 3 to 300 seconds, for example. For example, the thermal treatment may be performed at a temperature of about 80 to about 150° C. for about 40 to about 100 seconds.

By thermally treating the capping layer 130, acid may be generated from a TAG included in the capping layer 130. Acid included in the capping layer 130 or the acid generated from the TAG of the capping layer 130 is diffused into the non-exposed region NR. In a portion of the non-exposed region NR, an acid-labile protecting group is de-protected by the acid that has been diffused from the exposed edge region ER (e.g., via the capping layer 130) and the polarity of the portion of the non-exposed region NR is changed (e.g., to hydrophilic), so that the portion of the non-exposed region NR may be changed to an insoluble region INS that does not become developed by a negative tone developer.

By controlling a diffusion distance of acid through the thermal treatment, a width W of the insoluble region INS may be determined. To this end, at least one of a thermal treatment temperature and a thermal treatment time may be controlled. As an example, when the thermal treatment temperature is constant, the width W of the insoluble region INS may increase as the thermal treatment time increases. As another example, when the thermal treatment time is constant, the width W of the insoluble region INS may increase as the thermal treatment temperature increases. Therefore, the width W of the insoluble region INS may be adjusted by controlling at least one of the thermal treatment temperature and the thermal treatment time.

When the PAG is included in the photoresist composition forming the photoresist pattern 120P, acid generated from the PAG may also be included in the exposed edge region ER of the photoresist pattern 120P. While the capping layer 130 is being thermally treated for formation of the insoluble region INS, both the acid included in the exposed edge region ER from the PAG and acid existing in the capping layer 130 (e.g., from the TAG) may be diffused into the non-exposed region NR.

Since polarity change does not occur substantially elsewhere in the non-exposed region NR of the photoresist pattern 120P (i.e., other than in the insoluble region of the non-exposed region NR), the remaining region of the non-exposed region NR may be a soluble region SOL that is capable of being developed by the negative tone developer.

Figure 4F:
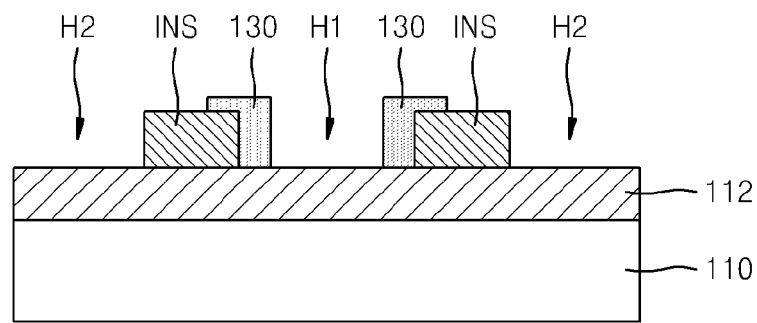

Referring to FIGS. 3 and 4F, in operation 30F, a second opening H2 spaced apart from the first opening H1 is formed by removing the remaining photoresist pattern 120P other than photoresist in the insoluble region INS. That is, photoresist pattern 120P is removed from the soluble region SOL, from the photoresist pattern 120P by using the second developer while the photoresist pattern 120P remains in the insoluble region INS.

The negative tone developer may be used as the second developer to selectively remove the photoresist pattern 120P in the soluble region SOL where there is substantially no polarity change in the photoresist pattern 120P (e.g., here, the polarity of the polymer of the photoresist pattern 120 remains as it was deposited, which in this example is hydrophobic).

In some embodiments, when the soluble region SOL is removed for formation of the second opening H2, all or a portion of the capping layer 130 may be also removed. The amount of the capping layer 130 that may be etched by the negative tone developer when the soluble region SOL of the photoresist pattern 120P is removed may be adjusting function of a composition ratio of some repeating units constituting a polymer forming the capping layer 130, as described above with reference to operation 10D of FIG. 1. For example, the composition ratio (P:C) of the pyrrolidone monomer unit (P) with respect to the caprolactam monomer unit (C) included in the capping layer 130 may made relatively large, for example, to be equal to or larger than about 7:3, thereby causing at least the portion of the capping layer 130 to remain in the first opening H1 after removal of the soluble region SOL, as illustrated in FIG. 4E.

Figure 4G:
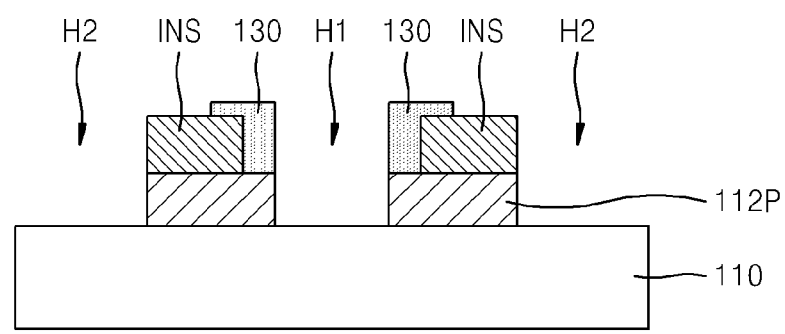

Referring to FIGS. 3 and 4G, in operation 30G, the target layer 112 is etched by using the insoluble region INS and any remaining portion of the capping layer 130 as an etch mask, thereby forming a fine pattern 112P.

Figure 6A:
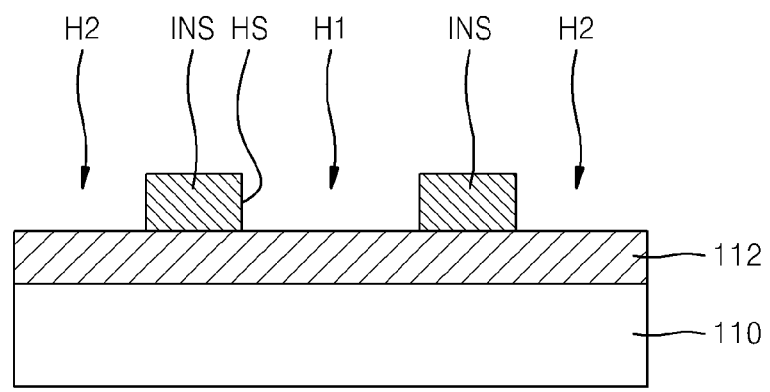
FIGS. 6A and 6B are cross-sectional views illustrating a method of forming patterns, according to another embodiment of the inventive concept.
Figure 6B:
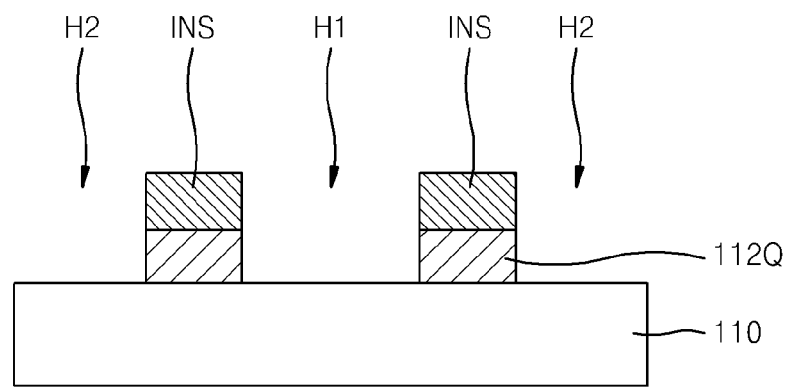

FIGS. 6A and 6B are cross-sectional views illustrating a method of forming patterns, according to another embodiment of the inventive concept. The method of FIGS. 6A and 6B is a modification of the embodiment as described above with reference to FIGS. 4A to 4G.

Referring to FIG. 6A, the insoluble region INS, as illustrated in FIG. 4E, is formed by performing the series of operations described above with reference to FIGS. 4A to 4E, and thereafter, the soluble region SOL is removed from the photoresist pattern 120P by using the second developer, as described above with reference to FIG. 4F, thereby forming the second opening H2 spaced apart from the first opening H1.

In the present embodiment, the capping layer 30 is also removed during removal of the soluble region SOL, and, therefore, the inner sidewall HS defining the first opening H1 in the insoluble region INS is again exposed and the insoluble region INS of the photoresist pattern 120P is left alone on the target layer 112.

The composition ratio of some repeating units constituting the polymer included in the capping layer 130 may be adjusted so as to remove the capping layer 130 along with the soluble region SOL during removal of the soluble region SOL by using the second developer. For example, the composition ratio (P:C) of the pyrrolidone monomer unit (P) with respect to the caprolactam monomer unit (C) included in the capping layer 130 may be adjusted to be relatively small, for example, to be equal to or smaller than about 5:5.

Referring to FIG. 6B, a fine pattern 112Q is formed by etching the target layer 112 using the insoluble region INS as an etch mask.

FIGS. 7A to 7D are cross-sectional views illustrating a method of forming patterns, according to another embodiment of the inventive concept. The method of FIGS. 7A to 7D is another modification of the embodiment as described above with reference to FIGS. 4A to 4G.

Figure 7A:
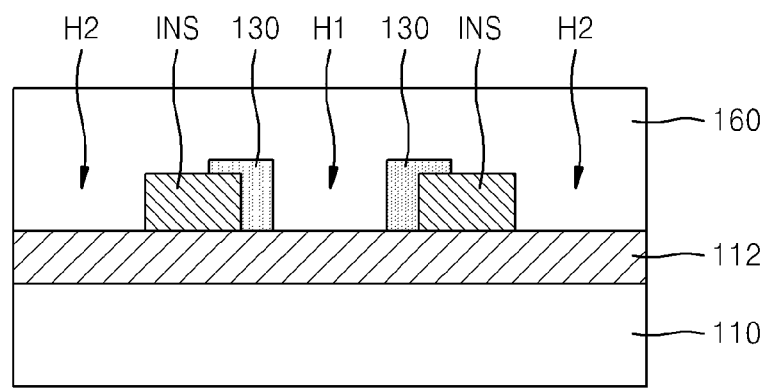
FIGS. 7A to 7D are cross-sectional views illustrating a method of forming patterns, according to another embodiment of the inventive concept.

Referring to FIG. 7A, the second opening H2 exposing a sidewall of the insoluble region INS as illustrated in FIG. 4F is formed by performing the series of operations described above with reference to FIGS. 4A to 4F, and thereafter, the resultant structure having the second opening H2 formed therein is covered by an additional capping composition 160, thereby causing the surface of the insoluble region INS to contact the additional capping composition 160.

The additional capping composition 160 may include an additional capping polymer and an organic solvent.

The additional capping polymer is dissolved in the organic solvent to form a uniform solution, and the type thereof is not limited specifically. The additional capping polymer may include the same monomer or repeating unit as the polymer included in the insoluble region INS. In some embodiments, the additional capping polymer may include an acid-labile protecting group that protects a hydrophilic group, such as a hydroxy group, a carboxyl group, or a lactone group. For example, the additional capping polymer may include a novolak resin, a hydroxy styrene resin, or an acrylic acid ester resin. The acid-labile group may include an ester group or an acetal group.

The additional capping composition 160 may include a solubility site for the organic solvent. The additional capping composition 160 may include a polymer including a nitrogen atom. The additional capping composition 160 may include a polymeric organic compound containing carbon, nitrogen, and hydrogen. For example, the additional capping composition 160 may include a compound containing pyrrolidone or a polymeric organic compound containing imidazole.

The additional capping composition 160 may include both a solubility site and an attachment site. For example, the additional capping composition 160 may include polymers having a polyhydroxy styrene (PHS) monomer unit or polystyrene (PS) monomer unit.

The additional capping composition 160 need not include acid or an acid generator when subsequent exposing and developing operations are not performed on the additional capping composition 160.

The insoluble region INS may be relatively high solubility in an aqueous alkaline solution, for example, a TMAH aqueous solution, but may not be soluble in an organic solvent substantially. Although the additional capping composition 160 includes an organic solvent, dissolution of the insoluble region INS in the organic solvent of the additional capping composition 160 may be suppressed during coating of the additional capping composition 160.

Figure 7B:
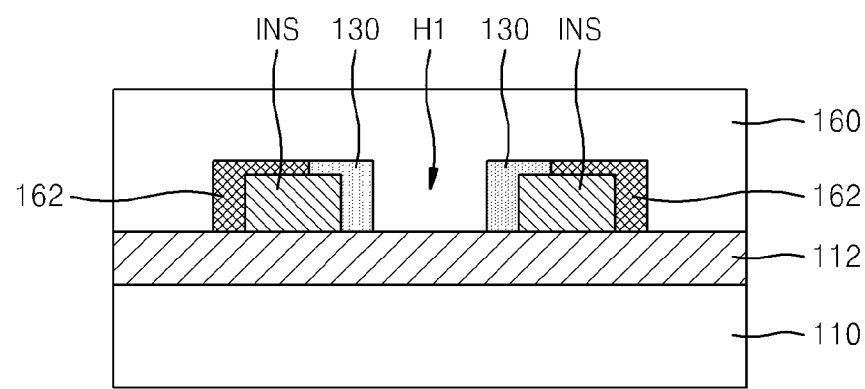

Referring to FIG. 7B, an additional capping layer 162 is formed on the insoluble region INS by performing a thermal treatment on the insoluble region INS that is covered by the additional capping composition 160.

When the additional capping composition 160 is thermally treated, a cross-linking reaction in which acid ($H^+$) existing on the surface of the insoluble region INS serves as a catalyst may occur in the interface between the insoluble region INS and the additional capping composition 160. Since acid that has been diffused from the capping layer 130 exists in the insoluble region INS, a polymer included in the additional capping composition 160 is attached on the exposed surface of the insoluble region INS, thereby forming the additional capping layer 162.

For example, the acid ($H^+$) existing in the insoluble region INS may be diffused into the additional capping composition 160 by the thermal treatment. The diffused acid ($H^+$) may de-protect polymers included in the additional capping composition 160 and form an ion bond with the de-protected polymers. Therefore, the additional capping layer 162 may be formed on surfaces contacting the additional capping composition 160 of the insoluble region INS due to a chemical reaction between the acid ($H^+$) that has been diffused from the insoluble region INS and the additional capping composition 160.

When the additional capping composition 160 includes a polymeric organic compound containing carbon, nitrogen, and hydrogen, for example, a polymeric organic compound containing pyrrolidone or imidazole, the additional capping layer 162 may be formed due to ion bonds between hydrogen atoms exposed on the surface of the insoluble region INS and nitrogen atoms contained in the additional capping composition 160.

On the contrary, since a cross-linking reaction of polymers may occur in the capping layer 130, the additional capping layer 162 may not be formed substantially on the surface of the capping layer 130.

Figure 7C:
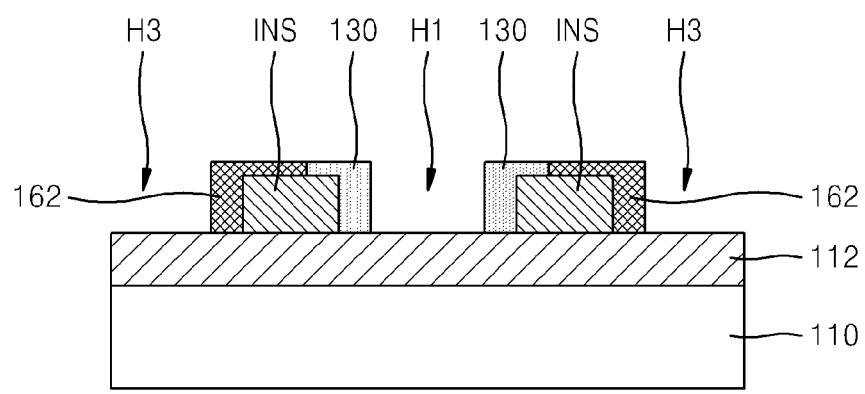

Referring to FIG. 7C, residues of the additional capping composition remaining on the additional capping layer 162 are removed.

In some embodiments, a developer, including an organic solvent, may be used to remove the residues of the additional capping composition 160.

In a case in which the additional capping composition 160 includes a same type polymer as the polymer included in the insoluble region INS, when the residues of the additional capping composition 160 are removed using the organic solvent, the additional capping layer 162 may not be consumed or etched by the organic solvent. That is, the additional capping composition 160 includes polymers containing an acid-labile protecting group that protects a hydrophilic group, such as a hydroxy group, a carboxyl group, or a lactone group, the acid ($H^+$) that has been diffused into the additional capping composition 160 through a thermal treatment as described above with reference FIG. 7B de-protects polymers included in the additional capping composition 160. Due to a de-protection reaction in which the acid-labile group of the polymers is substituted with a hydrophilic group, the additional capping layer 162 attached on the surface of the insoluble region INS is caused to have increased solubility in an aqueous alkaline solution, but to have decreased solubility in a developer including an organic solvent. The de-protection of the additional capping layer 162 may be selective to the portions of the additional capping composition 160 adjacent the insoluble region INS. The de-protection of the additional capping layer 162 may act to alter the polarity of polymers of the additional capping layer 162 from hydrophobic to hydrophilic. Therefore, through a developing operation using an organic solvent, the additional capping layer 162 may remain as it is without being dissolved. On the contrary, since a part of the additional capping composition 160, which has remained as it is without being dissolved, includes polymers that are soluble in the organic solvent, the part of the additional capping composition 160 may be dissolved in the developer including the organic solvent and be removed. After the residues of the additional capping composition 160 are removed using the developer including the organic solvent, the surface of the insoluble region INS the additional capping layer 162 remains on the surface of the insoluble region INS.

Since the additional capping layer 162 is formed, the width of the second opening H2 (see FIG. 7A) spaced apart from the first opening H1 decreases, (shown as a third opening H3 in FIG. 7C having a width defined by the additional capping layer 162).

Figure 7D:
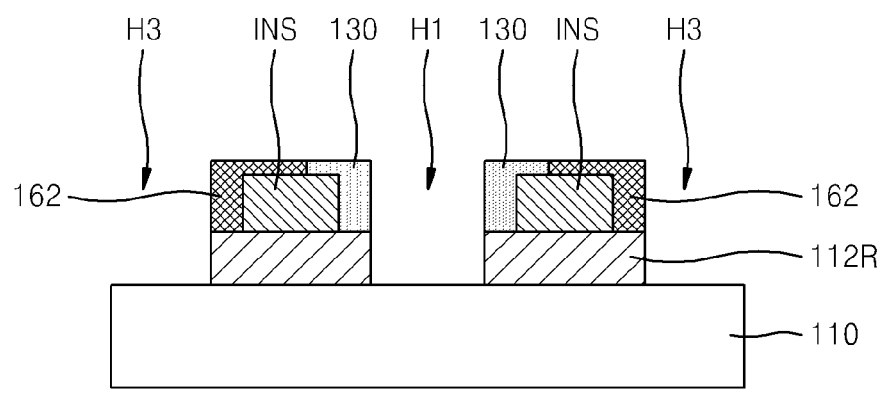

Referring to FIG. 7D, a fine pattern 112R is formed by etching the target layer 112 by using the insoluble region INS, the capping layer 130 and the additional capping layer 162 as an etch mask.

According to the method of forming patterns as described above with reference to FIGS. 7A to 7D, the additional capping layer 162 is further formed in addition to the capping layer 130, and therefore, the width of the second opening H2 (see FIG. 7A) spaced apart from the first opening decreases, thereby forming the finely-sized third opening H3 having a width defined by the additional capping layer 162. As described above, the third opening H3 having a reduced width (smaller than the opening H2 of the previous embodiments) is achieved due to the additional capping layer 162, and therefore, a feature size of a pattern determined by the insoluble region INS decreases, thereby implementing a fine pattern.

FIGS. 8A to 14B are diagrams illustrating a method of forming line-and-space patterns, according to another embodiment of the inventive concept. Specifically, FIGS. 8A, 9A, 10A, 11A, 12A, 13A, and 14A are plan views illustrating sequential operations for the pattern forming method, and FIGS. 8B, 9B, 10B, 11B, 12B, 13B, and 14B are cross-sectional views taken along lines B-B' of FIGS. 8A, 9A, 10A, 11A, 12A, 13A, and 14A, respectively. In FIGS. 8A to 14B, the same reference numerals as in FIG. 4A to FIG. 7D denote the same elements, and accordingly, a detailed description thereof is omitted herein for ease of description.

Figure 8A:
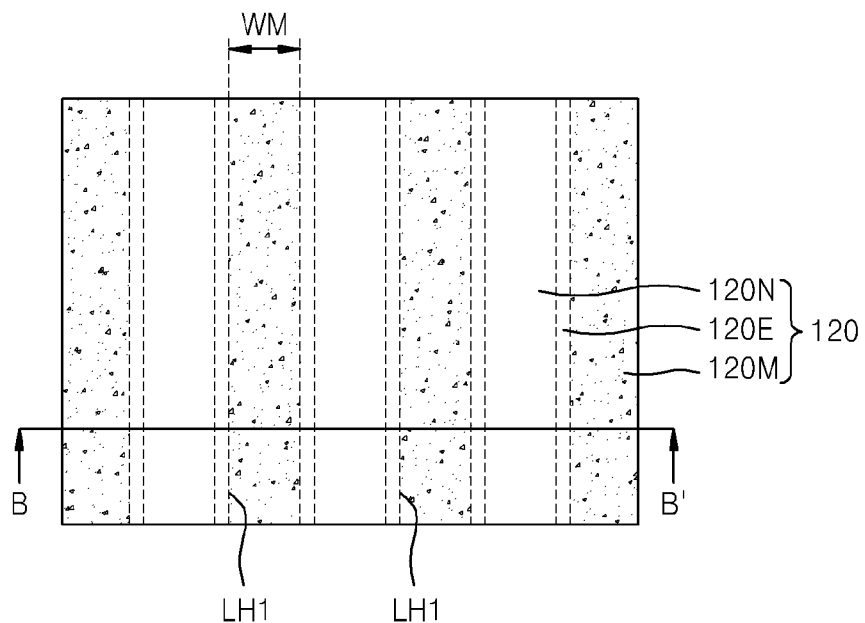
Figure 8B:
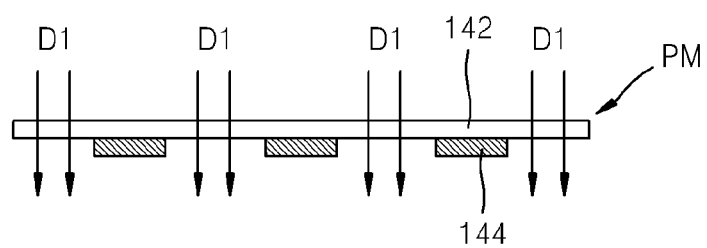
Figure 8B:
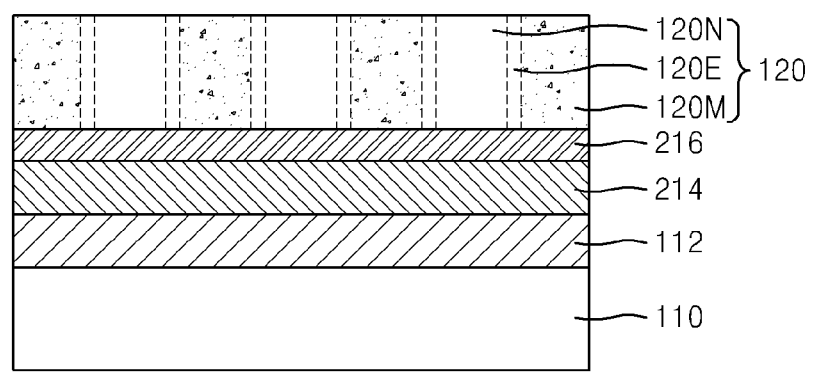

Referring to FIGS. 8A and 8B, a target layer 112 and a hard mask layer 214 are sequentially formed on a substrate 110. Also, an anti-reflective coating film 216 and a photoresist film 120 are sequentially formed on the hard mask layer 214. Thereafter, a photomask PM having a plurality of light-shielding areas and a plurality of light-transmitting areas is aligned at a predetermined position on the substrate 110, and the photoresist film 120 is exposed to a predetermined dose D1 through the plurality of light-transmitting areas of the photomask PM. By the exposing operation, a main exposed region 120M in which there is a sufficient polarity change to be removed by a positive tone developer, a non-exposed region 120N in which there is no polarity change, and an exposed edge region 120E which is arranged between the main exposed region 120M and the non-exposed region 120N and in which the extent of the polarity change may be gradually reduced from the main exposed region MR to the non-exposed region NR as it comes closer from the main exposed region MR to the non-exposed region NR and are formed in the photoresist film 120.

The main exposed region 120M, the non-exposed region 120N, and the exposed edge region 120E may be the same as the main exposed region MR, the non-exposed region NR, and the exposed edge region ER as described above with reference to FIG. 4B, respectively. Similarly, photoresist film 120 and the target layer 112 may be the same as those described elsewhere herein. It should be noted that the embodiment of FIGS. 8A to 14B first creates a hard mask pattern (by using a photoresist pattern) to etch target layer 112, thus to this extent, the hard mask layer 214 of this embodiment also is similar to the target layer 112 of the previous embodiments. However, use of a hard mask is optional and the embodiment described with respect to FIGS. 8A to 14B (as well as its alternatives) may directly etch the target layer 112 of FIGS. 8A to 14B using the photoresist pattern (with our without the additional capping layer) without use of the hard mask pattern.

The hard mask layer 214 may include various film materials according to the type of the target layer 112. For example, the hard mask layer 214 may include an oxide film, a nitride film, a SiCN film, a polysilicon film, an amorphous carbon layer (ACL), or a carbon-containing film such as a spin-on hard mask (SOH) material. The carbon-containing film, including the SOH material, may include an organic compound having a relatively high carbon content of about 85 to 99 wt % based on its gross weight. The organic compound may include a hydrocarbon compound including an aromatic ring, such as phenyl, benzene, or naphthalene, and its derivative.

The anti-reflective coating film 216 may be an inorganic anti-reflective coating film, an organic anti-reflective coating film, or a combination thereof.

The photomask PM may include a transparent substrate 142 and a plurality of light-shielding patterns 144 formed on the transparent substrate 142. The transparent substrate 142 may include quartz. The plurality of light-shielding patterns 144 may include Cr. The plurality of light-shielding patterns 144 may be line patterns arranged parallel to each other. Alternatively, the photomask PM may be a reflective type photomask (e.g., to use with extreme ultraviolet radiation) and include a plurality of light-absorbing patterns (in place of the light-shielding patterns 144) and a reflective layer on a substrate (e.g., in place of transparent substrate 142).

The exposing operation may be performed using irradiation rays having various exposure wavelengths. For example, the exposing operation may be performed using i-line (365 nm), 248 nm, 193 nm, EUV 13.5 nm, and 157 nm wavelengths. In some embodiments, when an exposure wavelength of 193 nm is used, an immersion lithography operation may be used. When an immersion lithography operation is used, a topcoat layer (not illustrated) covering the photoresist film may be further formed before the exposing operation, so as to prevent a direct contact between an immersion solution and the photoresist film 130 and a leakage of components of the photoresist film 130 into the immersion solution. In some embodiments, the topcoat layer may be omitted by including a fluorine-containing additive in the photoresist film 120 even when an immersion lithography operation is used.

The dose D1 may be set according to a width WM of the main exposed region 120M which is to be formed in the photoresist film 120 through the exposing operation. As the width WM of the main exposed region 120M becomes smaller, a set value for the dose D1 decreases. Also, as the width WM of the main exposed region 120M becomes larger, the set value for the dose D1 increases.

Figure 9A:
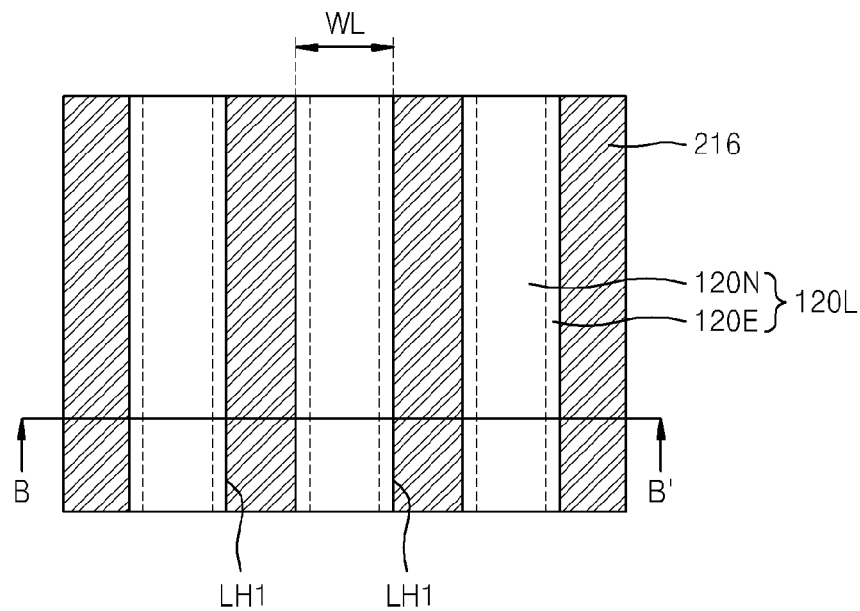
Figure 9B:
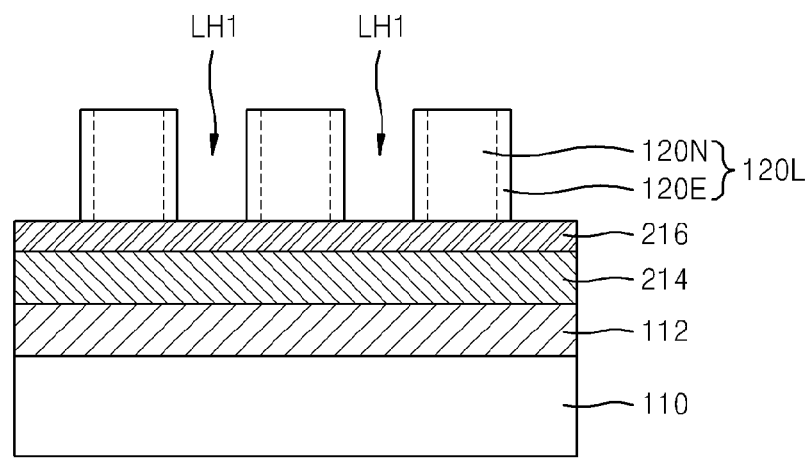

Referring to FIGS. 9A and 9B, the main exposed region 120M is removed by developing the photoresist film 120 by using the first developer. As a result, a photoresist pattern 120L may be formed to have a first opening LH1 with inner sidewalls exposing the exposed edge region 120E.

Each of the photoresist pattern 120L and the first opening LH1 may have a line shape. In this example, the photoresist pattern 120L and the first opening LH1 have been described as having a straight-line plane structure such that the photoresist pattern 120L and the first opening LH1 have a constant width (WL) in a length direction. However, the inventive concept is not limited thereto. For example, each of the photoresist pattern 120L and the first opening LH1 may have various shapes, such as a curved shape or a zigzag shape, and may have a variable width in a length direction.

The first developer may include a positive tone developer as described above with reference to operation 30C of FIG. 3 and FIG. 4C.

After the photoresist pattern 120L is formed, the anti-reflective coating layer 216 may be exposed through the first opening LH1.

Figure 10A:
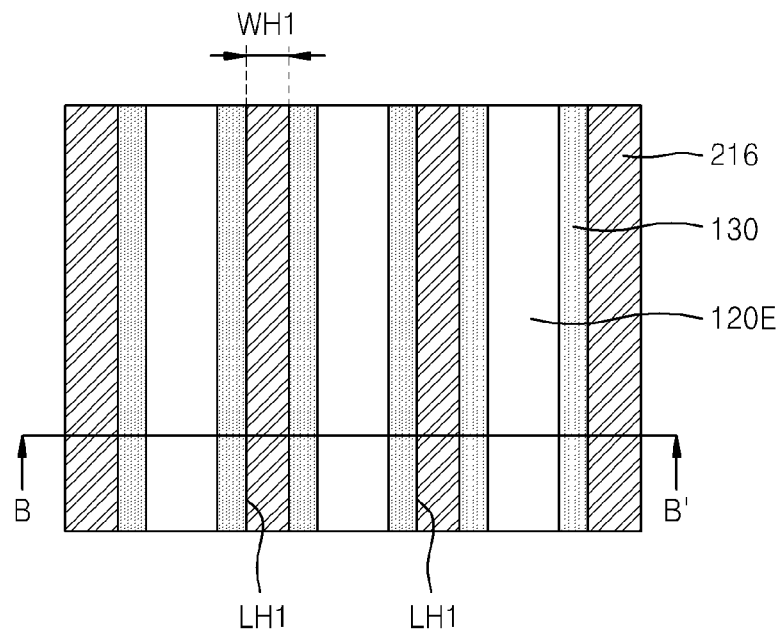
Figure 10B:
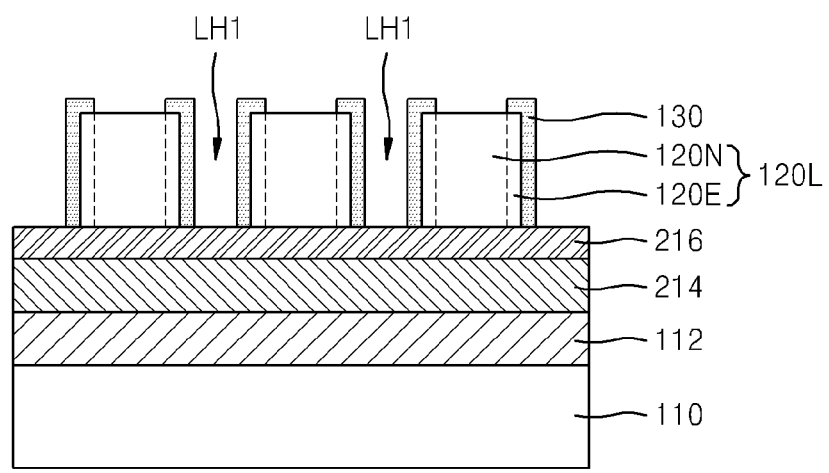

Referring to FIGS. 10A and 10B, in a similar manner to that described above with reference to operation 30D of FIG. 3 and FIG. 4D, a capping layer 130 is formed to cover the inner sidewalls of the first opening LH1 exposing the exposed edge region 120E.

Since the capping layer 130 is formed, an exposed width WH1 of the first opening LH1 is reduced.

Figure 11A:
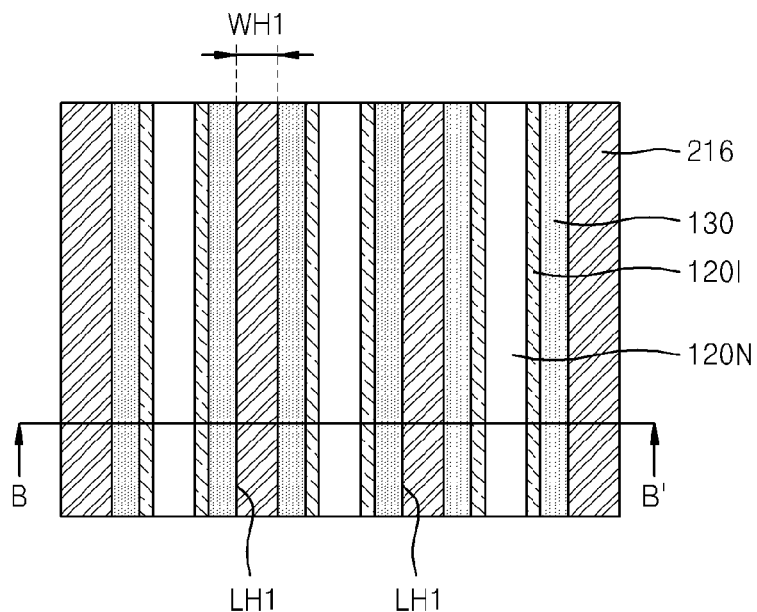
Figure 11B:
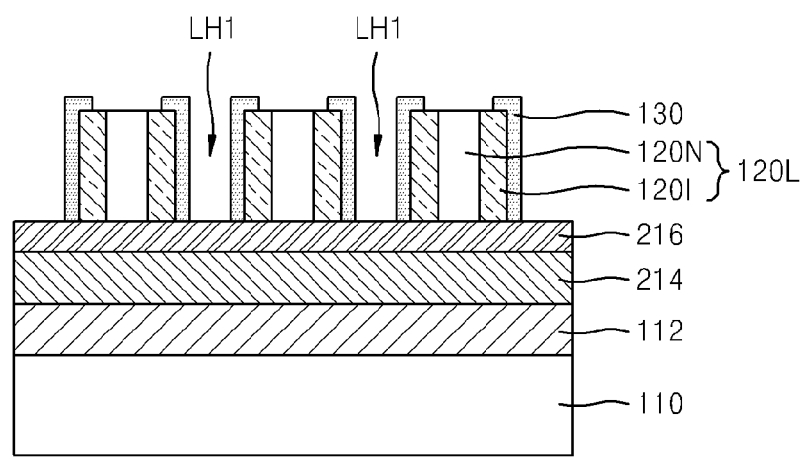

Referring to FIGS. 11A and 11B, in a similar manner to that described above with reference to operation 30E of FIG. 3 and FIG. 4E, an insoluble region 120I, which is insoluble to the second developer, is formed around the first opening LH1 in the photoresist pattern 120L by diffusing acid from the exposed edge region 120E of the photoresist pattern 120L to the inside of the non-exposed region 120N.

Figure 12A:
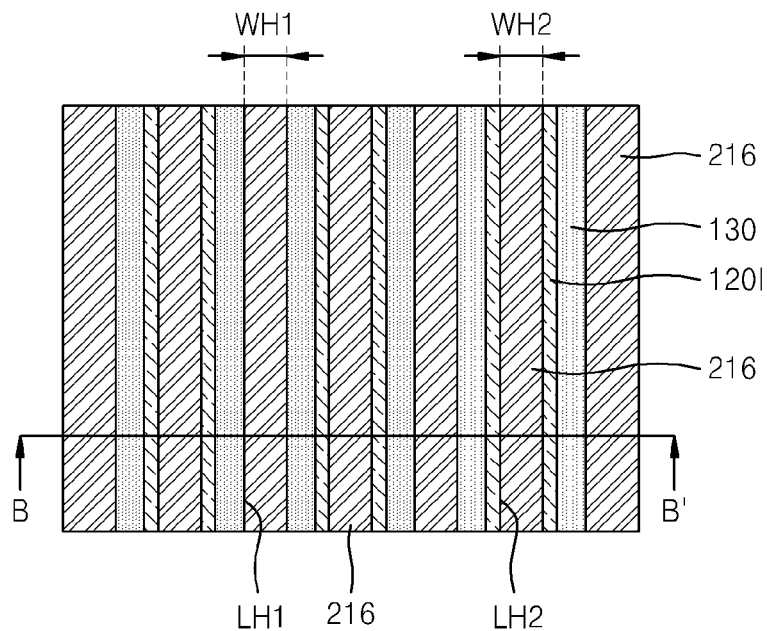
Figure 12B:
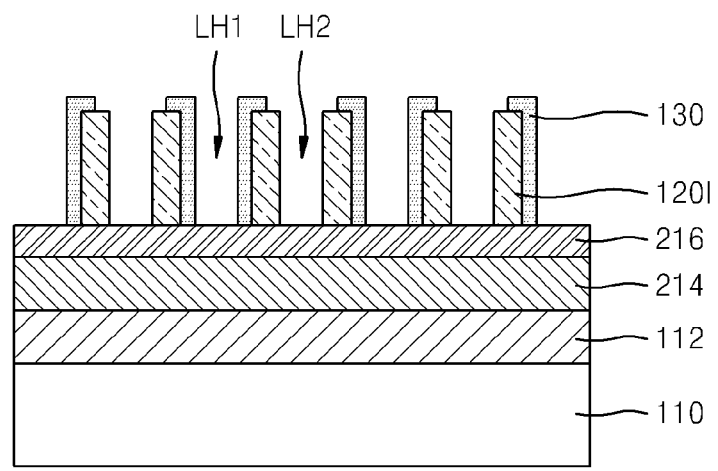

Referring to FIGS. 12A and 12B, in a similar manner to that described above with reference to operation 30F of FIG. 3 and FIG. 4F, a second opening LH2 spaced apart from the first opening LH1 is formed by removing at least a portion of the non-exposed region 120N but not the insoluble region 120I from the photoresist pattern 120L by using the second developer including a negative tone developer.

In some embodiments, a width WH2 of the second opening LH2 may be equal to the width WH1 of the first opening LH1. In some embodiments, the width WH2 of the second opening LH2 may be different from the width WH1 of the first opening LH1.

Figure 13A:
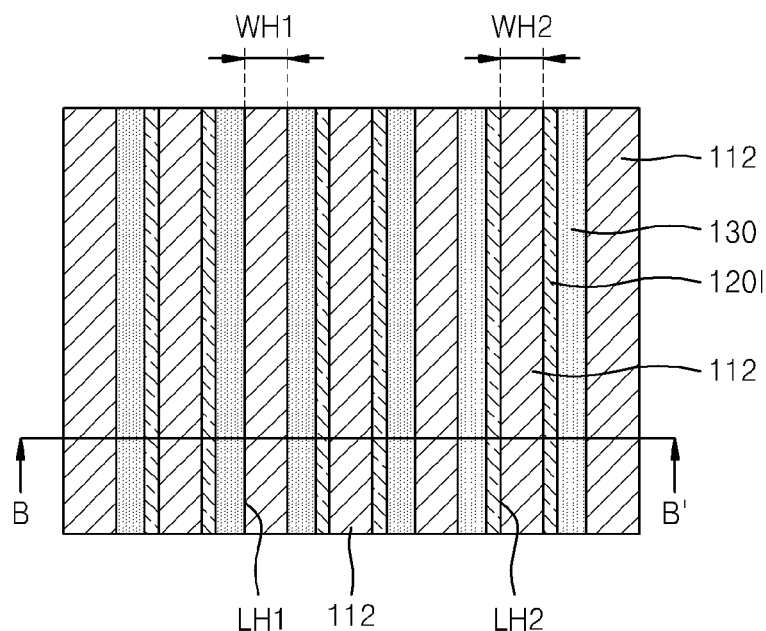
Figure 13B:
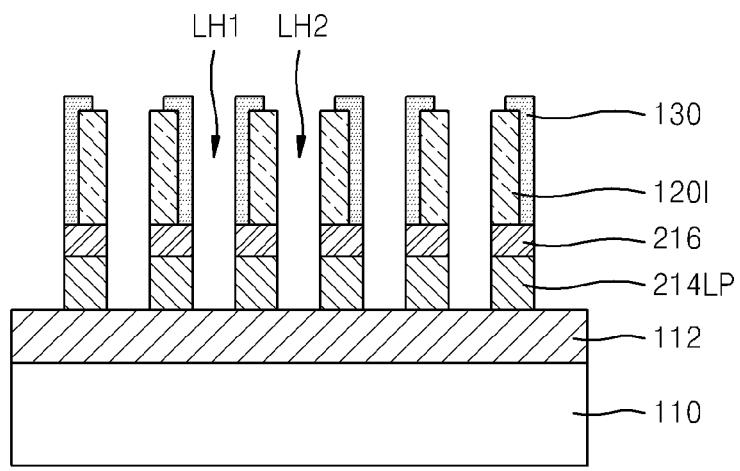

Referring to FIGS. 13A and 13B, in a similar manner to that described above with reference to operation 30G of FIG. 3 and FIG. 4G, a hard mask pattern 214LP is formed by etching the anti-reflective coating film 216 and the hard mask layer 214 by using the insoluble region 120I and the capping layer 130 as an etch mask. In FIGS. 13A and 13B, the anti-reflective coating film 216 and the hard mask layer 214 may be considered to correspond to the target layer 112 of FIG. 3 and FIG. 4G.

Figure 14A:
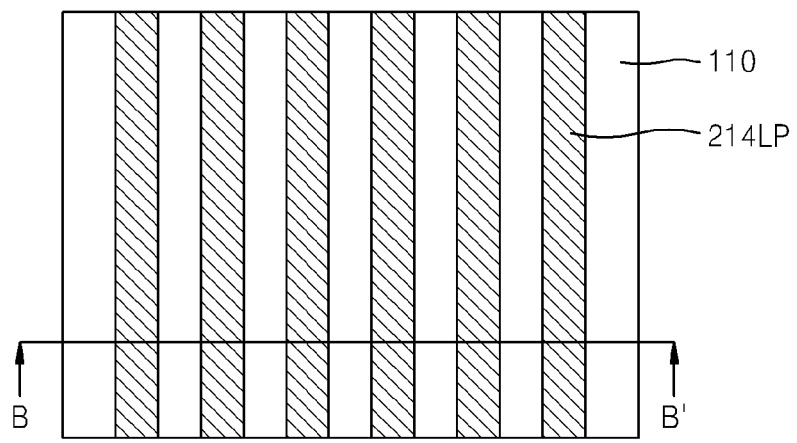
Figure 14B:
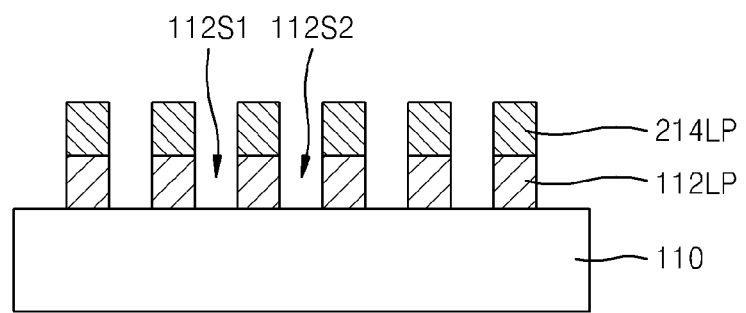

Referring to FIGS. 14A and 14B, after unnecessary films on the hard mask pattern 214LP (see FIGS. 13A and 13B) are removed, the target layer 112 is etched using the hard mask pattern 214LP as an etch mask to form a fine line pattern 112LP defining a plurality of spaces 112S1 and 112S2 that are spaced apart from one another.

If desired, the hard mask pattern 214LP remaining on the line pattern 112LP may be removed, and a desired device forming operation may be performed.

As a modification of the method of forming patterns described above with reference to FIGS. 8A to 14B, patterns may be formed using an operation similar to those described above with reference to FIGS. 6A and 6B.

For example, the capping layer 130 may be removed from the resulting structure shown in FIGS. 12A and 12B after the insoluble regions 120I are formed, and a hard mask pattern having a smaller width than the hard mask pattern 214LP (e.g., a smaller width than the hard mask pattern 214LP shown in FIGS. 13A and 13B) is formed by etching the anti-reflective coating film 216 and the hard mask layer 214 by using only the insoluble region 120I as an etch mask. That is, only the insoluble region 120I (i.e., not the capping layer 130) is used to etch the anti-reflective coating film 216 and the hard mask layer 214 to obtain the hard mask pattern 214LP. Then, a plurality of line patterns having a smaller width than the plurality of line patterns 112LP (see FIG. 14) may be formed by etching the target layer 112 by using the hard mask pattern as an etch mask.

As another modification to the method of forming patterns described above with reference to FIGS. 8A to 14B, patterns may be formed using an operation similar to those described above with reference to FIGS. 7A to 7D.

For example, after the insoluble regions 120I are formed as described above with reference to FIGS. 12A and 12B, an additional capping layer similar to the additional capping layer 162 described above with reference to FIGS. 7A to 7C is formed on the insoluble regions 120I. The additional capping layer 162 may be formed in the same manner with the same materials as described with respect to FIGS. 7A to 7C. A hard mask pattern having a larger width than the hard mask pattern 214LP (see FIG. 13B) is therefore formed by etching the anti-reflective coating film 216 and the hard mask layer 214 by using the insoluble regions 120I, the capping layer 130, and the additional capping layer 162 as an etch mask. Then, a plurality of line patterns having a larger width than the plurality of line patterns 112LP (see FIG. 14B) may be formed by etching the target layer 112 by using the hard mask pattern as an etch mask.

Figure 15A:
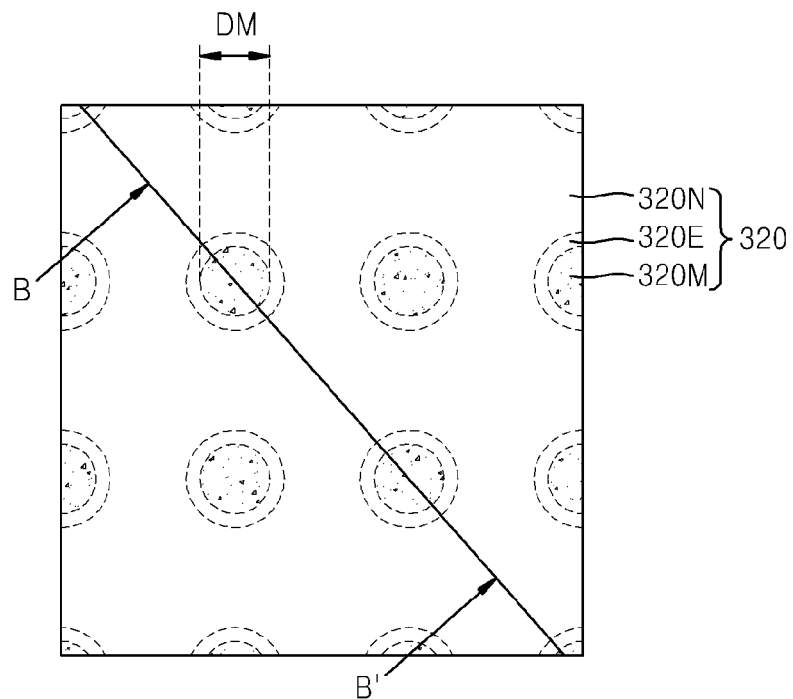
Figure 15B:
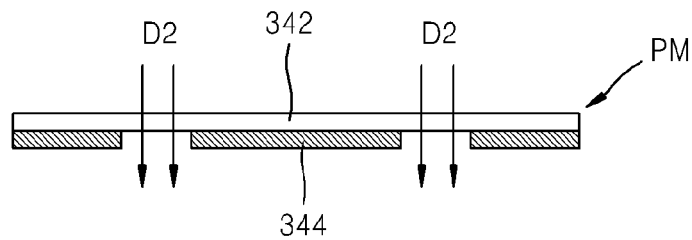
Figure 15B:
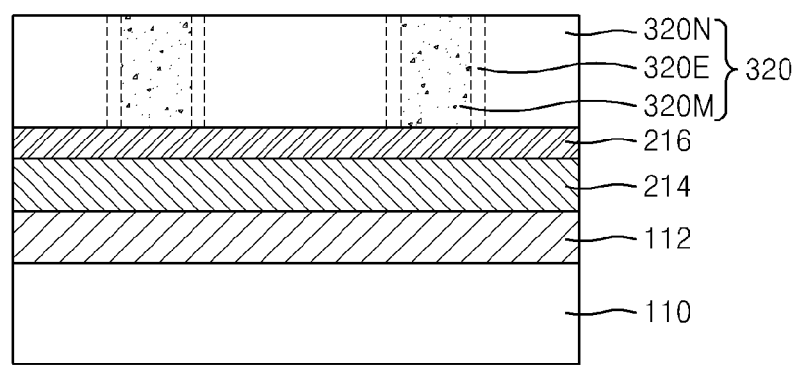
Figure 16A:
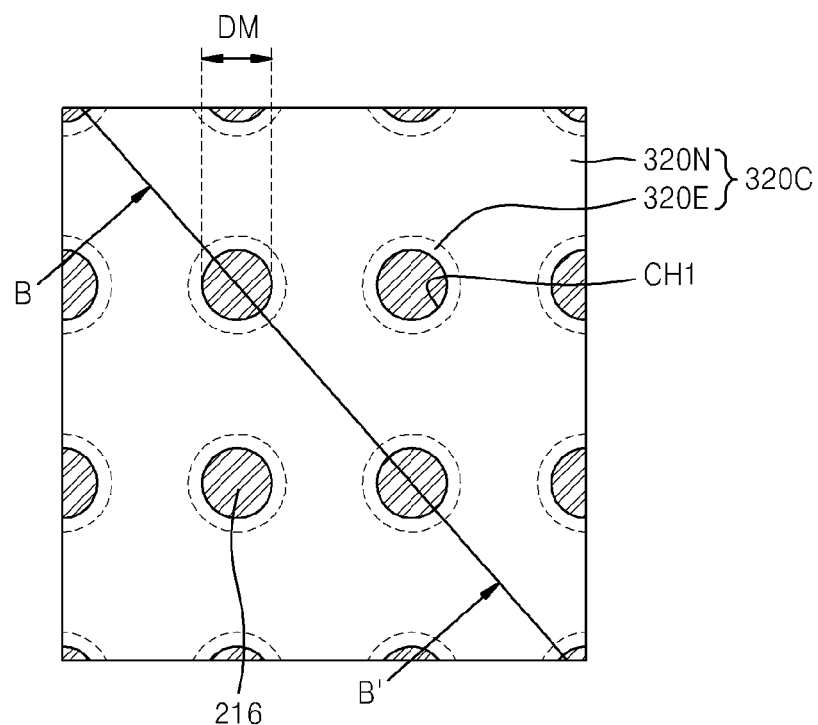
Figure 16B:
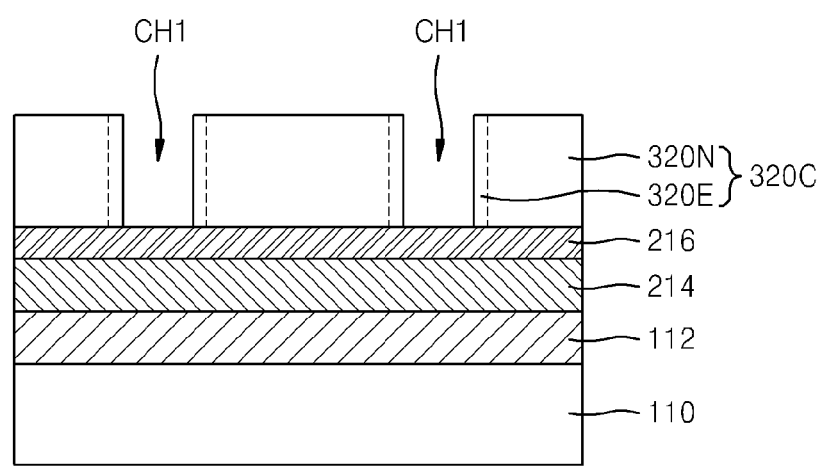

FIGS. 15A to 21B are diagrams for explaining a method of forming a plurality of hole patterns by using a method of forming patterns, according to another embodiment of the inventive concept, wherein FIGS. 15A, 16A, . . . , 21A are plan views illustrating the method of forming patterns, and FIGS. 15B, 16B, . . . , 21B are cross-sectional views taken along lines B-B' of FIGS. 15A, 16A, . . . , 21A, respectively. Regarding FIGS. 15A to 21B, like reference numerals as in FIGS. 4A to 14B denote the same elements, and accordingly, a detailed description thereof is not presented herein for ease of description. It will be noted that the embodiment of FIGS. 15A to 21B first creates a hard mask pattern (by using a photoresist pattern) to etch target layer 112. However, use of a hard mask pattern is optional and the embodiment described with respect to FIGS. 15A to 15B (as well as its alternatives) may directly etch the target layer 112 of FIGS. 15A to 15B using the photoresist pattern (with our without the additional capping layer) without use of the hard mask pattern.

Referring to FIGS. 15A and 15B, a target layer 112 and a hard mask layer 214 are sequentially formed on a substrate 110. An anti-reflective coating film 216 and a photoresist film 320 are sequentially formed on the hard mask layer 214.

The photoresist film 320 is similar to the photoresist film 120 described above with reference to operation 30A of FIG. 3 and FIG. 4A.

The photoresist film 320 is exposed to a predetermined dose D2 by using a photomask PM having a plurality of light-shielding areas and a plurality of light-transmitting areas to form a main exposed region 320M having a polarity change that is enough to be removed by a positive tone developer, a non-exposed region 320N having no polarity change, and an exposed edge region 320E disposed between the main exposed region 320M and the non-exposed region 320N and having a polarity change gradually decreasing from the main exposed region 320M to the non-exposed region 320N as it comes closer from the main exposed region 320M to the non-exposed region 320N.

The main exposed region 320M, the non-exposed region 320N, and the exposed edge region 320E are substantially similar to the main exposed region MR, the non-exposed region NR, and the exposed edge region ER described above with reference to FIG. 4B, respectively.

The photomask PM includes a transparent substrate 342 and a plurality of light-shielding patterns 344 formed on the transparent substrate 342. The transparent substrate 342 may include quartz. The plurality of light-shielding patterns 344 may include chromium (Cr). In the plurality of light-shielding patterns 344, a plurality of holes may be formed to define the light-transmitting areas of the photomask PM. The photomask may instead be a reflective photomask as described elsewhere herein.

More details of the exposing operation using the photomask PM are substantially similar to those described above with reference to FIGS. 8A and 8B. The dose D2 may be set according to a diameter DM of the main exposed region 320M to be formed in the photoresist film 320 through the exposing operation. As the diameter DM of the main exposed region 320M to be formed becomes smaller, the set value of the dose D2 may decrease. As the diameter DM of the main exposed region 320M becomes larger, the set value of the dose D2 may increase.

Referring to FIGS. 16A and 16B, the main exposed region 320M is removed by developing the photoresist film 320 by using a first developer including a positive tone developer. As a result, a photoresist pattern 320C may be formed to have a plurality of first openings CH1 with inner sidewalls exposing the exposed edge region 320. The plurality of first openings CH1 may have a hole shape passing through the photoresist pattern 320C.

In the above example, the plurality of first openings CH1 have been described as having a circular planar structure, but the inventive concept is not limited thereto. For example, the plurality of first openings CH1 may have various geometric structures, such as an oval shape, a polygonal shape, square shape or rectangular shape (although significant rounding of the corners may be expected), and a regular or irregular closed-curve shape. The plurality of first openings CH1 may have different shapes within the same photoresist pattern 320C.

After the photoresist pattern 320C is formed, the anti-reflective coating film 216 may be exposed through the plurality of first openings CH1.

Figure 17A:
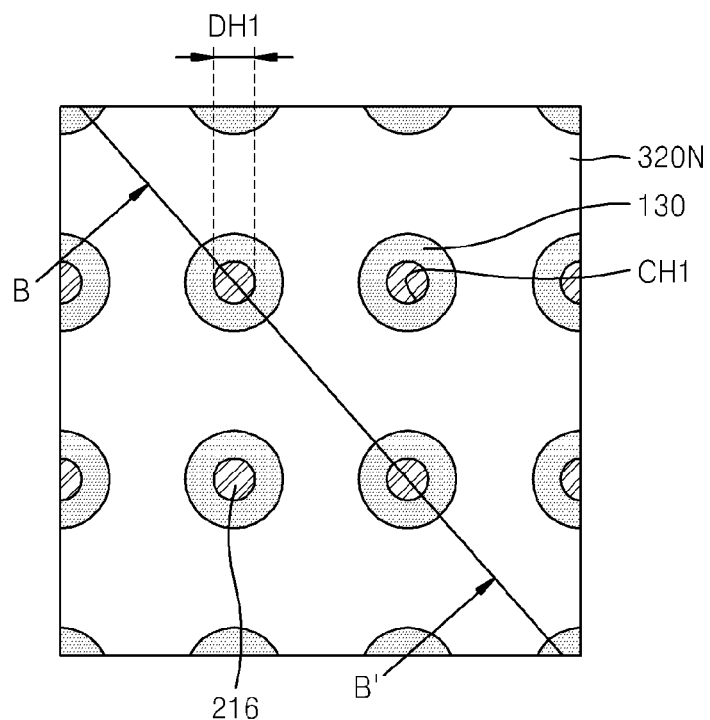
Figure 17B:
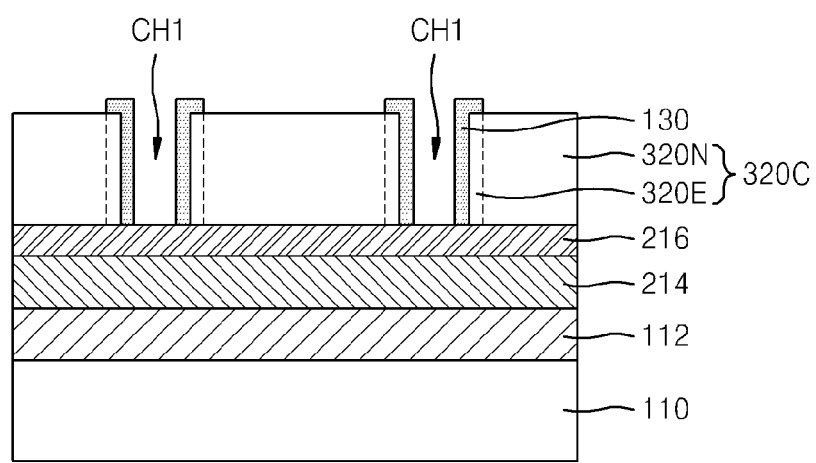

Referring to FIGS. 17A and 17B, in a similar manner to that described above with reference to operation 30D of FIG. 3 and FIG. 4D, a capping layer 130 is formed to cover the inner sidewalls of the plurality of first openings CH1 exposing the exposed edge region 320E.

Due to the formation of the capping layer 130, the diameter DH1 exposing each of the first openings CH1 is reduced.

Figure 18A:
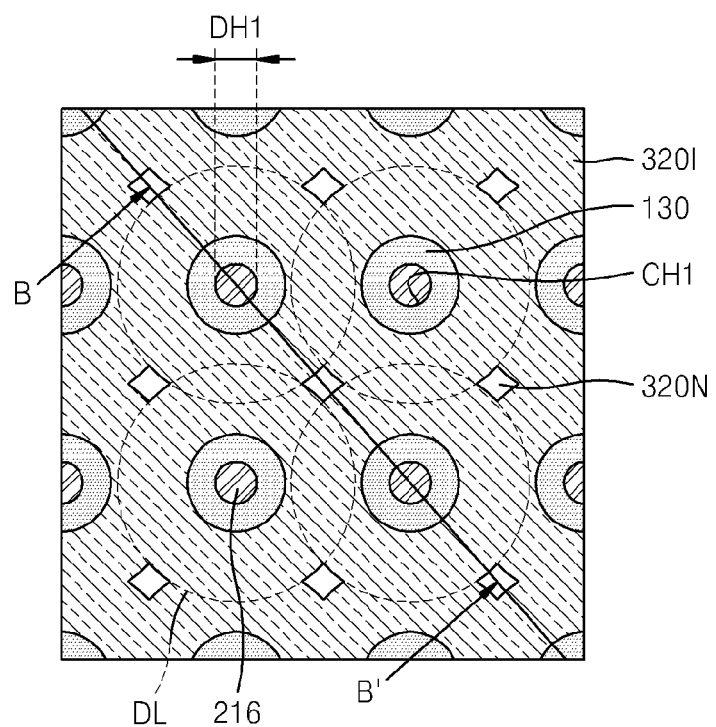
Figure 18B:
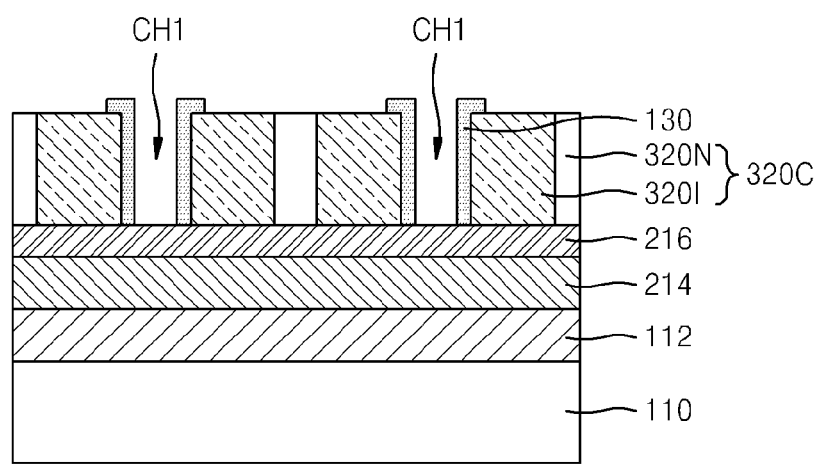

Referring to FIGS. 18A and 18B, in a similar manner to that described above with reference to operation 30E of FIG. 3 and FIG. 4E, insoluble regions 320I that are insoluble to the second developer are formed around the plurality of first openings CH1 in the photoresist pattern 320C by diffusing acid from the exposed edge region 320E of the photoresist pattern 320C (see FIG. 17B) to the non-exposed region 320N.

From a top down perspective, as indicated by a dashed line DL of FIG. 18A, the insoluble regions 320I formed around the plurality of first openings CH1 may be mutually connected annular regions.

Figure 19A:
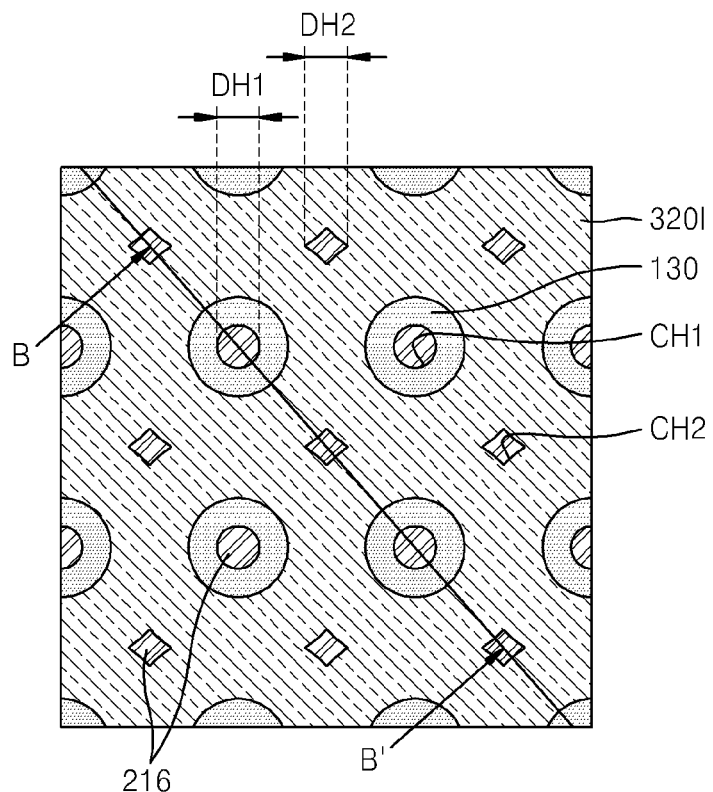
Figure 19B:
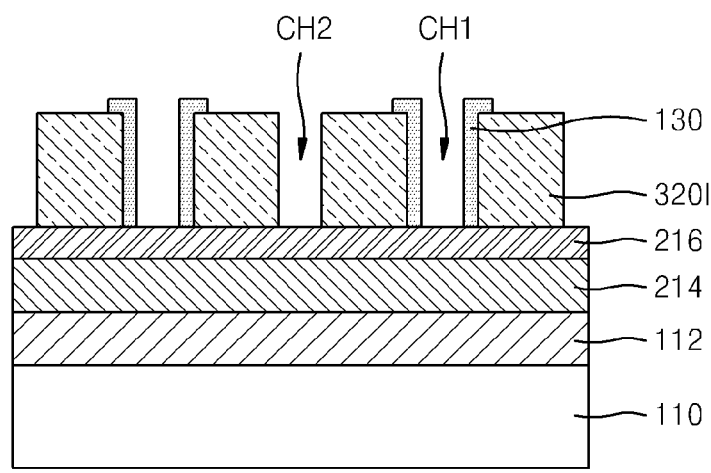

Referring to FIGS. 19A and 19B, in a manner that may be same as that described above with reference to operation 30F of FIG. 3 and FIG. 4F, a plurality of second openings CH2 that are spaced apart from the plurality of first openings CH1 are formed by removing at least a region of the non-exposed region 320N but not the insoluble regions 320I from the photoresist pattern 320C by using the second developer including the negative tone developer.

In some embodiments, a diameter DH2 of each of the second openings CH2 may be equal to the diameter DH1 of each of the first openings CH1. In some embodiments, the diameter DH2 of each of the second openings CH2 may be different from the diameter DH1 of each of the first openings CH1.

Figure 20A:
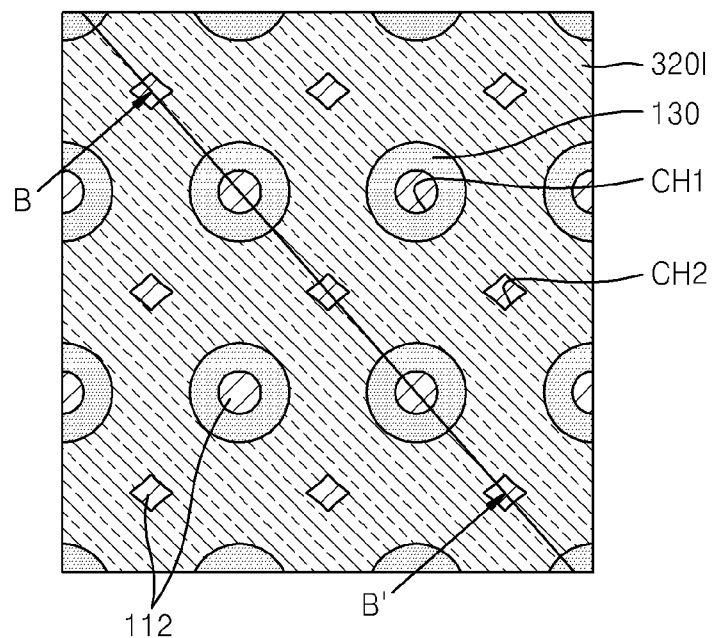
Figure 20B:
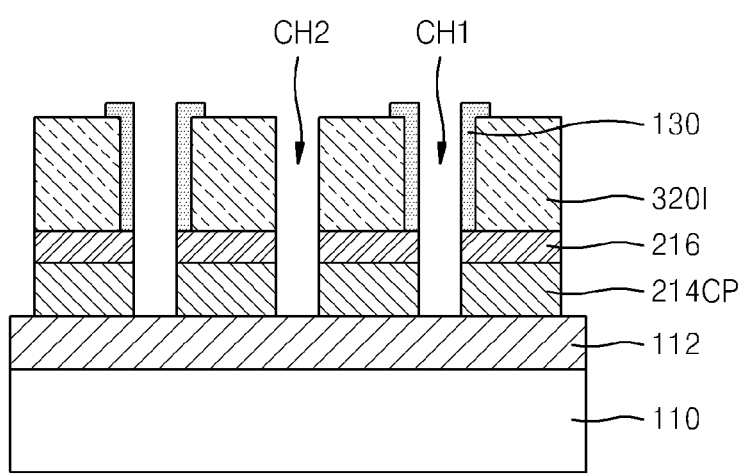

Referring to FIGS. 20A and 20B, in a manner that may be the same as that described above with reference to operation 30G of FIG. 3 and FIG. 4G, a hard mask pattern 214CP is formed by etching the anti-reflective coating film 216 and the hard mask layer 214 by using the insoluble regions 310I and the capping layer 130 as an etch mask.

Figure 21A:
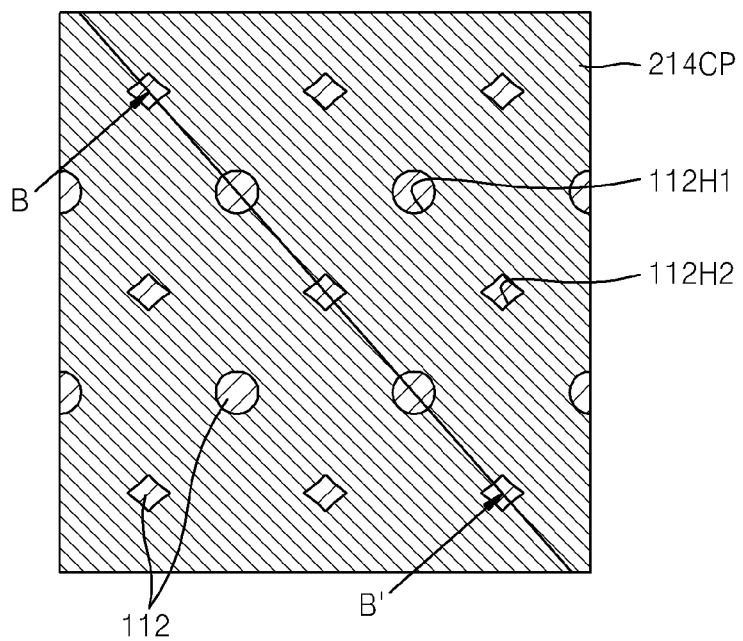
Figure 21B:
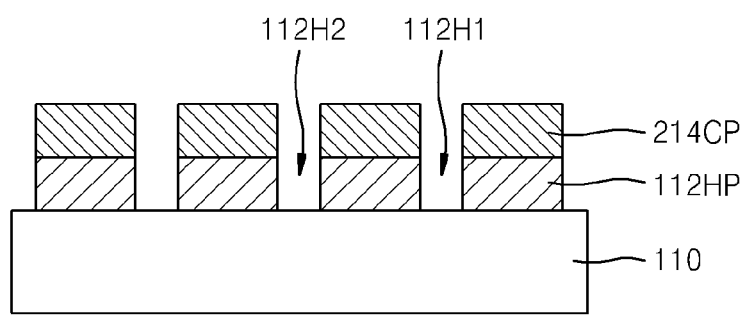

Referring to FIGS. 21A and 21B, after unnecessary films on the hard mask pattern 214CP are removed, the target layer 112 is etched using the hard mask pattern 214CP as an etch mask, thereby forming a fine pattern 112HP with a plurality of first holes 112H1 and a plurality of second holes 112H2 that are spaced apart from each other.

If necessary, the hard mask pattern 214CP remaining on the fine pattern 112HP may be removed, and a desired device forming operation may be performed.

As a modification of the method of forming patterns described above with reference to FIGS. 15A to 21B, patterns may be formed using an operation similar to those described above with reference to FIGS. 6A and 6B.

For example, as described above with reference to FIGS. 18A and 18B, the capping layer 130 shown in FIGS. 18A and 18B my be removed after the insoluble regions 320I are formed, and the target layer 112 is etched using a hard mask pattern as an etch mask after the anti-reflective coating film 216 and the hard mask layer 214 are etched using the insoluble regions 320I as an etch mask (e.g., without the capping layer 130) in a similar manner to the operation described above with reference to FIGS. 20A and 20B. In this manner, it is possible to implement a fine pattern with holes having a diameter that is larger than that of the first hole 112H1 illustrated in FIGS. 21A and 21B.

As another modification of the method of forming patterns, which has been described above with reference to FIGS. 15A to 21B, patterns may be formed using an operation similar to those described above with reference to FIGS. 7A to 7D.

For example, as described above with reference to FIGS. 18A and 18B, after the insoluble regions 320I are formed, an additional capping layer similar to the additional capping layer 162 described above with reference to FIGS. 7A to 7C is formed on the insoluble regions 320I. A hard mask pattern is formed by etching the anti-reflective coating film 216 and the hard mask layer 214 by using the insoluble regions 320I, the capping layer 130, and the additional capping layer as an etch mask. The target layer 112 is etched using the hard mask pattern as an etch mask, thereby forming a fine pattern with holes having a diameter that is smaller than the second hole 112H2 illustrated in FIGS. 21A and 21B.

In the embodiment of FIGS. 15A and 21B, the plurality of first openings CH1 (see FIGS. 16A and 16B) and the plurality of first holes 112H1 formed corresponding thereto (see FIGS. 21A and 21B), and the plurality of second openings CH2 (see FIGS. 19A and 19B) and the plurality of second holes 112H2 formed corresponding thereto (see FIGS. 21A and 21B) are arranged in a matrix form. However, the inventive concept is not limited thereto.

FIGS. 22A to 22D are plan views for explaining a method of forming a plurality of hole patterns by using a method of forming patterns, according to another embodiment of the inventive concept. Regarding FIGS. 22A to 22D, like reference numerals as in FIGS. 4A to 21B denote the same elements, and accordingly, a detailed description thereof is not presented herein for ease of description.

In this example, unlike the embodiments of FIGS. 15A to 21B, the plurality of first openings CH1 (see FIGS. 16A and 16B) and the plurality of first holes 112H1 formed corresponding thereto (see FIGS. 21A and 21B) are arranged to have a honeycomb structure, and the plurality of second openings CH2 (see FIGS. 19A and 19B) and the plurality of second holes 112H2 formed corresponding thereto (see FIGS. 21A and 21B) are also arranged to have a honeycomb structure. As a result, the combination of the plurality of first holes 112H1 and the plurality of second holes 112H2 obtained by etching the target layer 112 have a matrix arrangement. This case will be described below.

Figure 22A:
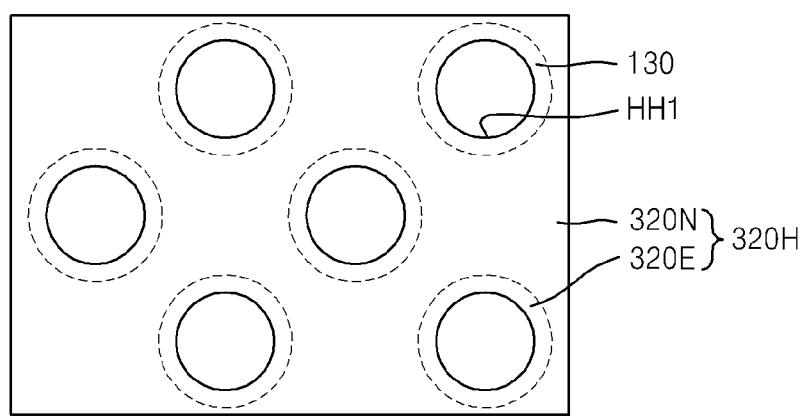
FIGS. 22A to 22D are plan views illustrating a method of forming a plurality of hole patterns, according to another embodiment of the inventive concept.

Referring to FIG. 22A, in a similar manner to the operation described above with reference to FIGS. 15A to 16B, after an exposing operation is performed on the photoresist film 320 on the to-be-etched film (not illustrated), a positive tone developing operation is performed to remove the main exposed region 320M of the photoresist film 320, thereby forming a photoresist pattern 320H defining a plurality of first openings HH1 arranged to have a honeycomb structure. For example, the plurality of first openings HH1 may be arranged in rows so that openings in a first row are offset from openings in immediately neighbouring rows to the first row. The plurality of openings may be regularly formed throughout a rectangular area defined by borders that are parallel to the row direction on two opposite sides of the rectangular area and perpendicular to the row direction on two other opposite sides of the rectangular area.

The photoresist pattern 320H includes an exposed edge region 320E and a non-exposed region 320N formed during the exposing operation.

Figure 22B:
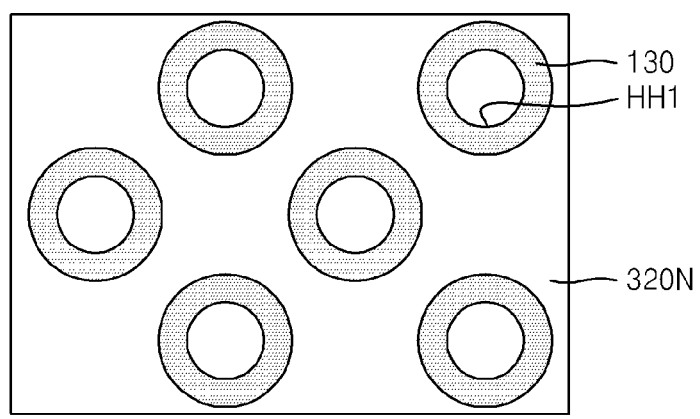

Referring to FIG. 22B, in a manner that may be the same as the method described above with reference to FIGS. 17A and 17B, a capping layer 130 is formed to cover inner sidewalls of the plurality of first openings HH1 exposing the exposed edge region 320E.

Figure 22C:
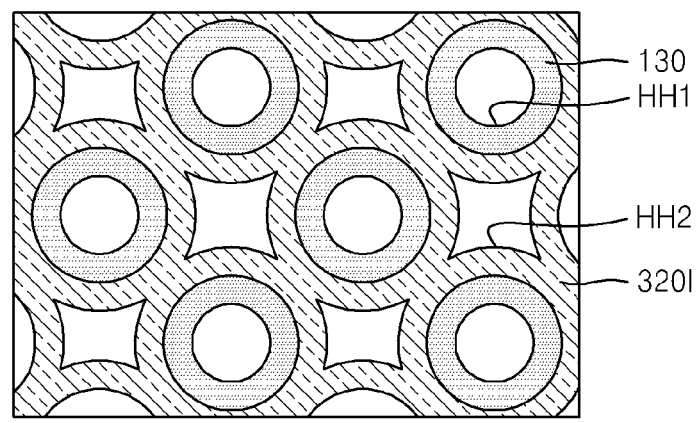

Referring to FIG. 22C, in a manner that may be the same as the method described above with reference to FIGS. 18A and 18B, an insoluble region 320I is formed around the plurality of first openings HH1, and regions of the non-exposed region 320N, except for the insoluble region 320I, are removed to form a plurality of second openings HH2.

The insoluble region 320I may be formed around the plurality of first openings HH1 within a plurality of annular regions that are formed to cover the plurality of first openings HH1 and are mutually connected in one body. The plurality of second openings HH2 may be formed in a region that is covered by four first openings HH1 adjacent to one another.

Figure 22D:
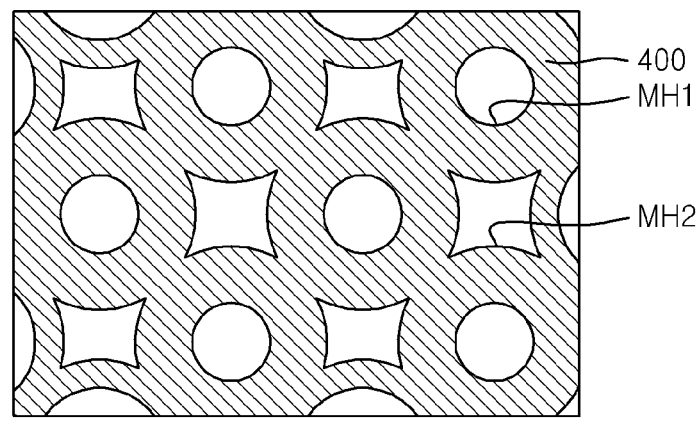

Referring to FIG. 22D, the to-be-etched film (or target layer) is etched using the capping layer 130 and the insoluble region 320I of FIG. 22C as an etch mask, thereby forming a fine pattern 400 having a plurality of first holes MH1 and a plurality of second holes MH2 arranged in a matrix form.

The plurality of first holes MH1 may be formed by transferring the plurality of first openings HH1, and the plurality of second holes MH2 may be formed by transferring the plurality of second openings HH2. The combination of the first holes MH1 and the second holes MH2 may be arranged in rows where holes of a first row are aligned with holes of rows immediately adjacent the first row. The plurality of the first holes MH1 and the second holes MH2 may be regularly formed throughout a rectangular area defined by borders that are parallel to the row direction on two opposite sides of the rectangular area and perpendicular to the row direction on two other opposite sides of the rectangular area.

A fine pattern including a plurality of holes arranged in various forms may be formed from the embodiments described above with reference to FIGS. 15A to 22D, without departing from the scope of the inventive concept.

Figure 23:
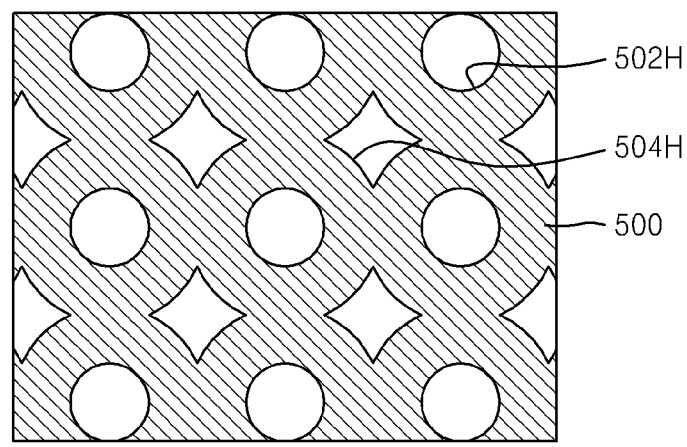
FIG. 23 is a plan view illustrating a fine pattern formed using a method of forming patterns according to another embodiment of the inventive concept.

FIG. 23 is a plan view of a fine pattern 500 formed using a method of forming patterns, according to another embodiment of the inventive concept.

Referring to FIG. 23, the fine pattern 500 includes a plurality of first holes 502H and a plurality of second holes 504H.

The plurality of first holes 502H may be obtained through an operation such as the operation of forming the plurality of first openings CH1 (see FIGS. 16A and 16B) according to the embodiments illustrated in FIGS. 15A to 21B. The plurality of second holes 504H may be obtained through an operation such as the operation of forming the plurality of second openings CH2 (see FIGS. 19A and 19B) according to the embodiments illustrated in FIGS. 15A to 21B. However, in this example, as illustrated in FIG. 23, the arrangement of the plurality of first openings CH1 and the plurality of second openings CH2 may be modified so that the plurality of first holes 502H and the plurality of second holes 504H are mutually combined and arranged to have a honeycomb structure. For example, the plurality of first openings CH1 may be arranged in rows and offset from the plurality of second openings CH2 (e.g., second openings CH2 in immediately neighbouring rows to the first row). The plurality of first and second openings CH1 and CH2 may be regularly formed throughout a rectangular area defined by borders that are parallel to the row direction on two opposite sides of the rectangular area and perpendicular to the row direction on two other opposite sides of the rectangular area.

Figure 24A:
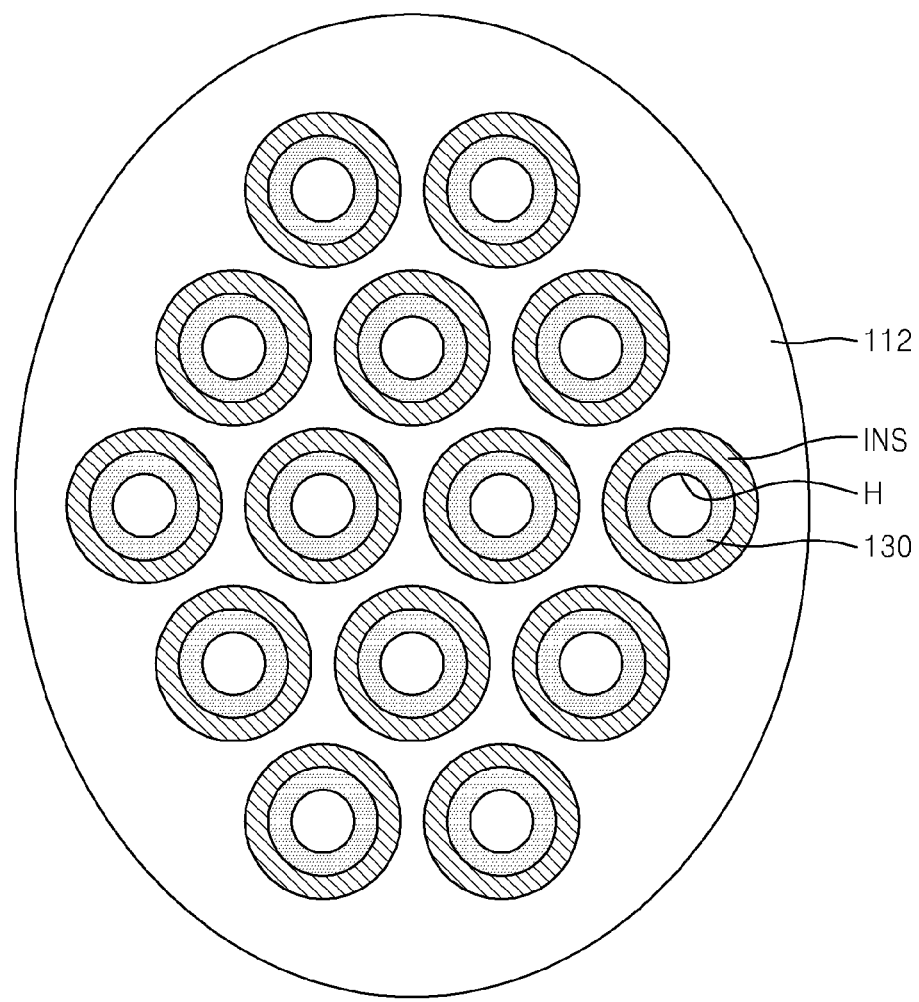
FIGS. 24A to 24C are plan views illustrating a method of forming a plurality of hole patterns, according to another embodiment of the inventive concept.
Figure 24B:
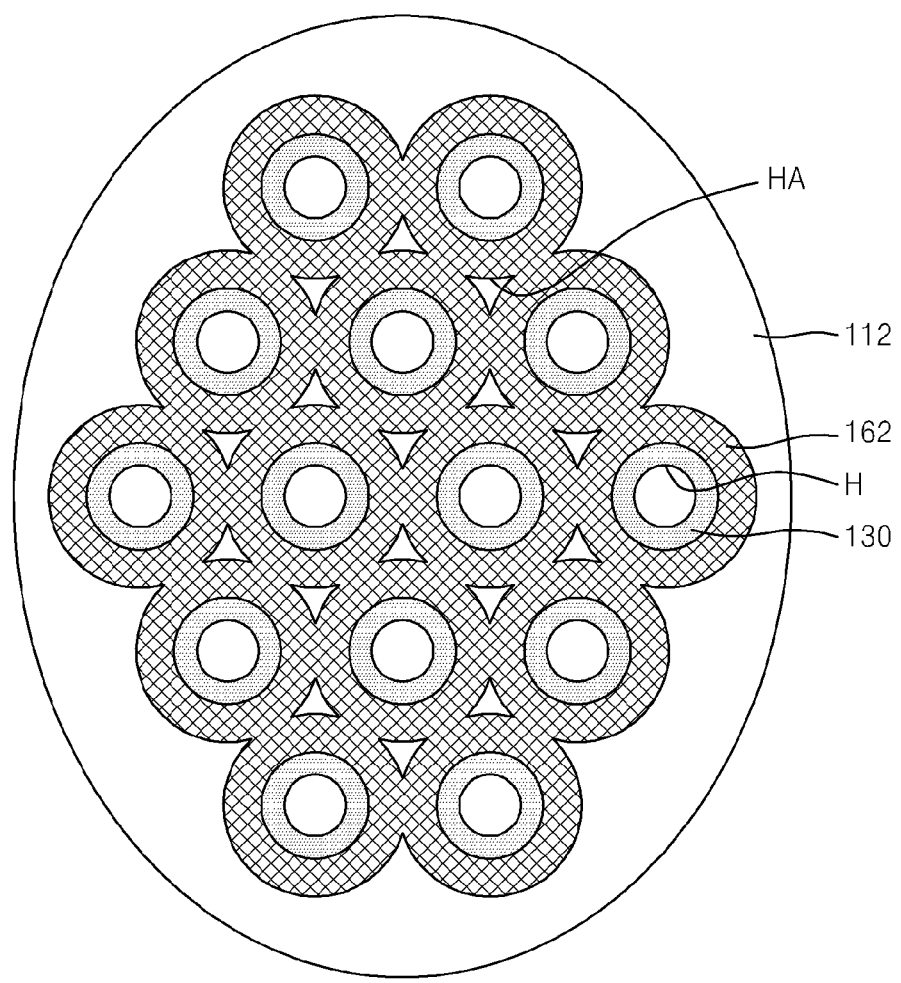
Figure 24C:
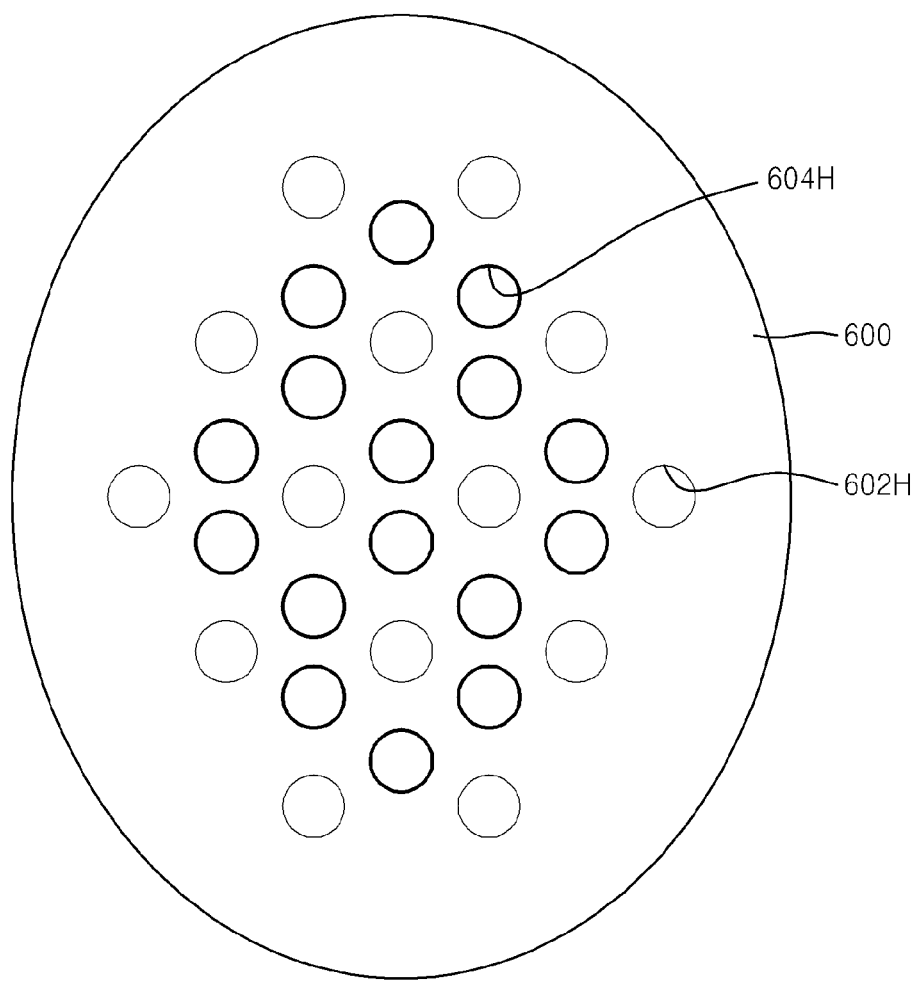

FIGS. 24A to 24C are plan views for explaining a method of forming a plurality of hole patterns by using a method of forming patterns, according to another embodiment of the inventive concept. Regarding FIGS. 24A to 24C, like reference numerals as in FIGS. 4A to 21B denote the same elements, and accordingly, a detailed description thereof is not presented herein for ease of description.

Referring to FIG. 24A, a series of operations as described above with reference to FIGS. 4A to 4F are performed to form insoluble regions INS of a photoresist pattern and a capping layer 130 defining openings H on a target layer 112 in a similar manner to that illustrated in FIG. 4F.

FIG. 24A illustrates a case where the insoluble regions INS are formed within a plurality of annular regions that are spaced apart from each other so that each of the insoluble regions INS is formed to have a doughnut shape. In order to form the plurality of insoluble regions INS each having a doughnut or annular shape, a diffusion distance of acid during a thermal treatment may be controlled by adjusting at least one of a thermal treatment temperature and a thermal treatment time during an acid diffusion operation.

Referring to FIG. 24B, in a similar manner to the method described above with reference to FIGS. 7A to 7C, an additional capping layer 162 covering the insoluble regions INS is formed to define self-aligned openings HA in a region surrounded by three adjacent holes H.

When viewed from a plane view (or top down view), the additional capping layer 162 is formed as a plurality of annular regions that are mutually connected in one body as illustrated in FIG. 18A, but the inventive concept is not limited thereto.

The target layer 112 may be exposed through the plurality of openings H and a plurality of self-aligned openings HA.

Referring to FIG. 24C, in a similar manner to that described above with reference to FIG. 7D, the target layer 112 may be etched using the insoluble regions INS illustrated in FIG. 24A and the capping layer 130 and the additional capping layer illustrated in FIG. 24B as an etch mask, thereby forming a fine pattern 600 with a plurality of first holes 602H and a plurality of second holes 604H that are spaced apart from each other.

The plurality of first holes 602H are obtained by etching the target layer 112 through the plurality of openings H. The plurality of second holes 604H are obtained by etching the target layer 112 through the plurality of self-aligned openings HA. In FIG. 24C, the plurality of holes 602H and the plurality of second holes 604H are illustrated as circular, but the inventive concept is not limited thereto. For example, holes having various shapes may be obtained according to operation conditions during the etching operation for forming the plurality of first holes 602H and the plurality of second holes 604H.

Figure 25:
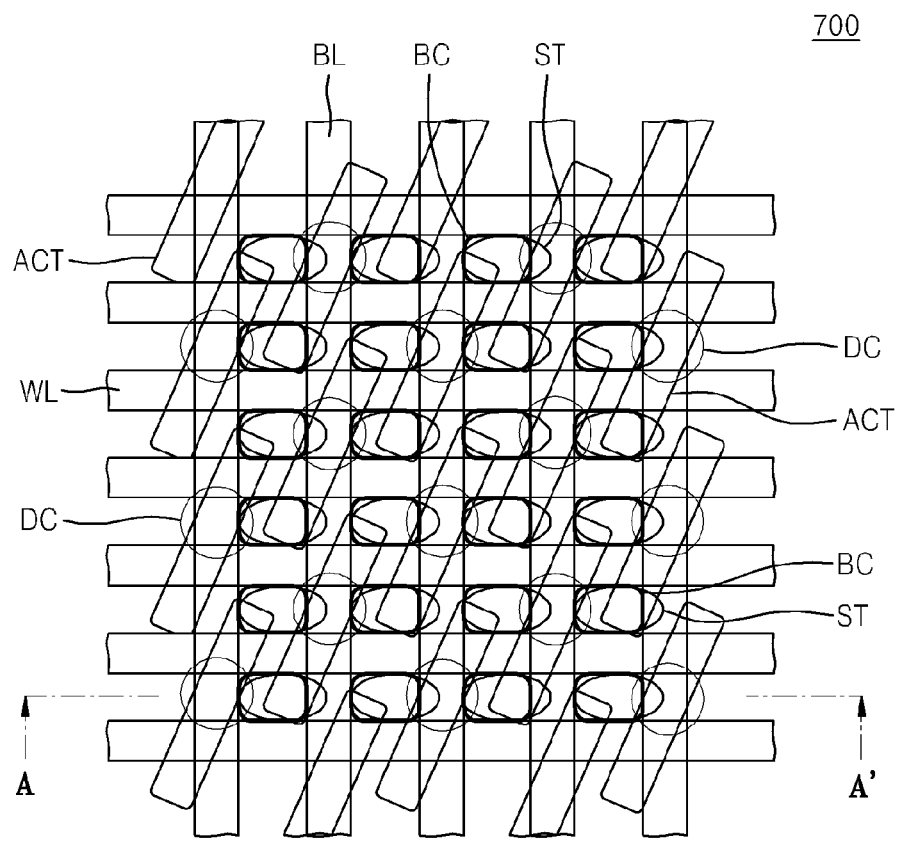
FIG. 25 is an exemplary plane layout of an integrated circuit device implemented using a method of forming patterns according to an embodiment of the inventive concept.

FIG. 25 is an exemplary plane layout of an integrated circuit device 700 that may be implemented using the method of forming patterns, according to any of the embodiments of the inventive concept disclosed herein. The layout illustrated in FIG. 25 may constitute a memory cell array region of a semiconductor memory device.

Referring to FIG. 25, the memory cell array region of the integrated circuit device 700 includes a plurality of active regions ACT. A plurality of word lines WL run across the plurality of active regions ACT and extend parallel to one another in a first direction (X direction). The plurality of word lines WL may be arranged at regular intervals. A plurality of bit lines BL are disposed on the plurality of word lines WL and extend parallel to one another in a second direction (Y direction) perpendicular to the first direction.

The plurality of bit lines BL are connected to the plurality of active regions AC via a plurality of direct contacts DC.

A plurality of buried contacts BC may be formed of a contact structure extending from an area between two adjacent bit lines BL of the plurality of bit lines BL to the top of any one of the two adjacent bit lines. In some embodiments, the plurality of buried contacts BC may be arranged in a line in the first direction (X direction) and the second direction (Y direction). In some embodiments, the plurality of buried contacts BC may be disposed at regular intervals in the second direction (Y direction). Each of the plurality of buried contacts BC may electrically connect a lower electrode ST of a capacitor to the active region ACT. The plurality of buried contacts BC may be regularly formed in a rectangular region with upper and lower borders (with respect to the FIG. 25) extending in the X direction and the left and right borders (with respect to FIG. 25) extending in the Y direction.

The method of forming patterns, according to the embodiments described above with reference to FIGS. 1 to 24C, may also be applied to form unit elements illustrated in FIG. 25, for example, the plurality of active regions ACT, the plurality of word lines WL, the plurality of bit lines BL, the plurality of direct contacts DC, the plurality of buried contacts BC, and the plurality of lower electrodes ST.

FIGS. 26A to 26I are cross-sectional views for explaining a method of manufacturing an integrated circuit device which may use any of the methods of forming patterns described above with reference to FIGS. 1 to 24C.

Regarding FIGS. 26A to 26I, like reference numerals as in FIGS. 4A to 25 denote the same elements, and accordingly, a detailed description thereof is not presented herein for ease of description.

Figure 26A:
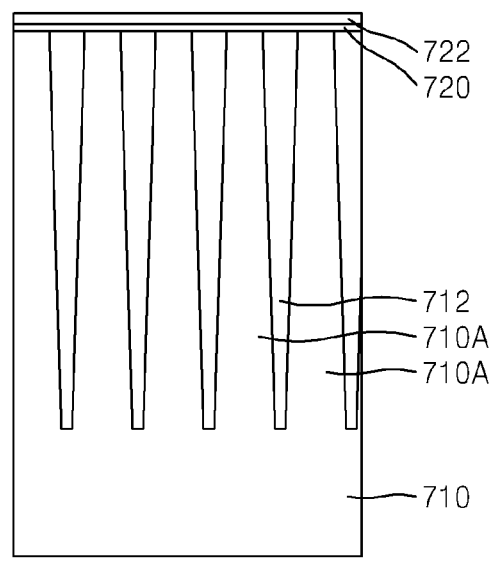
FIGS. 26A to 26L are cross-sectional views illustrating a method of manufacturing an integrated circuit device by using a method of forming patterns according to an embodiment of the inventive concept.

Referring to FIG. 26A, a plurality of active regions 710A are defined by forming a device isolation layer 712 in a substrate 710.

More details of the substrate 710 are substantially similar to those of the substrate 110 described above with reference to operation 30A of FIG. 3 and FIG. 4A.

Each of the plurality of active regions 710A may have a relatively long island shape having a minor axis and a major axis as in the active region ACT illustrated in FIG. 25. In order to define the plurality of active regions 710A, at least one of the methods of forming patterns, according to the embodiments described above with reference to FIGS. 1 to 24C, may be used.

The device isolation layer 712 may include an oxide layer, a nitride layer, or a combination thereof. However, the inventive concept is not limited thereto. The isolation layer 712 may include a single layer including one insulating layer or a multi-layered structure including a combination of at least three kinds of insulating layers.

A plurality of word line trenches (not illustrated) are formed in the substrate 710. The plurality of word line trenches may extend parallel to one another in the X direction of FIG. 25, and may have line shapes intersecting the plurality of active regions 710A. A plurality of gate dielectric layers, a plurality of word lines WL (see FIG. 25), and a plurality of buried insulating layers are sequentially formed within the plurality of word line trenches.

In some embodiments, after the word lines WL are formed, impurity ions may be implanted into the substrate 710 on both sides of the word lines WL so that source and drain regions (not shown) can be formed on top surfaces of the plurality of active regions 710A. In some other embodiments, before the plurality of word lines WL are formed, an ion implantation process for forming source and drain regions may be performed.

A first insulating layer 720 and a second insulating layer 722 are sequentially formed on the substrate 710. The first insulating layer 720 may include an oxide layer, and the second insulating layer 722 may include a nitride layer. However, the inventive concept is not limited thereto.

Figure 26B:
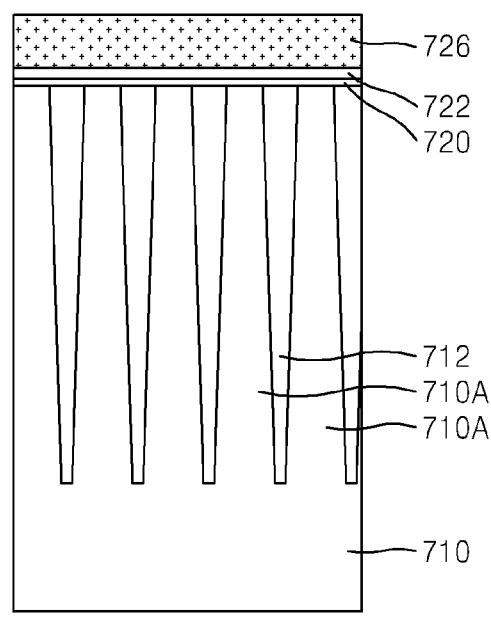

Referring to FIG. 26B, a first conductive layer 726 is formed on the substrate 710.

The first conductive layer 726 may be formed of doped polysilicon. However, the inventive concept is not limited thereto.

Figure 26C:
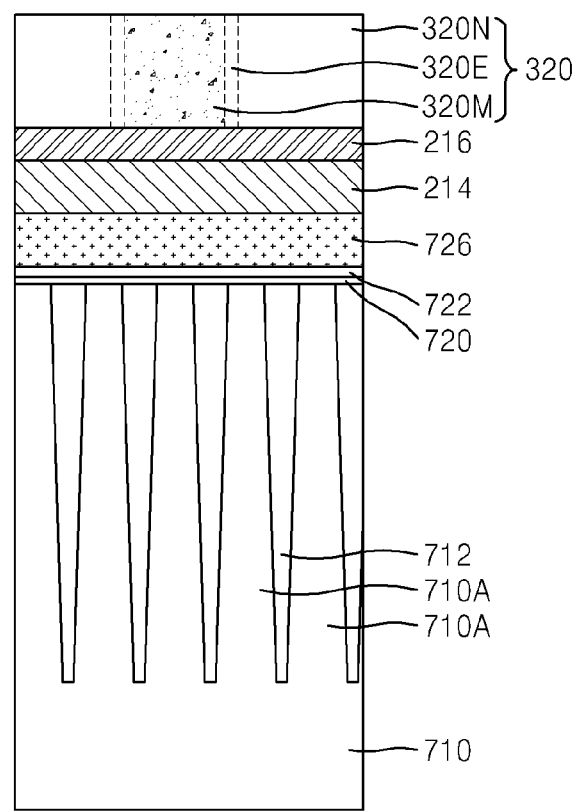

Referring to FIG. 26C, in a manner such as described above with reference to FIGS. 15A and 15B, a hard mask pattern 214, an anti-reflective coating film 216, and a photoresist film 320 are formed on the first conductive layer 726. A portion of the photoresist film 320 is exposed to form a main exposed region 320M, a non-exposed region 320N, and an exposed edge region 320E.

Figure 26D:
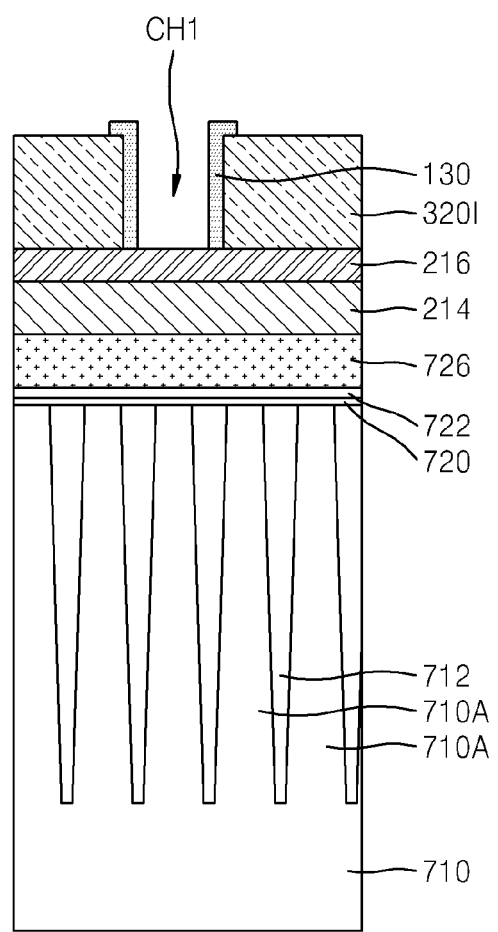

Referring to FIG. 26D, in a similar manner to the method described above with reference to FIGS. 16A and 16B, the main exposed region 320M is removed by developing the photoresist film 320 by using a first developer including a positive tone developer, thereby forming a capping layer 130 defining first openings CH1 in the same method as described above with reference to FIGS. 17A and 17B.

An insoluble region 320I is formed in the same method as described above with reference to FIGS. 18A and 18B. Regions of the non-exposed region 320N, except for the insoluble region 320I, are removed using a second developer including a negative tone developer in the same method as described above with reference to FIGS. 18A and 18B.

Figure 26E:
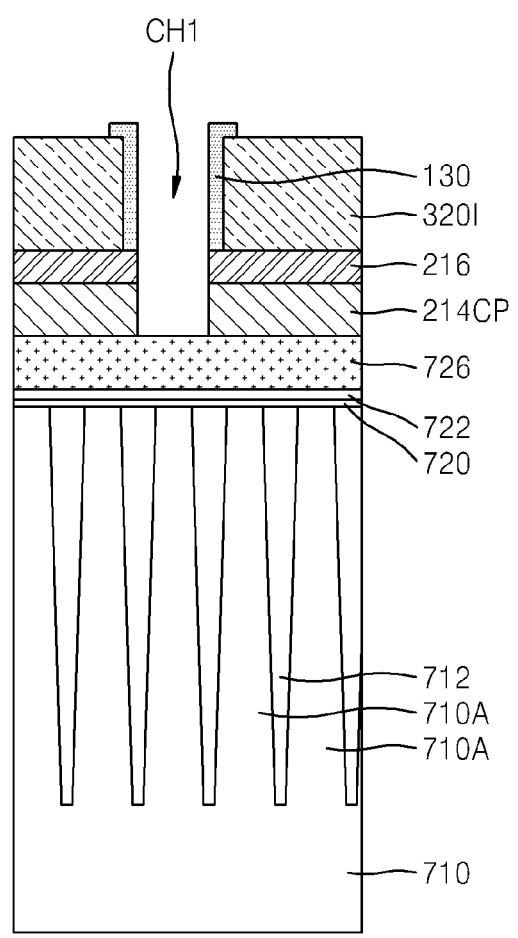

Referring to FIG. 26E, a hard mask pattern 214CP is formed by etching the anti-reflective coating film 216 and the hard mask layer 214 by using the capping layer 130 and the insoluble region 320I as an etch mask in the same method as described above with reference to FIGS. 20A and 20B.

Figure 26F:
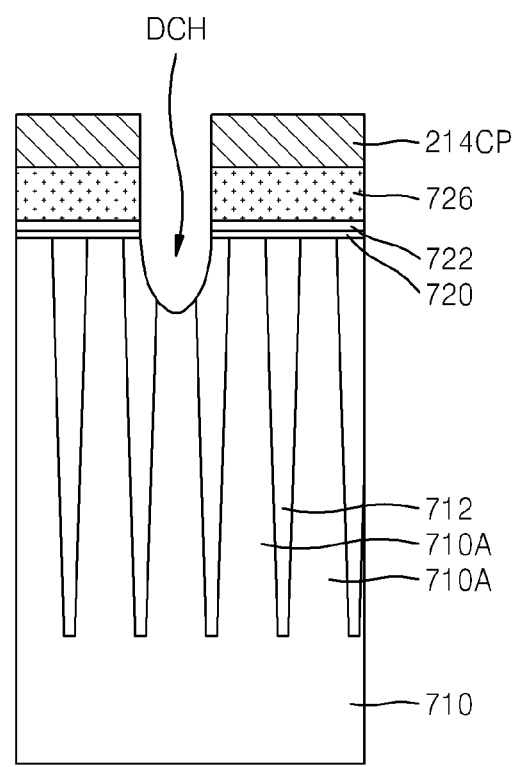

Referring to FIG. 26F, after unnecessary films on the hard mask pattern 214CP are removed, the first conductive layer 726 is etched using the hard mask pattern 214CP as an etch mask. A resultant exposed portion of the substrate 710 and a resultant exposed portion of the device isolation film 712 are etched to form a direct contact hole DCH exposing the active regions 710A of the substrate 710.

Figure 26G:
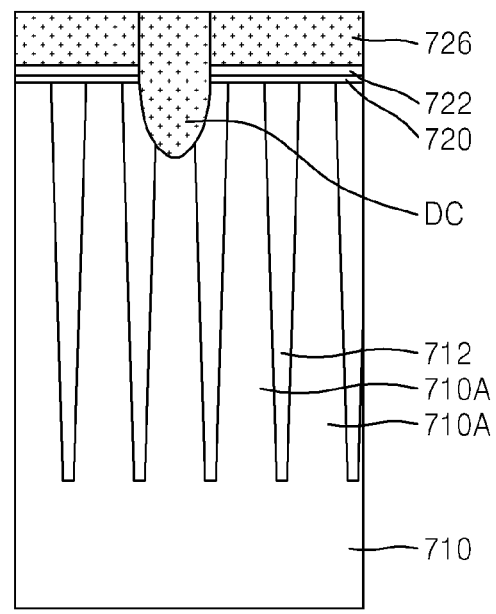

Referring to FIG. 26G, after the hard mask pattern 214CP (see FIG. 26F) is removed, a second conductive layer having a thickness that is enough to fill the direct contact hole DCH is formed in the direct contact hole DCH and on the first conductive layer 726. Next, a direct contact DC, including the second conductive layer remaining in the direct contact hole DCH, is formed by performing an etch-back process on the second conductive layer so that the second conductive layer remains only within the direct contact hole DCH.

The direct contact DC may comprise doped polysilicon. However, the inventive concept is not limited thereto.

Figure 26H:
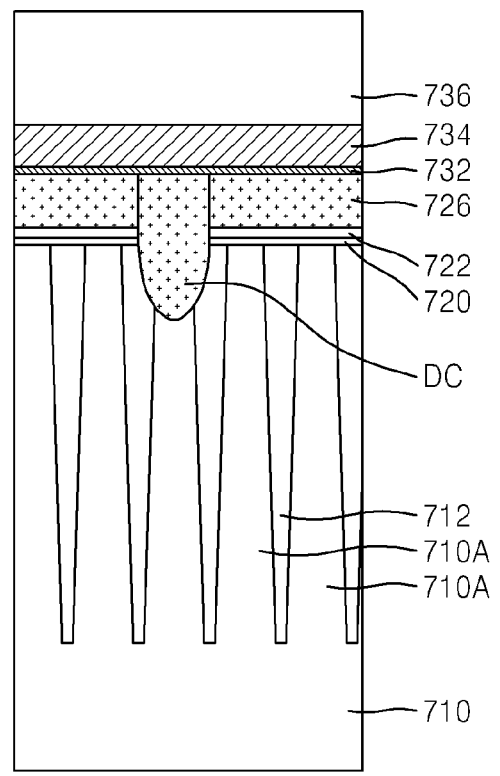

Referring to FIG. 26H, a third conductive layer 732, a fourth conductive layer 734, and an insulating capping layer 736 are sequentially formed on the first conductive layer 726 and the direct contact DC.

Each of the third conductive layer 732 and the fourth conductive layer 734 may include TiN, TiSiN, tungsten, tungsten silicide, or mixtures thereof. However, the inventive concept is not limited thereto. In some embodiments, the third conductive layer 732 may comprise TiSiN, and the fourth conductive layer 734 may comprise tungsten.

The insulating capping layer 736 may include a silicon insulating film.

Figure 26I:
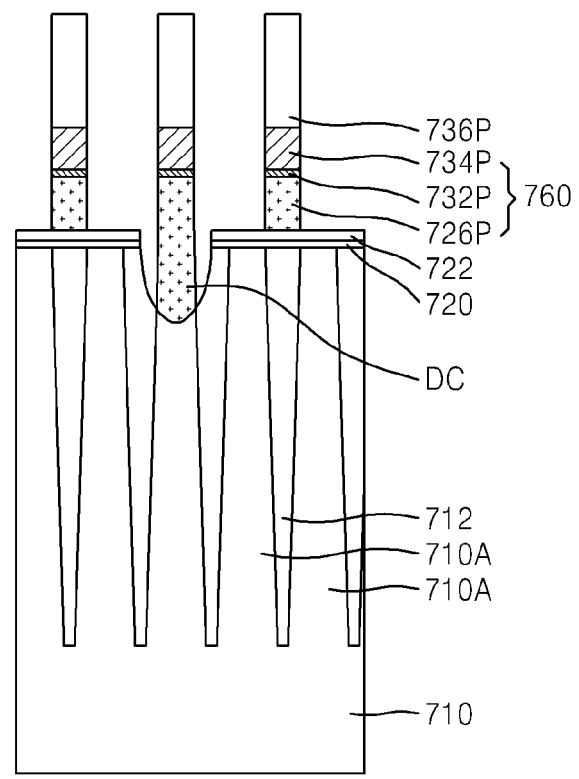

Referring to FIG. 26I, an insulating capping pattern 736P is formed by patterning the insulating capping layer 736 by using photolithography. A plurality of bit lines 760 are formed by etching a portion of a lower structure by using the insulating capping pattern 736P as an etch mask.

In some embodiments, the insulating capping pattern 736P may be formed using any one of the methods described herein, such as with reference to FIGS. 1 to 14B.

In order to form the plurality of bit lines 760, the fourth conductive layer 734, the third conductive layer 732, the first conductive layer 726, and the direct contact DC are partially etched in sequence by using the insulating capping pattern 736P as an etch mask. As a result, the plurality of bit lines 760 are formed, wherein the bit lines 760 include a first conductive pattern 726P, a third conductive pattern 732P, and a fourth conductive pattern 734P. Each of the plurality of bit lines 760 may be connected to the active regions 710A of the substrate 710 through a corresponding direct contact DC (only one such connection is shown in FIG. 26I but other direct contacts DC may be formed outside the plane of the cross section shown in FIG. 26I to connect the leftmost and rightmost bit lines in FIG. 26I to corresponding active regions 710A).

Figure 26J:
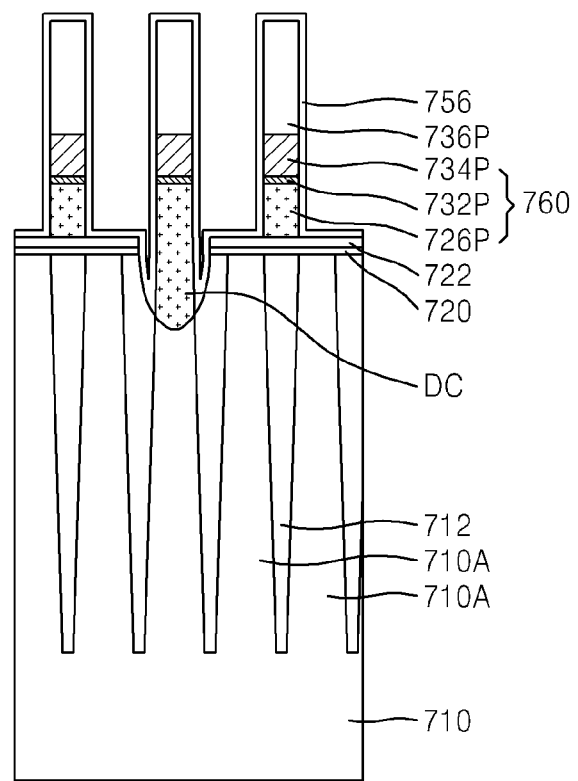

Referring to FIG. 26J, an insulating liner 756 is formed on an exposed top surface of the resultant structure where the plurality of bit lines 760 are formed.

The insulating liner 756 may include a nitride film. However, the inventive concept is not limited thereto.

Figure 26K:
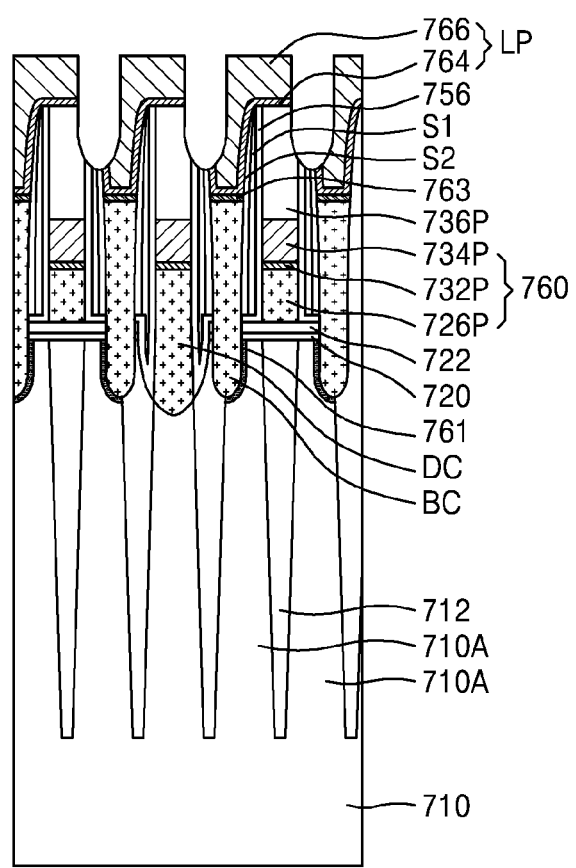

Referring to FIG. 26K, in the resultant structure of FIG. 26J, a plurality of buried contacts BC (see FIG. 25) and a plurality of conductive landing pads LP connected to the plurality of buried contacts BC are formed in spaces between the plurality of bit lines 760.

More specifically, insulating spacers S1 and S2 are formed to cover the insulating liner 756 at sidewalls of each of the plurality of bit lines 760. Then, an insulating pattern is formed (not illustrated in the cross-sectional view of FIG. 26K) having a plurality of holes for forming a plurality of buried contacts BC (see FIG. 25) in the spaces between the plurality of bit lines 260. Then, the active region 710A of the substrate 710 is exposed through the plurality of holes by performing an etch using the insulating pattern, and a metal silicide film 761 is formed on a surface of the exposed active region 710A. Then, the plurality of buried contacts BC connected to the active region 710A are formed by filling a lower portion of each of the plurality of holes with a conductive layer (e.g., by blanket deposition of the conductive layer followed by an etch back process, or by a gap fill deposition process of the conductive layer).

In some embodiments, the metal silicide film 761 may include cobalt silicide. However, the inventive concept is not limited thereto, and the metal silicide film 761 may include a material selected from various kinds of metal silicides. In some embodiments, the plurality of buried contacts BC may include doped polysilicon. In some embodiments, the metal silicide film 261 may be omitted.

In some embodiments, the insulating spacers S1 and S2 may include silicon oxide, silicon nitride, air, or mixtures thereof. In the present embodiment, each of the insulating spaces S1 and S2 has been described as including a double layer, but the inventive concept is not limited thereto. For example, each of the insulating spaces S1 and S2 may include a single layer or a triple layer. The plurality of insulating patterns may include a nitride layer, an oxide layer, or combinations thereof.

Next, a metal silicide film 763 is formed on the plurality of buried contacts BC in the plurality of holes between the plurality of bit lines 760. In some embodiments, the metal silicide film 763 may include cobalt silicide. However, the inventive concept is not limited thereto, and the metal silicide film 763 may include a material selected from various kinds of metal silicides. In some embodiments, the metal silicide film 763 may be omitted.

Next, a conductive barrier film and a conductive layer are formed and are etched back such as planarized by a CMP (chemical mechanical polishing) etch. As a result, the conductive barrier film and a portion of the conductive layer remain as a conductive barrier film 764 and a conductive layer 766, respectively, which cover each of the plurality of bit lines 760 while filling the inside of each of the plurality of holes to contact the metal silicide film 763.

In some embodiments, the conductive barrier film 764 may have a Ti/TiN stack structure. In some embodiments, the conductive layer 766 may include doped polysilicon, metal, metal silicide, conductive metal nitride, or mixtures thereof.

Next, after a mask pattern (not shown) exposing a portion of the conductive layer 766 is formed on the conductive layer 766, the conductive barrier film 764, the conductive layer 766, and insulating layers therearound under holes of the mask pattern are etched in the cell array region by using the mask pattern as an etch mask, thereby forming a plurality of landing pads LP, which include a remaining portion of the conductive barrier film 764 and a remaining portion of the conductive layer 766.

The plurality of landing pads LP may have a shape of a plurality of island-like patterns that are spaced apart from one another, similar to the plurality of buried contacts BC illustrated in FIG. 25.

The plurality of landing pads LP may be formed using lithography. In this case, the plurality of landing pads LP may be formed using any one of the methods of forming patterns described herein, for example as described above with reference to FIGS. 15A to 24C.

Figure 26L:
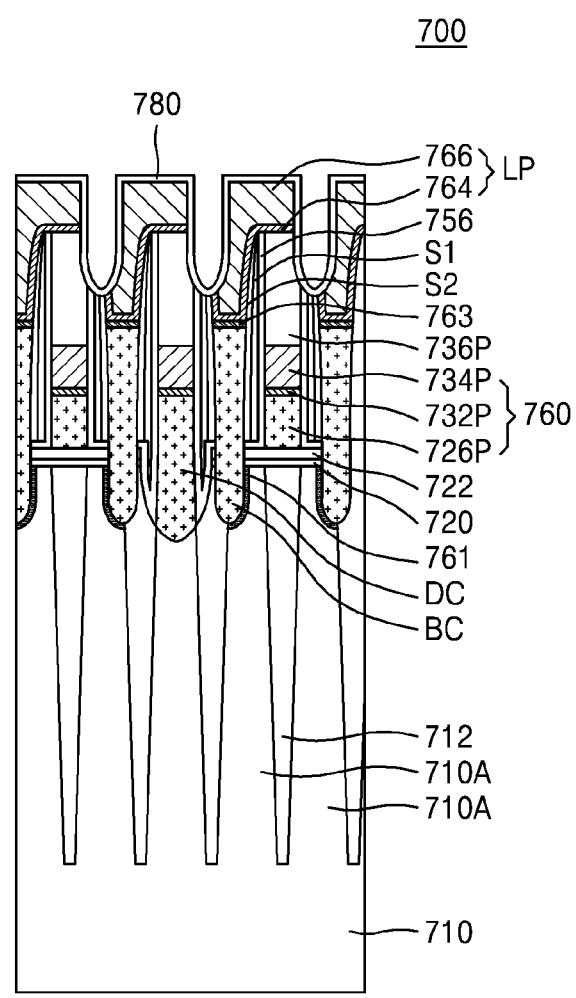

Referring to FIG. 26L, an insulating thin film 780 is formed on an upper surface of a resultant structure that includes the plurality of conductive landing pads LP. The insulating thin film 780 may include a nitride film. However, the inventive concept is not limited thereto.

An insulating layer may be formed on the insulating thin film 780 and both may be etched to expose the landing pad LP. The exposed portion of the landing pad LP may have a lower electrode of a capacitor connected to it by subsequent deposition and patterning of a conductive material. The capacitors (each corresponding to a landing pad LP and having a corresponding connected lower electrode) may be completed by forming a capacitor dielectric on each of the lower electrodes and forming a conductive upper electrode thereon (such as forming a conductive layer forming a common electrode).

Figure 27:
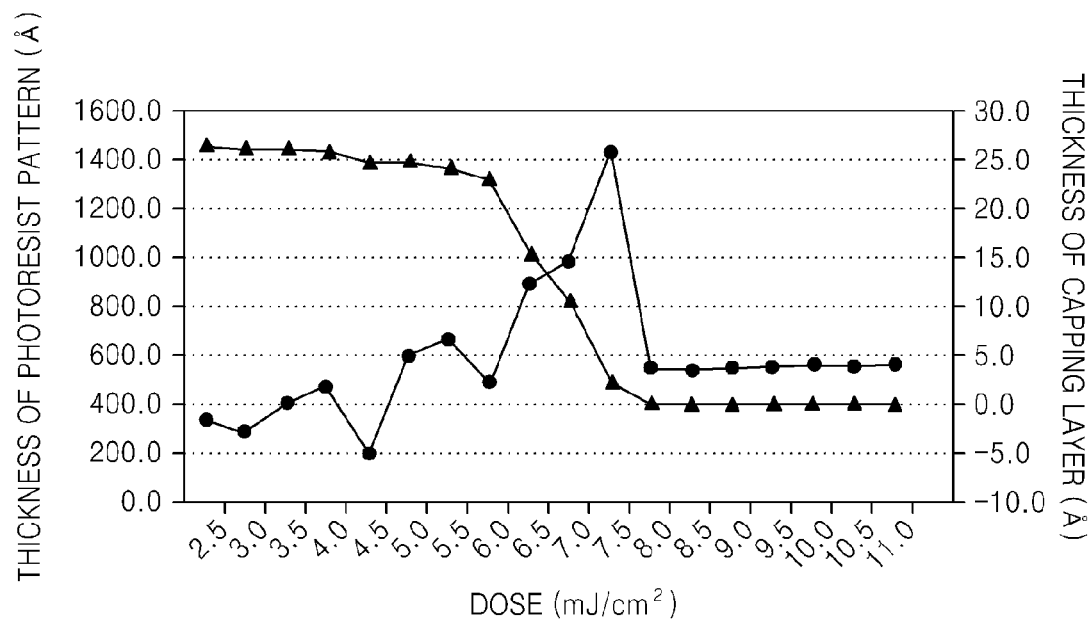
FIG. 27 is a graph illustrating the result of evaluation of selective formation locations of the capping layer formed according to the method of forming patterns according to the embodiment of the inventive concept.

FIG. 27 is a graph illustrating the result of evaluation of selective formation locations of a capping layer formed according to the method of forming patterns, according to the embodiment of the inventive concept.

For the evaluation of FIG. 27, a thickness of a photoresist pattern obtained according to a dose of exposure light during the operation of exposing the photoresist film and a thickness of the capping layer formed on the photoresist pattern were measured. In FIG. 27, triangles represent the relative thickness of the photoresist pattern, while the circles represent the thickness of the capping layer attached on the photoresist pattern. It can be seen that the capping layer formed according to an embodiment of the inventive concept is formed relatively thicker at the sidewalls (corresponding to a dose range from about 6.0 mJ/cm$^2$ to about 7.0 mJ/cm$^2$) than on a top surface of the photoresist (corresponding to a dose range less than 7.0 mJ/cm$^2$).

From the result of FIG. 27, the thickness of the capping layer formed on the photoresist pattern was less than about 3 Å, while the thickness of the capping layer at the sidewall of the photoresist pattern was more than about 25 Å. That is, it can be seen from the result of FIG. 27 that the capping layer formed by the method according to the embodiment of the inventive concept is formed relatively thicker at the sidewalls than on the top surface of the photoresist pattern.

Figure 28:
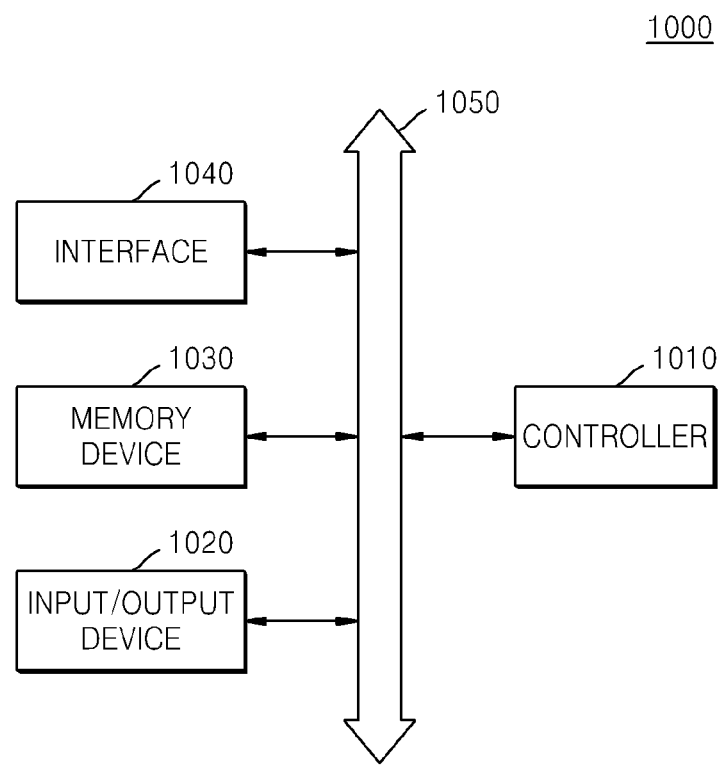
FIG. 28 is a block diagram of a system including an integrated circuit device according to an embodiment of the inventive concept.

FIG. 28 is a block diagram of a system 1000 including an integrated circuit device according to an embodiment of the inventive concept.

The system 1000 includes a controller 1010, an input/output device 1020, a memory device 1030, and an interface unit 1040. The system 1000 may be a mobile system or a system that transmits or receives information. In some embodiments, the mobile system is a personal digital assistant (PDA), a portable computer, a web tablet, a wireless phone, a mobile phone, a digital music player, or a memory card. The controller 1010 for controlling an execution program of the system 1000 may be a microprocessor, a digital signal processor, a microcontroller, or a similar device. The input/output device 1020 may be used to input or output data of the system 1000. The system 1000 may be connected to an external device, for example, a personal computer (PC) or a network, and may exchange data with the external device, by using the input/output device 1020. The input/output device 1020 may be, for example, a keypad, a keyboard, or a display device.

The memory device 1030 may store codes and/or data for operating the controller 1010, or store data processed by the controller 1010. The memory device 1030 includes at least one integrated circuit device manufactured by the method of forming patterns or the method of manufacturing integrated circuit devices according to the above embodiments of the inventive concept. For example, the memory device 1030 includes at least one integrated circuit device manufactured by any one of the methods of forming patterns described above with reference to FIGS. 1 to 24C or any one of the methods of manufacturing integrated circuit devices described above with reference to FIGS. 25 to 26L.

The interface unit 1040 may be a data transmission path between the system 1000 and an external device. The controller 1010, the input/output device 1020, the memory device 1030, and the interface unit 1040 may communicate with one another via a bus 1050. The system 1000 may be a mobile phone, an MP3 player, a navigation system, a portable multimedia player (PMP), a solid-state disk (SSD), or a household appliance.

Figure 29:
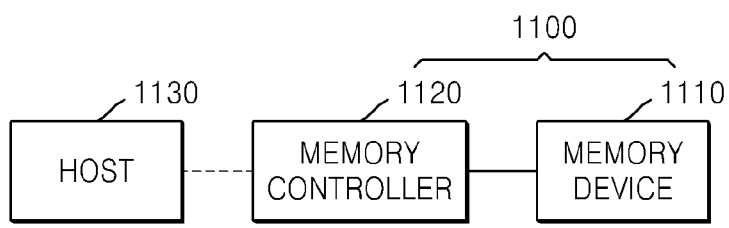
FIG. 29 illustrates a memory card including an integrated circuit device according to an embodiment of the inventive concept.

FIG. 29 is a block diagram of a memory card 1100 including an integrated circuit device, according to an embodiment of the inventive concept.

The memory card 1100 includes a memory device 1110 and a memory controller 1120.

The memory device 1110 may store data. In some embodiments, the memory device 1110 may have nonvolatile characteristics and thus may retain stored data even when power supply thereto is cut off. The memory device 1110 includes at least one integrated circuit device manufactured by the methods of forming patterns or the methods of manufacturing integrated circuit devices according to the above embodiments of the inventive concept. For example, the memory device 1030 includes at least one integrated circuit device manufactured by any one of the methods of forming patterns described above with reference to FIGS. 1 to 24C or any one of the methods of manufacturing integrated circuit devices described above with reference to FIGS. 25 to 26L.

The memory controller 1120 may read data from the memory device 1110 or write data to the memory device 1110 in response to a read/write request of a host 1130. The memory controller 1120 includes at least one integrated circuit device manufactured by the methods according to the embodiments of the inventive concept. For example, the memory controller 1120 includes at least one integrated circuit device manufactured by any one of the methods of forming patterns described above with reference to FIGS. 1 to 24C or any one of the methods of manufacturing integrated circuit devices described above with reference to FIGS. 25 to 26L.

While the inventive concept has been particularly shown and described with reference to exemplary embodiments thereof, it will be understood that various changes in form and details may be made therein without departing from the spirit and scope of the following claims.

What is claimed is:

1. A method of forming patterns, the method comprising:
   forming a photoresist pattern on a target layer, the photoresist pattern including a first opening exposing a first region of the target layer;
   forming a capping layer at sidewalls of the photoresist pattern defining the first opening, wherein the capping layer includes an acid source;
   forming an insoluble region around the first opening in the photoresist pattern by diffusing acid obtained from the acid source from the capping layer to the inside of the photoresist pattern;
   forming a second opening exposing a second region spaced apart from the first region in the target layer by removing a soluble region spaced apart from the first opening, with the insoluble region being interposed therebetween, in the photoresist pattern; and
   etching the target layer by using the insoluble region as an etch mask, wherein the capping layer includes a thermoacid generator (TAG) as the acid source, and
   wherein the forming of the insoluble region comprises:
   performing a thermal treatment on the capping layer to generate acid from the TAG included in the capping layer; and
   diffusing acid generated from the TAG from the capping layer to the inside of the photoresist pattern.

2. The method of claim 1, wherein
   the photoresist pattern includes a polymer having an acid-labile protecting group, and
   the forming of the insoluble region comprises de-protecting a polymer included in the photoresist pattern by diffusing the acid obtained from the acid source from the capping layer to the inside of the photoresist pattern.

3. The method of claim 1, wherein the forming of the insoluble region comprises performing a thermal treatment on the capping layer.

4. The method of claim 1, wherein the etching of the target layer uses the insoluble region and the capping layer as the etch mask.

5. The method of claim 1, further comprising, prior to the etching of the target layer, removing at least a portion of the capping layer.

6. The method of claim 1, further comprising, after the forming of the second opening and prior to the etching of the target layer, forming an additional capping layer covering a surface of the insoluble region,
   wherein the etching of the target layer uses the insoluble region, the capping layer, and the additional capping layer as the etch mask.

7. The method of claim 1, wherein the forming of the second opening comprises developing the photoresist pattern by using an organic solvent so as to remove the soluble region.

8. The method of claim 7, wherein in the forming of the second opening, at least a portion of the capping layer is removed using the organic solvent while the soluble region is removed.

9. The method of claim 1, wherein
   the forming of the capping layer comprises:
   coating a capping composition on the photoresist pattern, the capping composition including water, a water-soluble polymer, and the acid source; and
   inducing a chemical reaction between the capping composition and the photoresist pattern.

10. The method of claim 1, wherein each of the first opening and the second opening has a line shape.

11. The method of claim 1, wherein
    the first opening comprises a plurality of first holes that are spaced apart from one another, and
    the second opening comprises a plurality of second holes, each of which is disposed between two adjacent first holes among the plurality of first holes.

12. The method of claim 11, wherein
the plurality of first holes and the plurality of second holes are arranged in a matrix.

13. The method of claim 1, wherein
the first opening comprises a plurality of first holes that are spaced apart from one another, and
the forming of the insoluble region comprises diffusing the acid into a plurality of annular regions formed around each of the plurality of first holes and mutually connected in one body.

14. The method of claim 1, wherein
the first opening comprises a plurality of first holes that are spaced apart from one another, and
the forming of the insoluble region comprises diffusing the acid into a plurality of annular regions formed around each of the plurality of first holes and spaced apart from one another.

15. A method of forming patterns, the method comprising:
forming a photoresist film on a target layer by using a composition including a polymer that has a polarity that is changeable by an action of acid;
exposing the photoresist film to form a main exposed region, a non-exposed region spaced apart from the main exposed region, and an exposed edge region disposed between the main exposed region and the non-exposed region in the photoresist film;
removing the main exposed region by using a first developer to form a photoresist pattern having inner sidewalls defining a first opening exposing the exposed edge region;
forming an insoluble region insoluble to a second developer around the first opening in the photoresist pattern by diffusing acid from the exposed edge region to the non-exposed region;
forming a second opening spaced apart from the first opening by removing at least a portion of the non-exposed region, except for the insoluble region, from the photoresist pattern by using the second developer; and
etching the target layer by using the insoluble region as an etch mask.

16. The method of claim 15, wherein the exposing of the photoresist film comprises irradiating a Gaussian beam onto the photoresist film.

17. The method of claim 15, wherein
the forming of the insoluble region comprises:
forming a capping layer covering the inner sidewalls of the first opening, wherein the capping layer includes an acid source; and
diffusing acid obtained from the acid source from the capping layer to the inside of the photoresist pattern.

18. The method of claim 17, wherein
the photoresist film includes a photoacid generator (PAG),
acid is generated from the PAG in at least a portion of the exposed edge region during the exposing of the photoresist film, and
the forming of the insoluble region comprises diffusing the acid generated from the PAG inwardly from the exposed edge region of the photoresist pattern.

19. The method of claim 15, wherein
the forming of the insoluble region comprises:
forming a capping layer including a TAG on the exposed edge region in the photoresist pattern; and
diffusing acid generated from the TAG into the non-exposed region.

20. The method of claim 19, wherein
the forming of the insoluble region comprises performing a thermal treatment on the capping layer, and
at least one of a temperature and a time of the thermal treatment is controlled for determining a width of the insoluble region.

21. The method of claim 19, further comprising removing at least a portion of the capping layer while at least a portion of the non-exposed region, except for the insoluble region, is removed in the forming of the second opening.

22. The method of claim 15, wherein
the first developer includes an aqueous alkaline solution, and
the second developer includes an organic solvent.

23. The method of claim 15, wherein each of the first opening and the second opening has a line shape.

24. The method of claim 15, wherein
the first opening comprises a plurality of holes that are spaced apart from one another, and
the second opening comprises a plurality of second holes, each of which is disposed between two adjacent first holes among the plurality of first holes.

25. A method of manufacturing an integrated circuit device, the method comprising:
forming a target layer on a substrate with an active region;
forming a photoresist film on the target layer by using a composition including a polymer that has a polarity that is changeable by an action of acid;
exposing the photoresist film to form a main exposed region, a non-exposed region spaced apart from the main exposed region, and an exposed edge region disposed between the main exposed region and the non-exposed region in the photoresist film;
removing the main exposed region by using a first developer to form a photoresist pattern having inner sidewalls defining a first opening exposing the exposed edge region;
forming an insoluble region insoluble to a second developer around the first opening in the photoresist pattern by diffusing acid from the exposed edge region to the non-exposed region;
forming a second opening spaced apart from the first opening by removing at least a portion of the non-exposed region, except for the insoluble region, from the photoresist pattern by using the second developer; and
forming a fine pattern by etching the target layer by using the insoluble region as an etch mask.

26. The method of claim 25, wherein
the forming of the insoluble region comprises:
forming a capping layer covering the inner sidewalls of the first opening, wherein the capping layer includes an acid source; and
diffusing acid obtained from the acid source from the capping layer to the inside of the photoresist pattern.

27. The method of claim 26, wherein
the forming of the insoluble region comprises performing a thermal treatment on the capping layer, and
at least one of a temperature and a time of the thermal treatment is controlled for determining a width of the insoluble region.

28. The method of claim 25, wherein each of the first opening and the second opening has a line shape.

29. The method of claim 25, wherein
the first opening comprises a plurality of first holes that are spaced apart from one another, and the second opening comprises at least one second hole surrounded by at least three first holes among the plurality of first holes.

30. The method of claim 25, wherein
the first opening comprises a plurality of holes that are spaced apart from one another, and
the insoluble region comprises a plurality of annular regions formed around each of the plurality of first holes.

31. A method of manufacturing a semiconductor device, comprising:
providing a substrate with a target layer;
depositing a photoresist layer on the target layer;
exposing a first portion of the photoresist layer to electromagnetic radiation while shielding a second portion of the photoresist layer from the electromagnetic radiation;
removing the first portion of the photoresist layer with a first type of tone developer to form a photoresist pattern comprising the second portion of the photoresist layer and edges of the photoresist pattern;
selectively forming a capping pattern at the photoresist pattern edges;
removing the second portion of the photoresist layer with a second type of tone developer, different from the first type to create a patterned mask corresponding to the capping pattern at the photoresist pattern edges; and
etching the target layer using the patterned mask,
wherein selectively forming a capping pattern at the photoresist pattern edges comprises depositing a capping pattern layer on at least a part of the remaining portion of the photoresist to bond the capping pattern to the photoresist pattern edges.

32. The method of claim 31, wherein the photoresist pattern at the photoresist pattern edges is located between the first portion and the second portion, and
wherein, during the exposing of the first portion of the photoresist, the photoresist corresponding to the photoresist pattern edges is exposed to electromagnetic radiation to a lesser degree than the exposure of the first portion of the photoresist layer.

33. The method of claim 32, wherein the photoresist, prior to exposure, includes a photoacid generators (PAG) and protected polymers, wherein exposure of the first portion of the photoresist and the photoresist pattern at the photoresist pattern edges deprotects at least some of the protected polymers of the first portion of the photoresist and of the photoresist corresponding to the photoresist pattern edges.

34. The method of claim 33, wherein after the exposing step, the first portion of the photoresist has a higher density of deprotected polymers than the photoresist corresponding to the photoresist pattern edges.

35. The method of claim 34, wherein the deprotected polymers of the photoresist pattern at the photoresist pattern edges bond with at least a portion of the capping pattern.

36. The method of claim 35, wherein at least a portion of the capping pattern is substantially insoluble to the second type of tone developer.

37. The method of claim 35, wherein the capping pattern comprises a thermo-acid generator (TAG), and the method further comprises:
heating the capping pattern deposited at the photoresist pattern edges to generate a first acid from the TAG; and
diffusing the first acid into the photoresist pattern at the photoresist pattern edges and into a part of the second portion of the photoresist to deprotect at least some of the protected polymers of the photoresist pattern at the photoresist pattern edges and at the part of the second portion of the photoresist.

38. The method of claim 37, wherein deprotecting protected polymers comprises removing an acid-labile group from the protected polymers.

39. The method of claim 37, wherein deprotecting protected polymers results in a carboxyl group at one or more side chains of the polymers.

40. The method of claim 31, wherein the patterned mask comprises a part of the second portion of the photoresist layer bordering the photoresist pattern edges.

41. The method of claim 40, wherein the patterned mask comprises at least a portion of the capping pattern.

42. The method of claim 31, wherein the method further comprises removing the capping pattern prior to etching the target layer using the patterned mask so that the patterned mask does not include the capping pattern.

43. The method of claim 31, wherein selectively forming a capping pattern at the photoresist pattern edges comprises bonding parts of the capping pattern to parts of the photoresist pattern at the photoresist pattern edges.

44. The method of claim 43, wherein at least some compounds of the photoresist pattern at the photoresist pattern edges are hydrophilic after the exposing step and the bonding is a hydrogen bonding.

45. The method of claim 43, wherein the bonding the capping pattern to compounds of the photoresist pattern at the photoresist pattern edges comprises bonding the capping pattern to carboxyl groups of side chains of deprotected polymers of the photoresist pattern at the photoresist pattern edges.

46. The method of claim 31, further comprising cleaning the photoresist with a cleaning solution after depositing a capping pattern layer to remove a capping pattern layer on the second portion of the photoresist.

47. The method of claim 46, wherein the cleaning solution comprises a hydrophilic compound.

48. The method of claim 31, wherein a thickness of a capping pattern layer on the second portion of the photoresist is smaller than a thickness of the capping pattern layer on the photoresist pattern edges.

49. A method of manufacturing a semiconductor device, comprising:
providing a substrate with a target layer;
depositing a photoresist layer on the target layer;
exposing a first portion of the photoresist layer to electromagnetic radiation while shielding a second portion of the photoresist layer from the electromagnetic radiation;
removing the first portion of the photoresist layer with a first type of tone developer to form a photoresist pattern comprising the second portion of the photoresist layer and edges of the photoresist pattern;
selectively forming a capping pattern at the photoresist pattern edges;
removing the second portion of the photoresist layer with a second type of tone developer, different from the first type to create a patterned mask corresponding to the capping pattern at the photoresist pattern edges; and
etching the target layer using the patterned mask,
wherein selectively forming a capping pattern at the photoresist pattern edges comprises bonding parts of the capping pattern to parts of the photoresist pattern at the photoresist pattern edges,
wherein the bonding the capping pattern to compounds of the photoresist pattern at the photoresist pattern edges comprises bonding the capping pattern to carboxyl groups of side chains of deprotected polymers of the photoresist pattern at the photoresist pattern edges,
wherein the capping pattern comprises a polymer including an amine group on one or more side chains, and wherein bonding the capping pattern to compounds of the photoresist pattern at the photoresist pattern edges comprises bonding the amine group of the polymer of the capping pattern to carboxyl groups of side chains of deprotected polymers of the photoresist pattern at the photoresist pattern edges.

50. A method of manufacturing a semiconductor device comprising:
    providing a substrate with a target layer;
    forming a photoresist layer on the target layer;
    patterning the photoresist layer to remove portions of the photoresist layer and to create a photoresist pattern on the target layer, the photoresist pattern including openings between edges of the photoresist pattern;
    selectively forming a composition on the edges of the photoresist pattern;
    creating a mask pattern on the target layer using the composition on the edges of the photoresist pattern; and
    etching the target layer using the mask pattern,
    wherein selectively forming the composition on the edges of the photoresist pattern comprises forming bonds between a material of the edges of the photoresist pattern and a material of the composition,
    wherein the bonds comprise at least one of an ionic bond and a bond by dipole interaction.

51. The method of claim 50, wherein the bonds comprise bonds between carboxyl groups of and side chains of polymers of the photoresist and side chains of a polymer of the composition.

52. The method of claim 50, wherein the composition is substantially insoluble to a first type of tone developer, and the method further comprises, after selectively forming a composition on the edges of the photoresist pattern, developing portions the photoresist pattern with the first type of tone developer to remove parts of the photoresist pattern outside the composition and to obtain a mask corresponding in shape to the composition.

53. The method of claim 52, further comprising diffusing an acid from the composition into the photoresist pattern at the edges of the photoresist pattern so that a reaction of the acid with the photoresist pattern at the edges of the photoresist pattern makes the photoresist pattern at the edges of the photoresist pattern insoluble to the first type of tone developer.

54. The method of claim 53, wherein the reaction of the acid with the photoresist pattern at the edges of the photoresist pattern results in hydrophilic polymers at the edges of the photoresist pattern.

55. The method of claim 53,
    wherein the composition comprises a thermo-acid generator (TAG), and the method further comprises:
    heating a chamber in which the substrate is positioned at a first temperature to obtain the acid from the TAG.

56. The method of claim 55, further comprising heating the chamber at a second temperature, higher than the first temperature, to diffuse the acid into the photoresist pattern at the edges of the photoresist pattern.

57. The method of claim 53, wherein the mask pattern comprises the composition and the remaining photoresist pattern at the edges of the photoresist pattern.

58. A method of manufacturing a semiconductor device, comprising:
    providing a substrate with a target layer;
    forming a photoresist layer on the target layer, the photoresist layer having a first polarity;
    patterning the photoresist layer to remove portions of the photoresist layer to form a photoresist pattern on the target layer, photoresist pattern including openings between edges of the photoresist pattern;
    altering the polarity of at least some of the photoresist pattern at the edges of the photoresist pattern to a second polarity, different from the first polarity;
    developing the photoresist pattern to remove the photoresist pattern with the first polarity and so that the photoresist pattern at the edges of the photoresist pattern having the second polarity remain;
    etching the target layer using a mask corresponding to the photoresist pattern at the edges of the photoresist pattern having the second polarity,
    wherein the method further comprises:
    depositing a composition having a greater tendency to bond with the edges of the photoresist pattern than to a top surface of the photoresist pattern;
    exposing a first portion of the photoresist layer to electromagnetic radiation at a first intensity, exposing the photoresist layer at portions corresponding to the edges of the photoresist pattern at a second intensity lower than the first intensity, and shielding a second portion of the photoresist layer from the electromagnetic radiation; and
    removing the first portion of the photoresist with a first type of tone developer.

59. The method of claim 58, wherein the first polarity is hydrophobic and the second polarity is hydrophilic.

60. The method of claim 58, wherein altering the polarity of the photoresist layer comprises selectively diffusing an acid into the photoresist pattern at the edges of the photoresist pattern.

61. The method of claim 58, wherein altering the polarity of the photoresist layer comprises selectively deprotecting protected polymers of the photoresist pattern so that polymers are deprotected at the edges of the photoresist pattern while polymers are substantially not deprotected at other portions of the photoresist pattern.

62. The method of claim 58, wherein exposing the photoresist layer at the portions corresponding to the edges of the photoresist pattern alters a composition of the photoresist layer at the portions corresponding to the edges of the photoresist pattern to increase the tendency of the composition to bond to the edges of the photoresist pattern.

63. The method of claim 62, further comprising diffusing an acid from the composition into the photoresist layer at the edges of the photoresist pattern.

64. The method of claim 63,
    wherein the composition comprises a thermo-acid generator (TAG), and the method further comprises:
    heating a chamber in which the substrate is positioned at a first temperature to obtain the acid from the TAG.

65. The method of claim 62, wherein exposing the photoresist layer at the portions corresponding to the edges of the photoresist pattern deprotects a portion of polymers of the photoresist layer at the portions corresponding to the edges of the photoresist pattern.

* * * * *